US012813254B2

(12) United States Patent
Kurokawa et al.

(10) Patent No.: US 12,813,254 B2
(45) Date of Patent: Nov. 24, 2026

(54) SEMICONDUCTOR DEVICE

(71) Applicant: SEMICONDUCTOR ENERGY LABORATORY CO., LTD., Atsugi (JP)

(72) Inventors: Yoshiyuki Kurokawa, Sagamihara (JP); Hiromichi Godo, Isehara (JP); Kazuki Tsuda, Atsugi (JP); Kouhei Toyotaka, Isehara (JP); Satoru Ohshita, Hadano (JP); Hidefumi Rikimaru, Tama (JP); Hideki Uochi, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 393 days.

(21) Appl. No.: 18/560,959

(22) PCT Filed: May 13, 2022

(86) PCT No.: PCT/IB2022/054455
§ 371 (c)(1),
(2) Date: Nov. 15, 2023

(87) PCT Pub. No.: WO2022/248963
PCT Pub. Date: Dec. 1, 2022

(65) Prior Publication Data

US 2024/0234310 A1 Jul. 11, 2024

(30) Foreign Application Priority Data

May 27, 2021 (JP) ................................ 2021-089139
Jun. 4, 2021 (JP) ................................ 2021-094133

(51) Int. Cl.
*H10W 20/43* (2026.01)
*G06F 7/50* (2006.01)
(Continued)

(52) U.S. Cl.
CPC ............ *H10W 20/43* (2026.01); *H10D 62/80* (2025.01)

(58) Field of Classification Search
None
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2002-324673 A 11/2002
(Continued)

OTHER PUBLICATIONS

Yamane.T, "Application of machine learning devices and edge computing by physical reservoir computing", Provision, Jun. 18, 2019, No. 95, pp. 61-65, IBM Japan.
(Continued)

*Primary Examiner* — Anh Q Tran
(74) *Attorney, Agent, or Firm* — NIXON PEABODY LLP; Jeffrey L. Costellia

(57) ABSTRACT

A novel semiconductor device is provided. In reservoir computing using an input layer, a reservoir layer, and an output layer, variation in threshold voltage between transistors is used as a weight used for product arithmetic processing. Two transistors are provided in one product arithmetic circuit and data u is supplied to gates of the two transistors. Drain current of each of the transistors is determined by the data u and the threshold voltage of the transistor. The difference between the drain currents corresponds to a product arithmetic result. The difference between the drain currents is converted into voltage to be output. A plurality of
(Continued)

product arithmetic circuits are connected in parallel to form a product-sum arithmetic circuit.

16 Claims, 32 Drawing Sheets

(51) Int. Cl.

| | |
|---|---|
| ***G06F 7/523*** | (2006.01) |
| ***H03K 19/08*** | (2006.01) |
| ***H03K 19/082*** | (2006.01) |
| ***H10D 62/80*** | (2025.01) |

(56) References Cited

U.S. PATENT DOCUMENTS

| | | | | |
|---|---|---|---|---|
| 11,526,738 | B2 | 12/2022 | Marukame et al. | |
| 2002/0072139 | A1 | 6/2002 | Kashiwabara | |
| 2002/0113546 | A1 | 8/2002 | Seo et al. | |
| 2006/0120133 | A1* | 6/2006 | Star Sung | G11C 11/5692 365/94 |
| 2008/0008019 | A1* | 1/2008 | Balasuramanian | G11C 7/02 365/208 |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0029778 | A1* | 1/2015 | Yoon | G11C 7/24 365/104 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0019972 | A1 | 1/2017 | Kimura et al. | |
| 2017/0141167 | A1 | 5/2017 | Naganuma | |
| 2017/0256754 | A1 | 9/2017 | Defranco et al. | |
| 2018/0005668 | A1 | 1/2018 | Shionoiri et al. | |
| 2018/0190908 | A1 | 7/2018 | Ke et al. | |
| 2019/0378859 | A1 | 12/2019 | Kawashima et al. | |
| 2020/0057330 | A1 | 2/2020 | Yamazaki et al. | |
| 2020/0203662 | A1 | 6/2020 | Mollard et al. | |
| 2021/0081771 | A1 | 3/2021 | Marukame et al. | |
| 2021/0242220 | A1 | 8/2021 | Yamazaki et al. | |
| 2021/0311341 | A1 | 10/2021 | Kawashima et al. | |
| 2021/0383853 | A1 | 12/2021 | Shibata et al. | |
| 2023/0289581 | A1 | 9/2023 | Marukame et al. | |

FOREIGN PATENT DOCUMENTS

| | | | |
|---|---|---|---|
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2012-257090 | A | 12/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| JP | 2021-047530 | A | 3/2021 |
| WO | WO-2018/087625 | | 5/2018 |
| WO | WO-2020/174569 | | 9/2020 |

OTHER PUBLICATIONS

International Search Report (Application No. PCT/IB2022/054455) Dated Aug. 2, 2022.

Written Opinion (Application No. PCT/IB2022/054455) Dated Aug. 2, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.

Eki.R et al., "A ½.3inch 12.3Mpixel with On-Chip 4.97TOPS/W CNN Processor Back-Illuminated Stacked CMOS Image Sensor", ISSCC 2021 (Digest of Technical Papers. IEEE International Solid-State Circuits Conference), Feb. 13, 2021, pp. 154-155,155a.

* cited by examiner

FIG. 28A
Intermediate state
New crystalline phase
| Amorphous | Crystalline | Crystal |
|---|---|---|
| ▪completely amorphous | ▪CAAC<br>▪nc<br>▪CAC<br>excluding single crystal and poly crystal | ▪single crystal<br>▪poly crystal |
FIG. 28B
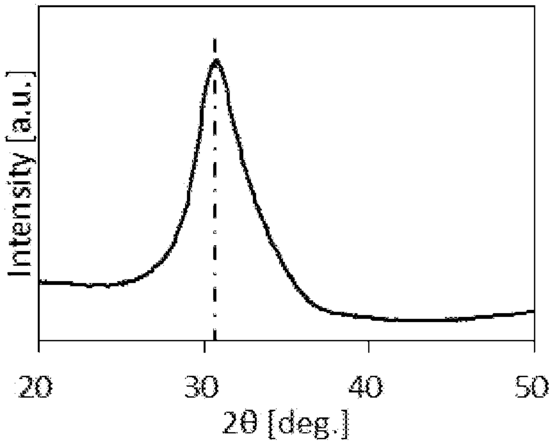
FIG. 28C
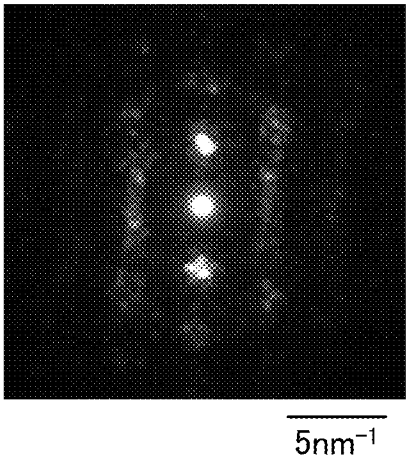

SEMICONDUCTOR DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display device, a light-emitting apparatus, a power storage device, an imaging device, a memory device, a processor, an electronic device, a driving method thereof, a manufacturing method thereof, an inspecting method thereof, and a system thereof.

BACKGROUND ART

An artificial neural network (hereinafter, referred to as a neural network) is an information processing system modeled on a biological neural network. The neural network is expected to achieve a computer with higher performance than a conventional Neumann computer; in recent years, a variety of researches on a neural network formed over an electronic circuit have been conducted.

In the neural network, units that resemble neurons are connected to each other through units that resemble synapses. By changing the connection strength, a variety of input patterns are learned, and pattern recognition, associative storage, and the like can be performed at high speed. Non-Patent Document 1 discloses a technique relating to a chip having a self-learning function with a neural network.

As the neural network, a convolutional neural network (CNN), a recurrent neural network (RNN), and the like are known. CNN is used, for example, to identify a pattern, an object, or the like from an image. RNN is used, for example, in the case of handling time-series data or continuous data.

In recent years, reservoir computing (RC) is proposed as a new method of a neural network that handles time-series data.

REFERENCE

Non-Patent Document

[Non-Patent Document 1] Yutaka Arima et al., "A Self-Learning Neural Network Chip with 125 Neurons and 10K Self-Organization Synapses", IEEE JOURNAL OF SOLID-STATE CIRCUITS, VOL. 26, NO. 4, APRIL 1991, pp. 607-611

SUMMARY OF THE INVENTION

Problems to be Solved by the Invention

An object of one embodiment of the present invention is to provide a semiconductor device with low power consumption. Another object is to provide a semiconductor device that is capable of high-speed operation. Another object is to provide a semiconductor device that occupies a small area. Another object is to provide a highly reliable semiconductor device. Another object is to provide a novel semiconductor device.

One embodiment of the present invention does not necessarily achieve all the above objects and only needs to achieve at least one of the objects. The description of the above objects does not preclude the existence of other objects. Objects other than these objects will be apparent from the description of the specification, the claims, the drawings, and the like, and objects other than these objects can be derived from the description of the specification, the claims, the drawings, and the like.

Means for Solving the Problems

One embodiment of the present invention is a semiconductor device that includes a first circuit, a second circuit, a third circuit, a first wiring, a second wiring, and a third wiring. The first circuit includes a first transistor and a second transistor; the first wiring is electrically connected to the second circuit, a gate of the first transistor, and a gate of the second transistor; the second wiring is electrically connected to the third circuit and one of a source and a drain of the first transistor; the third wiring is electrically connected to the third circuit and one of a source and a drain of the second transistor; the third circuit has a function of outputting voltage corresponding to the difference between current flowing through the second wiring and current flowing through the third wiring; threshold voltage of the first transistor and threshold voltage of the second transistor are different from each other.

Another embodiment of the present invention is a semiconductor device that includes a plurality of first circuits arranged in a matrix of M rows and N columns (M and N are each an integer greater than or equal to 2), M second circuits, N third circuits, M first wirings, N second wirings, and N third wirings. Each of the plurality of first circuits includes a first transistor and a second transistor; an i-th (i is an integer greater than or equal to 1 and less than or equal to M) first wiring is electrically connected to an i-th second circuit, a gate of the first transistor included in each of the first circuits in an i-th row, and a gate of the second transistor included in each of the first circuits in the i-th row; a j-th (j is an integer greater than or equal to 1 and less than or equal to N) second wiring is electrically connected to a j-th third circuit and one of a source and a drain of the first transistor included in each of the first circuits in a j-th column; a j-th third wiring is electrically connected to the j-th third circuit and one of a source and a drain of the second transistor included in each of the first circuits in the j-th column; the third circuit has a function of outputting voltage corresponding to the difference between current flowing through the second wiring and current flowing through the third wiring; the difference between threshold voltage of the first transistor and threshold voltage of the second transistor varies randomly among the plurality of first circuits.

The threshold voltage of the second transistor is preferably less than or equal to 0.9 times or greater than or equal to 1.1 times the threshold voltage of the first transistor.

The channel length of the second transistor is preferably less than or equal to 0.9 times or greater than or equal to 1.1 times the channel length of the first transistor.

A transistor including an oxide semiconductor may be used as the first transistor. A transistor including an oxide semiconductor may be used as the second transistor.

The oxide semiconductor preferably contains at least one of indium and zinc.

Another embodiment of the present invention is a semiconductor device that includes a plurality of first circuits arranged in a matrix of M rows and N columns (M and N are each an integer greater than or equal to 2), M second circuits, N third circuits, M first wirings, and N second wirings. Each of the plurality of first circuits includes a transistor; an i-th (i is an integer greater than or equal to 1 and less than or equal to M) first wiring is electrically connected to an i-th second circuit and a gate of the transistor included in each of the first circuits in an i-th row; a j-th (j is an integer greater than or equal to 1 and less than or equal to N) second wiring is electrically connected to a j-th third circuit and one of a source and a drain of the transistor included in each of the first circuits in a j-th column; the third circuit has a function of outputting voltage corresponding to the difference between current flowing through the second wiring and reference current; the channel length varies randomly among the plurality of transistors electrically connected to the j-th second wiring.

Another embodiment of the present invention is a semiconductor device that includes a plurality of first circuits arranged in a matrix of M rows and N columns (M and N are each an integer greater than or equal to 2), M second circuits, N third circuits, M first wirings, N second wirings. Each of the plurality of first circuits includes a transistor; an i-th (i is an integer greater than or equal to 1 and less than or equal to M) first wiring is electrically connected to an i-th second circuit and a gate of the transistor included in each of the first circuits in an i-th row; a j-th (j is an integer greater than or equal to 1 and less than or equal to N) second wiring is electrically connected to a j-th third circuit and one of a source and a drain of the transistor included in each of the first circuits in a j-th column; the third circuit has a function of outputting voltage corresponding to the difference between current flowing through the second wiring and reference current; the channel length varies randomly among the transistors included in the plurality of first circuits.

Effect of the Invention

With one embodiment of the present invention, a semiconductor device with low power consumption can be provided. Alternatively, a semiconductor device that is capable of high-speed operation can be provided. Alternatively, a semiconductor device that occupies a small area can be provided. Alternatively, a highly reliable semiconductor device can be provided. Alternatively, a novel semiconductor device can be provided.

Note that the description of these effects does not preclude the presence of other effects. One embodiment of the present invention does not necessarily have all of these effects. Effects other than these are apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 15B1 to FIG. 15B7 are diagrams illustrating structure examples of pixels.

FIG. 28A is a diagram showing classification of crystal structures. FIG. 28B is a graph showing an XRD spectrum of a CAAC-IGZO film. FIG. 28C is an image showing a nanobeam electron diffraction pattern of the CAAC-IGZO film.

MODE FOR CARRYING OUT THE INVENTION

Figure 1:
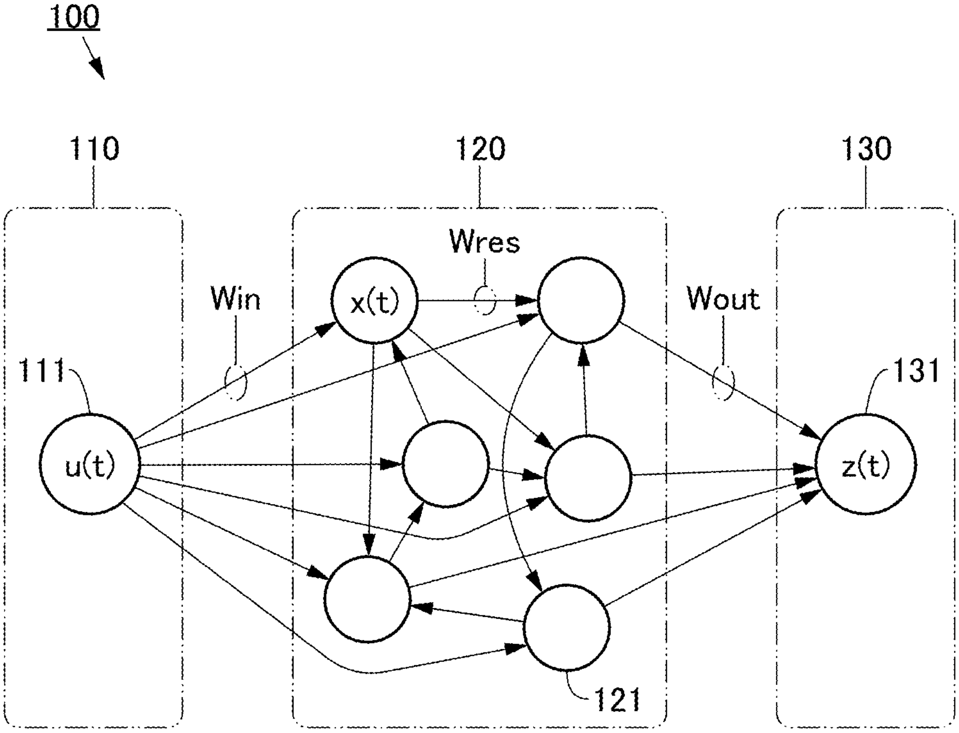
FIG. 1 is a drawing illustrating an RC model.

Hereinafter, embodiments will be described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For example, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to one another, and X, the source (or the first terminal or the like) of the transistor, the drain (or the second terminal or the like) of the transistor, and Y are electrically connected to one another in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms “gate” and “back gate” can be replaced with each other in one transistor in some cases. In the case where a transistor includes three or more gates, the gates may be referred to as a first gate, a second gate, and a third gate, for example, in this specification and the like.

In this specification and the like, a “node” can be referred to as a terminal, a wiring, an electrode, a conductive layer, a conductor, an impurity region, or the like depending on the circuit structure, the device structure, or the like. Furthermore, a terminal, a wiring, or the like can be referred to as a “node”.

Ordinal numbers such as “first”, “second”, and “third” in this specification and the like are used to avoid confusion among components. Thus, the ordinal numbers do not limit the number of components. In addition, the ordinal numbers do not limit the order of components. For example, a “first” component in one embodiment in this specification and the like can be referred to as a “second” component in other embodiments, the scope of claims, or the like. For another example, a “first” component in one embodiment in this specification and the like can be omitted in other embodiments, the scope of claims, or the like.

In this specification and the like, terms for describing arrangement, such as “over”, “under”, “above”, and “below” are sometimes used for convenience to describe the positional relationship between components with reference to drawings. The positional relationship between components is changed as appropriate in accordance with a direction in which each component is described. Thus, the positional relationship is not limited to the terms described in the specification and the like, and can be described with another term as appropriate depending on the situation. For example, the expression “an insulator positioned over (on) a top surface of a conductor” can be replaced with the expression “an insulator positioned under (on) a bottom surface of a conductor” when the direction of a drawing showing these components is rotated by 180°.

The term “over” or “under” does not necessarily mean that a component is placed directly over or directly under and directly in contact with another component. For example, the expression “electrode B over insulating layer A” does not necessarily mean that the electrode B is formed over and in direct contact with the insulating layer A, and does not exclude the case where another component is provided between the insulating layer A and the electrode B.

In this specification and the like, components arranged in a matrix and their positional relation are sometimes described using terms such as “row” and “column”. The positional relation between components is changed as appropriate in accordance with the direction in which the components are described. Thus, the positional relationship is not limited to the terms described in the specification and the like, and can be described with another term as appropriate depending on the situation. For example, the term “row direction” can be replaced with the term “column direction” when the direction of the diagram is rotated by 90°.

Furthermore, the term “overlap”, for example, in this specification and the like does not limit a state such as the stacking order of components. For example, the expression “electrode B overlapping with insulating layer A” does not necessarily mean the state where electrode B is formed over insulating layer A, and does not exclude the state where electrode B is formed under insulating layer A and the state where electrode B is formed on the right side (or the left side) of insulating layer A.

Each of the terms “adjacent” and “proximity” in this specification and the like does not necessarily mean that a component is directly in contact with another component. For example, the expression “electrode B adjacent to insulating layer A” does not necessarily mean that the electrode B is formed in direct contact with the insulating layer A and does not exclude the case where another component is provided between the insulating layer A and the electrode B.

In this specification and the like, the terms “film”, “layer”, and the like can be interchanged with each other depending on the situation. For example, the term “conductive layer” can be changed into the term “conductive film” in some cases. Also, for example, the term “insulating film” can be changed into the term “insulating layer” in some cases. Alternatively, the term “film”, “layer”, or the like is not used and can be interchanged with another term depending on the case or the situation. For example, the term “conductive layer” or “conductive film” can be changed into the term “conductor” in some cases. Furthermore, the term “conductor” can be changed into the term “conductive layer” or “conductive film” in some cases. Furthermore, for example, the term “insulating layer” or “insulating film” can be changed into the term “insulator” in some cases. Furthermore, the term “insulator” can be changed into the term “insulating layer” or “insulating film” in some cases.

In this specification and the like, the term such as “electrode”, “wiring”, or “terminal” does not limit the function of a component. For example, an “electrode” is used as part of a “wiring” in some cases, and vice versa. Furthermore, for example, the term “electrode” or “wiring” also includes the case where a plurality of “electrodes” or “wirings” are formed in an integrated manner. For example, a “terminal” is used as part of a “wiring” or an “electrode” in some cases, and vice versa. Furthermore, the term “terminal” also includes the case where a plurality of “electrodes”, “wirings”, “terminals”, or the like are formed in an integrated manner, for example. Therefore, for example, an “electrode” can be part of a “wiring” or a “terminal”, and a “terminal” can be part of a “wiring” or an “electrode”. Moreover, the term “electrode”, “wiring”, “terminal”, or the like is sometimes replaced with the term “region” depending on the case, for example.

In this specification and the like, the term such as “wiring”, “signal line”, or “power supply line” can be interchanged with each other depending on the case or the situation. For example, the term “wiring” can be changed into the term “signal line” in some cases. As another example, the term “wiring” can be changed into the term “power supply line” or the like in some cases. Conversely, the term such as “signal line” or “power supply line” can be changed into the term “wiring” in some cases. The term “power supply line” or the like can be changed into the term “signal line” or the like in some cases. Conversely, the term “signal line” or the like can be changed into the term “power supply line” or the like in some cases. Moreover, the term “potential” that is applied to a wiring can sometimes be changed into the term such as “signal” depending on the case or the situation. Conversely, the term “signal” or the like can be changed into the term “potential” in some cases.

Note that voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or voltage, and a potential and voltage are used as synonyms in many cases. Therefore, in this specification and the like, potential is interchangeable with voltage and voltage is interchangeable with potential unless explicitly stated.

As a power supply potential, a potential on the relatively high potential side or a potential on the relatively low potential side can be used, for example. A power supply potential on the high potential side is referred to as a high power supply potential (also referred to as "Vdd"), and a power supply potential on the low potential side is referred to as a low power supply potential (also referred to as "Vss"). A ground potential (also referred to as "GND") can be used as the high power supply potential or the low power supply potential. For example, in the case where the high power supply potential is a ground potential, the low power supply potential is a potential lower than the ground potential, and in the case where the low power supply potential is a ground potential, the high power supply potential is voltage higher than the ground potential.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°.

Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

The term "orthogonal" indicates that two straight lines intersect or are connected to each other at an angle greater than or equal to 80° and less than or equal to 100°. Thus, the case where the angle is greater than or equal to 85° and less than or equal to 95° is also included. The terms "approximately orthogonal" and "substantially orthogonal" indicate that two straight lines intersect or are connected to each other at an angle greater than or equal to 60° and less than or equal to 120°.

Note that in this specification and the like, the terms "identical", "the same", "equal", "uniform", or the like (including synonyms thereof) used in describing calculation values and measurement values contain an error of +20% unless otherwise specified.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases. Moreover, some components are omitted in a perspective view, a top view, and the like for easy understanding of the drawings in some cases.

In the drawings and the like related to this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification sign such as "A", "b", "_1", "[i]", or "[m,n]" are sometimes added to the reference numerals.

Unless otherwise specified, transistors described in this specification and the like are enhancement (normally off) n-channel field-effect transistors. Thus, the threshold voltage (also referred to as "Vth") is higher than 0 V.

Embodiment 1

A semiconductor device of one embodiment of the present invention will be described.

First, reservoir computing will be described. As an algorithm used in reservoir computing (also referred to as an "RC model"), LSM (Liquid State Machine), ESN (Echo State Network), FORCE (First Order Reduced and Controlled Error), and the like are known.

FIG. 1 illustrates a structure example of ESN as an RC model 100. The RC model 100 includes an input layer 110, a reservoir layer 120, and an output layer 130. The reservoir layer 120 corresponds to a hidden layer.

The input layer 110 includes a node 111. Data u(t) denotes a value of the node 111 at time t. Although one node 111 is illustrated in FIG. 1, the input layer 110 may include a plurality of nodes 111. For example, the input layer 110 may include M (M is an integer greater than or equal to 1) nodes 111.

The reservoir layer 120 includes a plurality of nodes 121. Data x(t) denotes a value of the node 121 at time t. Although six nodes 121 are illustrated in FIG. 1, the node 121 is not limited thereto. For example, the reservoir layer 120 may include N (N is an integer greater than or equal to 2) nodes 121.

The output layer 130 includes a node 131. Data z(t) denotes a value of the node 131 at time t. Although one node 131 is illustrated in FIG. 1, the output layer 130 may include a plurality of nodes 131. For example, the output layer 130 may include K (K is an integer greater than or equal to 1) nodes 131.

In FIG. 1, weight $W_{in}$ of the connection between the node 111 and the node 121 is denoted as "$W_{in}$". Weight $W_{out}$ of the connection between the node 121 and the node 131 is denoted as "$W_{out}$". N nodes 121 included in the reservoir layer 120 are randomly connected to each other. In FIG. 1, weight $W_{res}$ of the connection between the nodes 121 is denoted as "$W_{res}$".

The node 111 is connected to a plurality of nodes 121. In this case, in the RC model 100 illustrated in FIG. 1, each of the weights $W_{in}$ is determined and fixed to a random positive or negative value. A value obtained by integrating the data u(t) with the weight $W_{in}$ is supplied to the node 121.

In the reservoir layer 120, the weight $W_{res}$ of the connection between the nodes 121 is determined and fixed to a random positive or negative value. Thus, data supplied from the reservoir layer 120 to the output layer 130 is non-linear data. In the connection between the nodes 121, a value obtained by integrating the data x(t) of the node 121 on the side from which data is supplied with the weight $W_{res}$ is supplied to the node 121 on the side to which data is supplied.

In RNN, the weight $W_{in}$, the weight $W_{res}$, and the weight $W_{out}$ are determined using backpropagation, which requires a large amount of training data and a lot of training time. Thus, RNN requires a high calculation cost. In RC, by contrast, the weight $W_{in}$ and the weight $W_{res}$ are fixed and only training (optimization) of the weight $W_{out}$ is performed. Thus, optimization of the weight $W_{out}$ can be completed with a small amount of training data and a short training time.

Accordingly, RC requires lower power consumption in training than RNN. RC requires less calculation cost than RNN.

The RC model 100 illustrated in FIG. 1 can be expressed by Formula 1 to Formula 3. Formula 1 is a formula that relates to the data x(t). Formula 2 is a formula to obtain the weight $W_{out}$. Formula 3 is a formula to obtain the data z(t).

[Formula 1]

$$x(t)=(1-\delta)x(t-1)+\delta f[W_{in}u(t)+W_{res}x(t-1)] \tag{1}$$

[Formula 2]

$$W_{out}=\left(X^TX+\lambda I\right)^{-1}X^TY_{target} \tag{2}$$

[Formula 3]

$$z(t)=W_{out}x(t) \tag{3}$$

X represents a matrix of x(f); f represents an activation function; δ represents a leakage rate; T represents a transposed matrix; A represents normalization parameter; I represents an identity matrix; $Y_{target}$ represents training data.

For example, in the case where chronological change of images captured by an image sensor, such as detected eye blink, is analyzed, RNN is difficult to be implemented in hardware because of a high calculation cost and a complex layer structure. At least part of an algorithm of RC is incorporated in an image sensor, a processor, or the like, whereby arithmetic processing can be performed with low power consumption.

Next, an example of a circuit structure to obtain $W_{in}$×u(f) in Formula 1 above is described.

[Current Mirror Circuit]

Figure 2A:
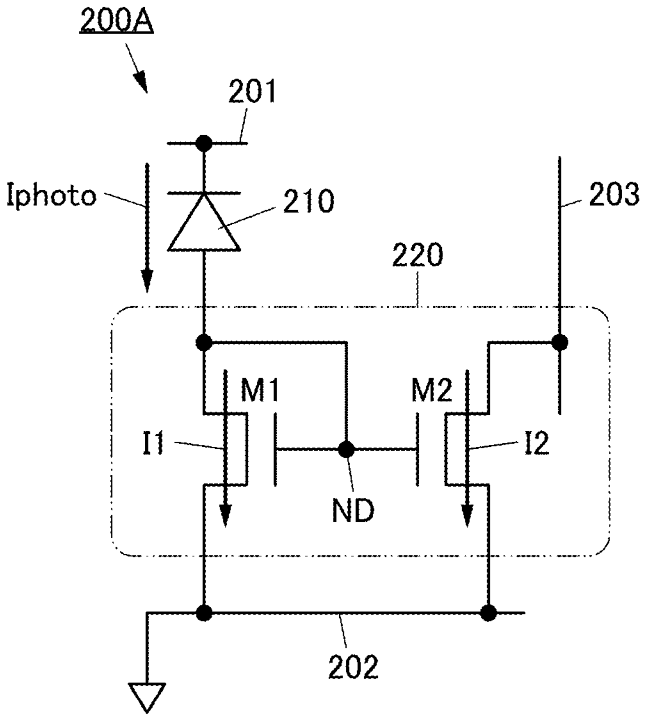
FIG. 2A and FIG. 2B are diagrams each illustrating a current mirror circuit.
Figure 2B:
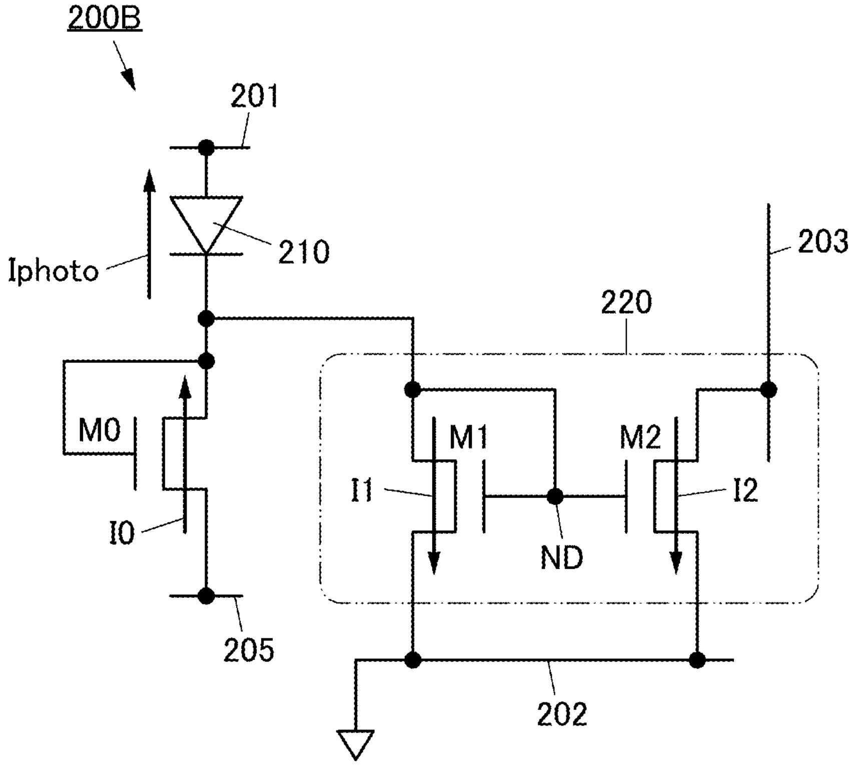

First, a current mirror circuit is described. A semiconductor device 200A illustrated in FIG. 2A and a semiconductor device 200B illustrated in FIG. 2B each include a photodiode 210 and a current mirror circuit 220.

The current mirror circuit 220 includes a transistor M1 and a transistor M2. A drain of the transistor M1 is electrically connected to a gate of the transistor M1 and a gate of the transistor M2. A region where the drain of the transistor M1, the gate of the transistor M1, and the gate of the transistor M2 are electrically connected is referred to as a node ND.

A source of the transistor M1 and a source of the transistor M2 are electrically connected to a wiring 202. A drain of the transistor M2 is electrically connected to a wiring 203.

In the semiconductor device 200A, an anode of the photodiode 210 is electrically connected to the drain of the transistor M1. A cathode of the photodiode 210 is electrically connected to a wiring 201.

A reverse bias is applied to the photodiode 210. Accordingly, in the semiconductor device 200A, the wiring 201 is supplied with a higher potential than the wiring 202. In addition, the wiring 203 is supplied with a higher potential than the wiring 202. For example, the wiring 201 and the wiring 203 are supplied with Vdd, and the wiring 202 is supplied with Vss or GND.

The value of the resistance (internal resistance) between the anode and the cathode of the photodiode 210 changes in accordance with illuminance of emitted light. The internal resistance of the photodiode 210 decreases with increasing illuminance. In the semiconductor device 200A, current I1 flowing between the source and drain of the transistor M1 is equal to current Iphoto flowing between the anode and cathode of the photodiode 210. Thus, the current I1 flowing between the source and drain of the transistor M1 is determined depending on the illuminance. Note that in drawings and the like, the direction of current is indicated by an arrow in some cases.

Since the gate of the transistor M1 and the gate of the transistor M2 are electrically connected to each other, the gate voltage of the transistor M1 and the gate voltage of the transistor M2 are equal to each other. Thus, in the case where the transistor M1 and the transistor M2 have the same transistor characteristics and operate in a saturation region or a subthreshold region, current I2 flowing between the source and drain of the transistor M2 is equal to the current I1. For example, in the case where the channel length of the transistor M1 is the same as that of the transistor M2 and the channel width of the transistor M2 is twice that of the transistor M1, the current I2 is twice the current I1.

The connection of the photodiode 210 in the semiconductor device 200B is opposite to that in the semiconductor device 200A. Specifically, an anode of the photodiode 210 is electrically connected to the wiring 201, and the cathode of the photodiode 210 is electrically connected to the drain of the transistor M1. In addition, the semiconductor device 200B includes a transistor M0. A source of the transistor M0 is electrically connected to a drain of the transistor M1. A gate of the transistor M0 is electrically connected to a source of the transistor M0. A drain of the transistor M0 is electrically connected to a wiring 205.

In the semiconductor device 200B, the current I1 flowing between the source and drain of the transistor M1 is equal to a value obtained by subtracting the current Iphoto from current 10 flowing between the source and drain of the transistor M0.

In the semiconductor device 200B, the wiring 205 is supplied with a higher potential than the wiring 201 and the wiring 202. In addition, the wiring 201 is supplied with a lower potential than the wiring 202. For example, the wiring 202 is supplied with 0 V (GND), the wiring 205 is supplied with 5 V, and the wiring 201 is supplied with −2 V. The current mirror circuit 220 in the semiconductor device 200B functions like the current mirror circuit 220 in the semiconductor device 200A.

The transistor M1 and the transistor M2 need to have the same transistor characteristics to make the current I1 and the current I2 equal to each other in the current mirror circuit 220. However, even when the transistor M1 and the transistor M2 are designed such that they have the same transistor characteristics, the transistors do not necessarily have the same characteristics due to variation in transistor characteristics. For example, when the threshold voltage of the transistor M1 is Vth1 and the threshold voltage of the transistor M2 is Vth2, Vth2=Vth1 is not satisfied but Vth2=Vth1+$\alpha$ is satisfied in many cases.

Here, a includes a natural fluctuation (error) and thus changes randomly. For example, when a plurality of sets of the transistor M1 and the transistor M2 that have the same transistor characteristics are prepared and a in all the sets are checked, a in all the sets are not necessarily the same. $\alpha$ corresponds to variation in Vth between the transistors. Moreover, $\alpha$ increases when the transistor characteristics are different between the transistor M1 and the transistor M2. As described above, a plurality of weights $W_{in}$ between the input layer 110 and the reservoir layer 120 in the RC model 100 are preferably random and fixed. According to one embodiment of the present invention, an arithmetic circuit with $W_{in}\times u(t)$ can be obtained with use of variation in Vth between transistors as the weight $W_{in}$.

[Product Arithmetic Circuit]

Figure 3:
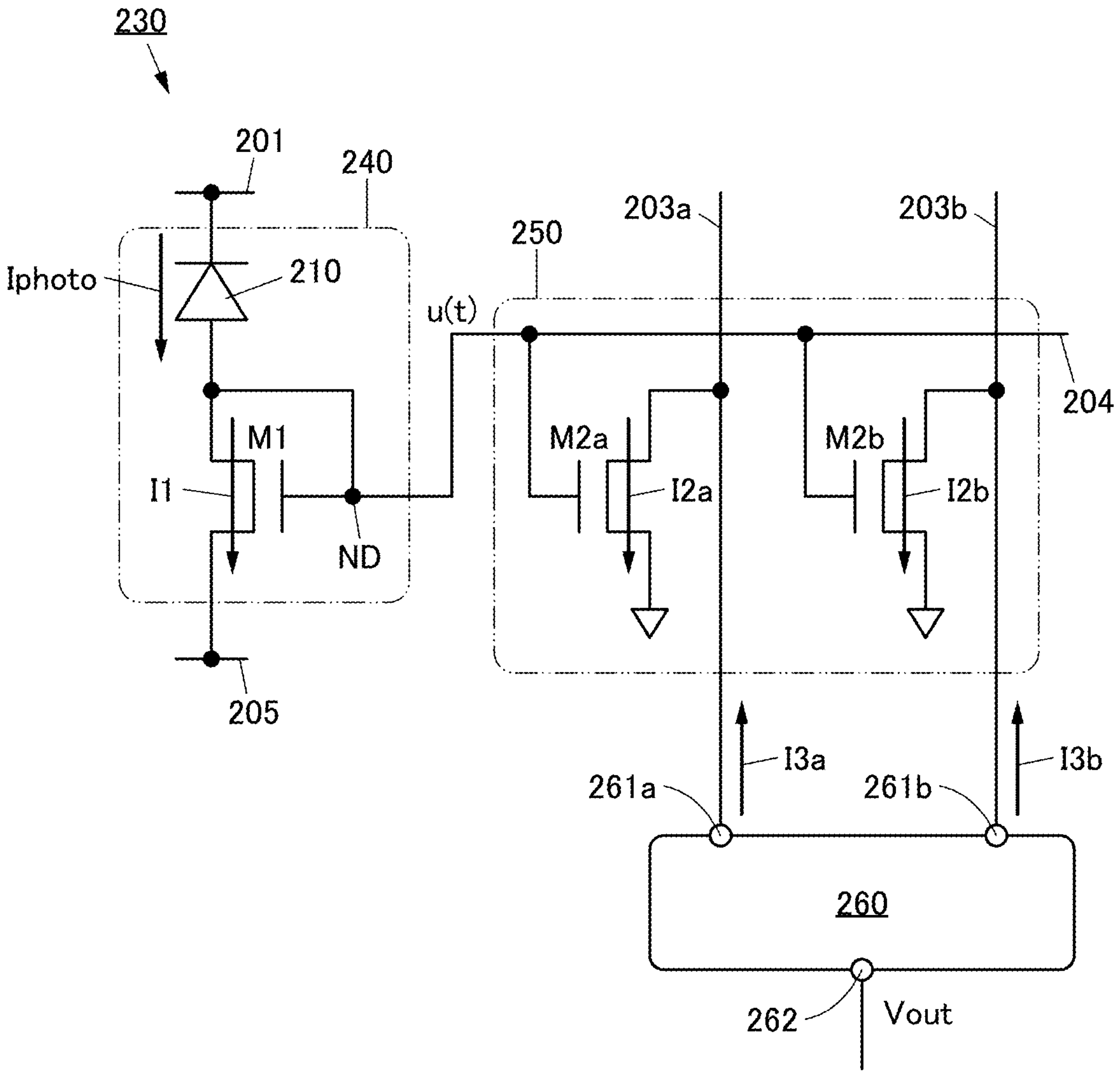
FIG. 3 is a diagram illustrating a product arithmetic circuit.

FIG. 3 illustrates a structure example of a semiconductor device 230 in which illuminance detected by a sensor portion 240 including the photodiode 210 is used as the data u(t) and variation in Vth between transistors is used as the weight $W_{in}$. Note that the semiconductor device 230 can be regarded as an application example of the semiconductor device 200A. The semiconductor device 230 functions as a product arithmetic circuit. The semiconductor device 230 has a function of performing product arithmetic of the data u(t) and the weight $W_{in}$.

The semiconductor device 230 includes a product arithmetic portion 250 (also referred to as a "product arithmetic circuit" or a "first circuit"), the sensor portion 240 (also referred to as a "sensor circuit" or a "second circuit"), and a comparison portion 260 (also referred to as a "comparison circuit" or a "third circuit"). The sensor portion 240 includes the photodiode 210 and the transistor M1. One of a source and a drain (e.g., the drain) of the transistor M1 is electrically connected to a gate of the transistor M1 and an anode of the photodiode 210. The other of the source and the drain (e.g., the source) of the transistor M1 is electrically connected to the wiring 205. For example, the wiring 201 is supplied with Vdd, and the wiring 205 is supplied with GND.

Although the structure in which illuminance of light is detected by the photodiode included in the sensor portion 240 is described as an example in this embodiment and the like, information detected by the sensor portion 240 is not limited thereto. The sensor portion 240 may have a function of detecting one or more of force, displacement, position, speed, acceleration, angular velocity, rotational frequency, distance, light, magnetism, temperature, sound, time, electric field, current, voltage, electric power, radiation, humidity, gradient, oscillation, odor, and infrared rays. For example, the sensor portion 240 may detect temperature, humidity, odor, or the like.

The product arithmetic portion 250 includes a transistor M2*a* and a transistor M2*b*. Gates of the transistor M2*a* and the transistor M2*b* are each electrically connected to the gate of the transistor M1 through the wiring 204. In the semiconductor device 230, a region where the gate of each of the transistor M1, the transistor M2*a*, and the transistor M2*b* is electrically connected to one of the source and the drain of the transistor M1 is referred to as a node ND. An anode or a cathode of the photodiode 210 is electrically connected to the node ND. In FIG. 3, the anode of the photodiode 210 is electrically connected to the node ND.

One of a source and a drain (e.g., the drain) of the transistor M2*a* is electrically connected to a wiring 203*a*. The other of the source and the drain (e.g., the source) of the transistor M2*a* is supplied with, for example, GND. One of a source and a drain of the transistor M2*b* is electrically connected to a wiring 203*b*. The other of the source and the drain of the transistor M2*b* is supplied with, for example, GND.

The potential supplied to the source of the transistor M2*a* and the potential supplied to the source of the transistor M2*b* are preferably the same. Moreover, the potential supplied to the source of the transistor M2*a* and the potential supplied to the source of the transistor M2*b* are not necessarily the same or fixed.

In the semiconductor device 230, the transistor M1, the transistor M2*a*, and the transistor M2*b* form a current mirror circuit. The wiring 201 is supplied with a higher potential than the wiring 205. The wiring 201 is supplied with, for example, Vdd. The potentials supplied to the wiring 201 and the wiring 205 are not necessarily fixed.

The comparison portion 260 includes a terminal 261*a*, a terminal 261*b*, and a terminal 262. The comparison portion 260 is electrically connected to the wiring 203*a* through the terminal 261*a* and is electrically connected to the wiring 203*b* through the terminal 261*b*. The comparison portion 260 has a function of supplying current I3*a* to the wiring 203*a* through the terminal 261*a* and a function of supplying current I3*b* to the wiring 203*b* through the terminal 261*b*. Moreover, the comparison portion 260 has a function of converting a difference between a current value of the current I3*a* and a current value of the current I3*b* (also referred to as a "current difference") into voltage Vout and supplying the voltage to the terminal 262.

The terminal 261*a* and the terminal 261*b* are supplied with potentials higher than the potential supplied to the source of the transistor M2*a* and the potential supplied to the source of the transistor M2*b*.

Next, an operation of the semiconductor device 230 is described. When the sensor portion 240 is irradiated with light, the potential of the node ND changes in accordance with the illuminance, and the current I1 flows between the source and the drain of the transistor M1. The potential of the node ND in this case corresponds to the data u(t). Note that the potential of the node ND in this case is set to a potential at which the transistor M1, the transistor M2*a*, and the transistor M2*b* are turned on.

Current I2*a* flowing between the source and drain of the transistor M2*a* is determined by the potential of the node ND and Vth of the transistor M2*a*. Current I2*b* that flows between the source and drain of the transistor M2*b* is determined by the potential of the node ND and Vth of the transistor M2*b*.

In the semiconductor device 230 illustrated in FIG. 3, only the transistor M2*a* is electrically connected to the wiring 203*a*, and only the transistor M2*b* is electrically connected to the wiring 203*b*. Thus, the current I3*a* supplied from the comparison portion 260 is equal to the current I2*a*, and the current I3*b* is equal to the current I2*b*.

The comparison portion 260 supplies, to the terminal 262, voltage Vout corresponding to a difference between the current I3*a* and the current I3*b*. For example, the voltage Vout can be positive when the current I3*a* is higher than the current I3*b* and can be negative when the current I3*a* is lower than the current I3*b*. The voltage Vout may be positive when the current I3*a* is lower than the current I3*b* and can be negative when the current I3*a* is higher than the current I3*b*. Note that "the voltage Vout is positive" means that the potential of the voltage Vout is higher than a reference potential. Note also that "the voltage Vout is negative" means that the potential of the voltage Vout is lower than a reference potential. The voltage Vout corresponds to a product of the weight $W_{in}$ and the data u(t) ($W_{in}$×u(t)). In this manner, product arithmetic can be performed.

The power consumption of the semiconductor device increases with increasing current I3 (the current I3*a* and the current I3*b*). To prevent the current I3 from being excessively high, each of the current I2*a* and the current I2*b* is preferably less than or equal to 10 times, further preferably less than or equal to 5 times the current I1.

For example, in the case where the potential of the node ND is assumed to be 1, the current I2*a* and the current I2*b* in this case are 1.0 μA and 1.1 μA, respectively, −0.1 μA that is a difference between the current I2*a* and the current I2*b* corresponds to the weight $W_{in}$.

Accordingly, the amounts of the current I2*a* and the current I2*b* are preferably different from each other. The current I2*b* is preferably less than or equal to 0.95 times or greater than or equal to 1.05 times, further preferably less than or equal to 0.7 times or greater than or equal to 1.3 times, still further preferably less than or equal to 0.3 times or greater than or equal to 3 times the current I2*a*.

The amount of difference between the current I2*a* and the current I2*b* is determined by a difference between Vth of the transistor M2*a* and Vth of the transistor M2*b* (also referred to as "variation in Vth" or "dVth"). Accordingly, the difference between Vth of the transistor M2*a* and Vth of the transistor M2*b* corresponds to the weight $W_{in}$.

Vth of the transistor M2*a* and Vth of the transistor M2*b* are preferably different from each other. Vth of the transistor M2*b* is preferably less than or equal to 0.9 times or greater than or equal to 1.1 times, further preferably less than or equal to 0.85 times or greater than or equal to 1.15 times, still further preferably less than or equal to 0.8 times or greater than or equal to 1.2 times Vth of the transistor M2*a*.

According to one embodiment of the present invention, product arithmetic using variation in Vth between transistors as a weight can be performed.

[Product-Sum Arithmetic Circuit]

Figure 4A:
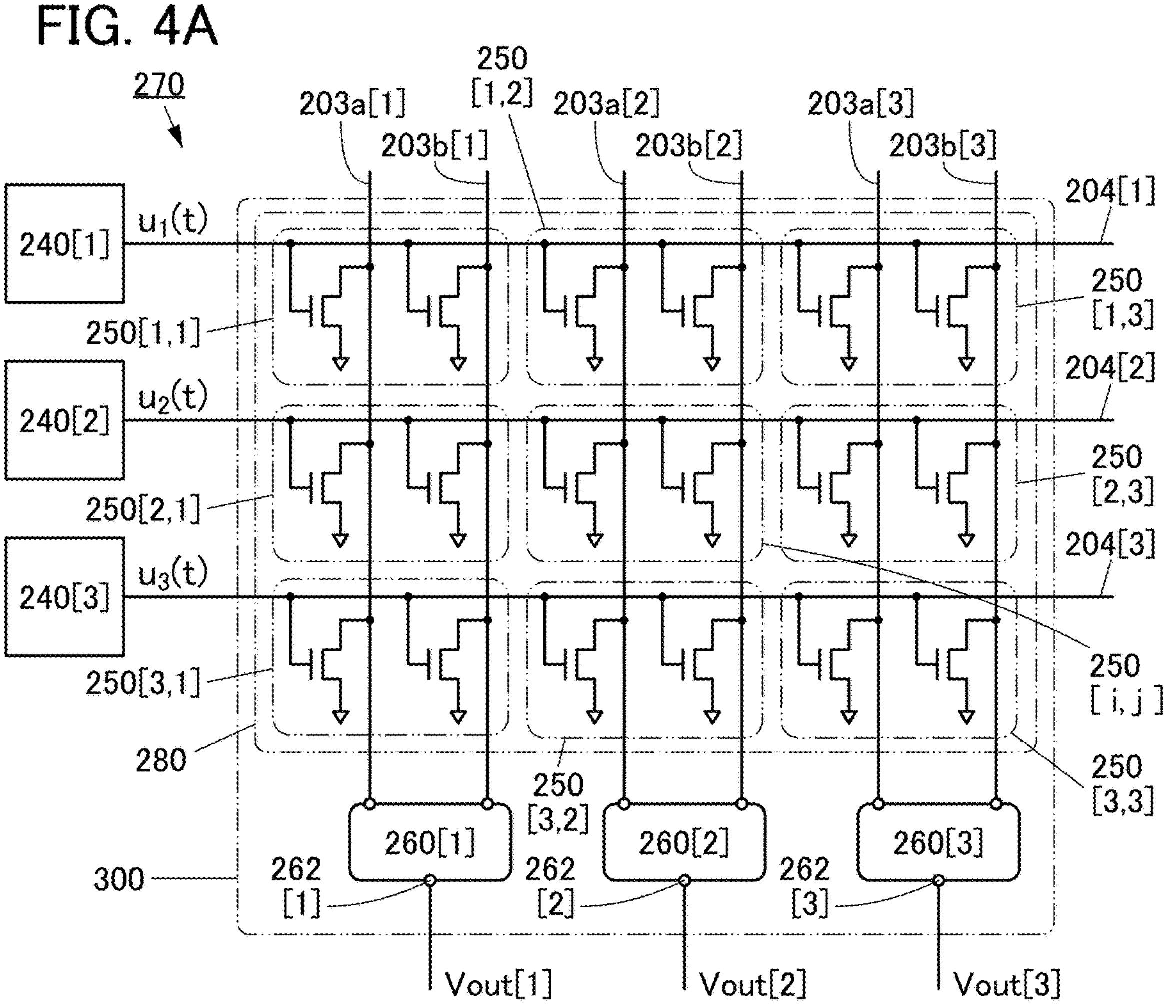
FIG. 4A is a diagram illustrating a semiconductor device.
Figure 4B:
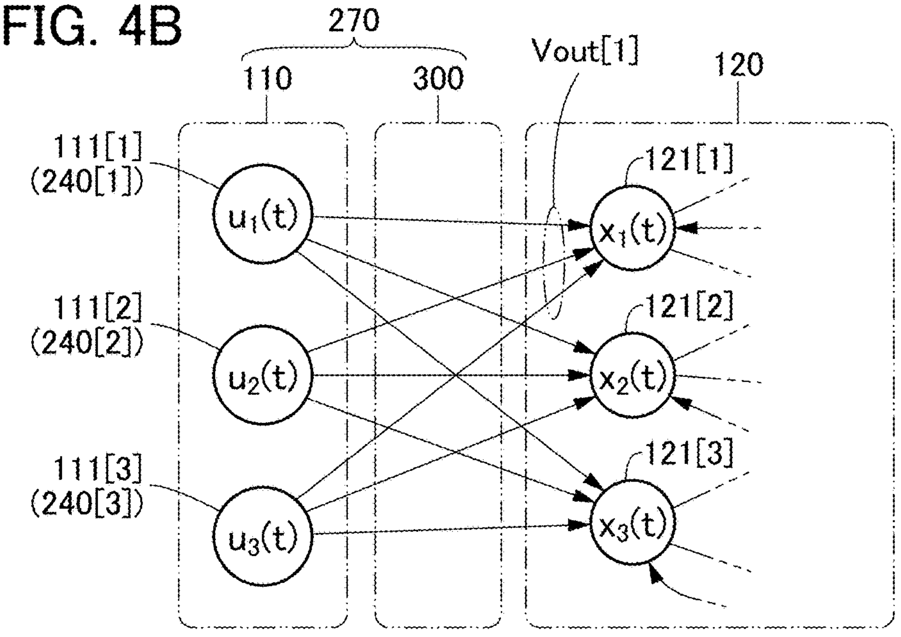
FIG. 4B is a diagram illustrating part of a structure example of a reservoir computing model.

FIG. 4A illustrates a structure example of a semiconductor device 270 in which illuminance detected by the sensor portion 240 including the photodiode 210 is used as the data u(t) and variation in Vth between transistors is used as the weight $W_{in}$. FIG. 4B illustrates a structure example of an RC model that corresponds to the semiconductor device 270.

In the semiconductor device 270, M nodes 111 included in the input layer 110 each function as a product-sum arithmetic circuit connected to each of N nodes 121 included in the reservoir layer 120. FIG. 4A and FIG. 4B illustrate the case where M and N are each three.

The semiconductor device 270 has a function of performing product-sum arithmetic of a plurality of pieces of data u(t) and a plurality of weights $W_{in}$. A sensor portion 240[1] to a sensor portion 240[3] illustrated in FIG. 4A correspond to a node 111[1] to a node 111[3] illustrated in FIG. 4B. Output destinations of a comparison portion 260[1] to a comparison portion 260[3] illustrated in FIG. 4A correspond to a node 121[1] to a node 121[3] illustrated in FIG. 4B. In this specification and the like, a given sensor portion 240 may be denoted as a sensor portion 240[*i*] (i is an integer greater than or equal to 1 and less than or equal to M). Moreover, in this specification and the like, a given comparison portion 260 may be denoted as a comparison portion 260[*j*] (j is an integer greater than or equal to 1 and less than or equal to N).

The semiconductor device 270 includes the sensor portion 240[1] to the sensor portion 240[3], a product-sum arithmetic portion 300, M wirings 204, N wirings 203*a*, and N wirings 203*b*. The product-sum arithmetic portion 300 includes a product arithmetic array 280 including a plurality of product arithmetic portions 250 arranged in a matrix of M rows and N columns. FIG. 4A illustrates a structure example of the case where M and N are each three. Accordingly, the sensor portion 240[3] can be denoted as a sensor portion 240[M]. Moreover, the comparison portion 260[3] can be denoted as a comparison portion 260[N].

In FIG. 4A, the product arithmetic portion 250 in the first row and the first column is denoted as a product arithmetic portion 250[1,1], the product arithmetic portion 250 in the second row and the first column is denoted as a product arithmetic portion 250[2,1], and the product arithmetic portion 250 in the third row and the first column is denoted as a product arithmetic portion 250[3,1].

Moreover, the product arithmetic portion 250 in the first row and the second column is denoted as a product arithmetic portion 250[1,2] and the product arithmetic portion 250 in the third row and the second column is denoted as a product arithmetic portion 250[3,2]. A given product arithmetic portion 250 may be denoted as a product arithmetic portion 250[*i,j*]. The product arithmetic portion 250[i,j] illustrated in FIG. 4A is the product arithmetic portion 250 in which i and j are each two.

Furthermore, in FIG. 4A, the product arithmetic portion 250 in the first row and the third column is denoted as a product arithmetic portion 250[1,3], the product arithmetic portion 250 in the second row and the third column is denoted as a product arithmetic portion 250[2,3], and the product arithmetic portion 250 in the third row and the third column is denoted as a product arithmetic portion 250[3,3]. Note that in the product arithmetic array 280 illustrated in FIG. 4A, the product arithmetic portion 250[3,3] can be denoted as a product arithmetic portion 250[M,N].

The product arithmetic portions 250 in the first row are electrically connected to the sensor portion 240[1] through a wiring 204[1]. The product arithmetic portions 250 in the second row are electrically connected to the sensor portion 240[2] through a wiring 204[2]. The product arithmetic portions 250 in the third row are electrically connected to the sensor portion 240[3] through a wiring 204[3].

In FIG. 4, the data u(t) output from the sensor portion 240[1] is denoted as data $u_1(t)$, the data u(t) output from the sensor portion 240[2] is denoted as data $u_2(t)$, and the data u(t) output from the sensor portion 240[3] is denoted as data $u_3(t)$.

The product arithmetic portions 250 in the first row are electrically connected to the comparison portion 260[1] through a wiring 203*a*[1] and a wiring 203*b*[1]. The product arithmetic portions 250 in the second row are electrically connected to the comparison portion 260[2] through a wiring 203*a*[2] and a wiring 203*b*[2]. The product arithmetic portions 250 in the third row are electrically connected to the comparison portion 260[3] through a wiring 203*a*[3] and a wiring 203*b*[3].

To avoid repeated description, the sensor portion 240, the product arithmetic portion 250, and the comparison portion 260 are not described here.

Figure 5:
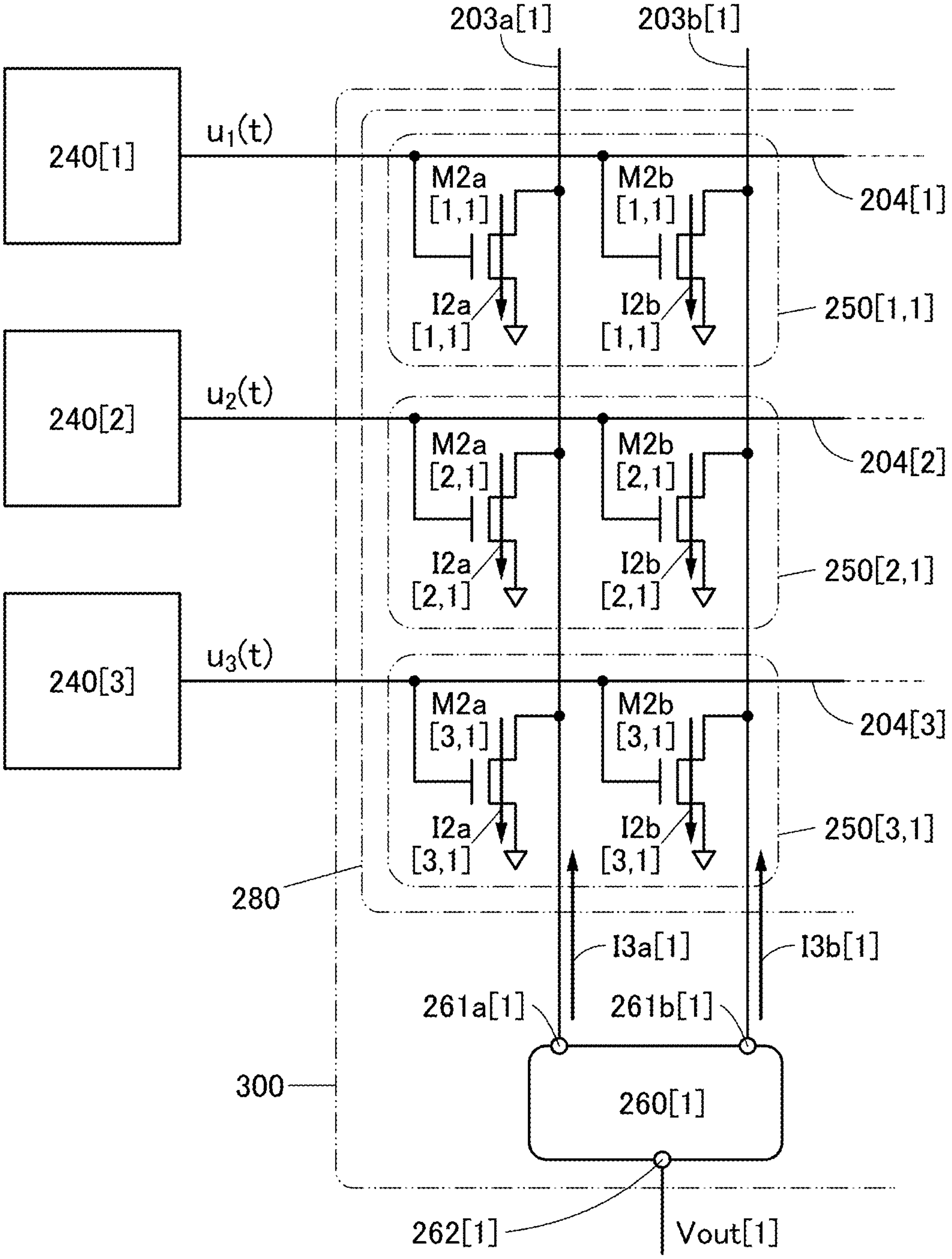
FIG. 5 is a diagram illustrating the semiconductor device.

Next, product-sum arithmetic using the product arithmetic portions 250 in the first column is described. FIG. 5 is an enlarged view of part of the semiconductor device 270 that includes the product arithmetic portions 250 in the first column.

When voltage corresponding to the data $u_1(t)$ is supplied to the product arithmetic portion 250[1,1], current I2*a*[1,1] flows between a source and a drain of a transistor M2*a*[1,1] included in the product arithmetic portion 250[1,1] and current I2*b*[1,1] flows between a source and a drain of a transistor M2*b*[1,1].

When voltage corresponding to the data $u_2(t)$ is supplied to the product arithmetic portion 250[2,1], current I2*a*[2,1] flows between a source and a drain of a transistor M2*a*[2,1] included in the product arithmetic portion 250[2,1] and current I2*b*[2,1] flows between a source and a drain of a transistor M2*b*[2,1].

When voltage corresponding to the data $u_3(t)$ is supplied to the product arithmetic portion 250[3,1], current I2*a*[3,1] flows between a source and a drain of a transistor M2*a*[3,1] included in the product arithmetic portion 250[3,1] and current I2*b*[3,1] flows between a source and a drain of a transistor M2*b*[3,1].

Accordingly, current that is the sum of the current I2*a*[1,1], the current I2*a*[2,1], and the current I2*a*[3,1] is supplied as current I3*a*[1] from the comparison portion 260[1] in the first column to the wiring 203*a*[1] through a terminal 261*a*[1].

Current that is the sum of the current I2*b*[1,1], the current I2*b*[2,1], and the current I2*b*[3,1] is supplied as current I3*b*[1] from the comparison portion 260[1] in the first column to the wiring 203*b*[1] through a terminal 261*b*[1].

The comparison portion 260[1] supplies, to a terminal 262[1], voltage Vout[1] corresponding to a difference between the current I3*a*[1] and the current I3*b*[1]. Thus, the voltage Vout[1] corresponds to the sum of the product of weight $W_{in}$[1,1] (not illustrated) of the product arithmetic portion 250[1,1] and the data $u_1(t)$, the product of weight $W_{in}$[2,1] (not illustrated) of the product arithmetic portion 250[2,1] and the data $u_2(t)$, and the product of weight $W_{in}$[3,1] (not illustrated) of the product arithmetic portion 250[3,1] and the data $u_3(t)$.

From the comparison portion 260[2] like the comparison portion 260[1], voltage Vout[2] corresponding to the sum of the product of weight $W_{in}$[1,2] (not illustrated) of the product arithmetic portion 250[1,2] and the data $u_1(t)$, the product of weight $W_{in}$[2,2] (not illustrated) of a product arithmetic portion 250[2,2] and the data $u_2(t)$, and the product of weight $W_{in}$[3,2] (not illustrated) of the product arithmetic portion 250[3,2] and the data $u_3(t)$ is supplied to a terminal 262[2].

From the comparison portion 260[3] like the comparison portion 260[1] and the comparison portion 260[2], voltage Vout[3] corresponding to the sum of the product of weight $W_{in}$[1,3] (not illustrated) of the product arithmetic portion 250[1,3] and the data u1(*t*), the product of weight $W_{in}$[2,3] (not illustrated) of the product arithmetic portion 250[2,3] and the data $u_2(t)$, and the product of weight $W_{in}$[3,3] (not illustrated) of the product arithmetic portion 250[3,3] and the data $u_3(t)$ is supplied to a terminal 262[3].

In this manner, product-sum arithmetic of the weight $W_{in}$ and the data u(t) can be performed in the semiconductor device 270. The voltage Vout[1] supplied to the terminal 262[1] is input to the first node 121 (the node 121[1]) included in the reservoir layer 120. Data $x_1(t)$ of the node 121[1] is determined using Formula 1. The voltage Vout[1] corresponds to "$W_{in}$×u(t)" in Formula 1.

The voltage Vout[2] supplied to the terminal 262[2] is input to the second node 121 (the node 121[2]) included in the reservoir layer 120. The voltage Vout[3] supplied to the terminal 262[3] is input to the third node 121 (the node 121[3]) included in the reservoir layer 120. The data $x_2(t)$ and the data $x_3(t)$ are also determined using Formula 1. The voltage supplied to the terminal 262[2] and the voltage supplied to the terminal 262[3] each correspond to "$W_{in}$×u (t)" in Formula 1.

As described above, Vth of the transistor M2*a* included in the product arithmetic portion 250 and Vth of the transistor M2*b* are preferably different from each other. Vth of the transistor M2*b* is preferably less than or equal to 0.9 times or greater than or equal to 1.1 times, further preferably less than or equal to 0.85 times or greater than or equal to 1.15 times, still further preferably less than or equal to 0.8 times or greater than or equal to 1.2 times Vth of the transistor M2*a*.

It is preferable that a difference in Vth (dVth) between the transistor M2*a* and the transistor M2*b* vary randomly among the plurality of product arithmetic portions 250 included in the product arithmetic array 280. Note that as long as the value of dVth is regarded as varying randomly in the product arithmetic array 280 as a whole, the dVth of two or more of the plurality of product arithmetic portions 250 included in the product arithmetic array 280 may be equal to each other.

According to one embodiment of the present invention, product-sum arithmetic using dVth as a weight can be performed. In other words, product-sum arithmetic using variation in Vth between transistors as a weight can be performed. The variation in Vth between transistors is not uniform but random as described above. Thus, the variation in Vth between transistors can be suitably used as a weight of reservoir computing.

Moreover, when variation in Vth between transistors is used as a weight, a circuit structure for storing a weight is not required. This reduces the area occupied by implemented hardware, which facilitates circuit design. In other words, a product arithmetic circuit or a product-sum arithmetic circuit can be easily implemented in hardware. Furthermore, when the variation in Vth between transistors is used as a weight, weight data rewriting is not required, which enables arithmetic processing with low power consumption.

The structure described in this embodiment can be used in an appropriate combination with the structures described in the other embodiments.

Embodiment 2

In this embodiment, a structure example in which the product-sum arithmetic portion 300 is used in an RC model 150 that includes the input layer 110 including S (S is the product of m and n; m and n are each an integer greater than or equal to 2) sensor portions 240 arranged in a matrix of m rows and n columns, the reservoir layer 120 including N nodes 121, and the output layer 130 including K nodes 131 will be described.

Figure 6:
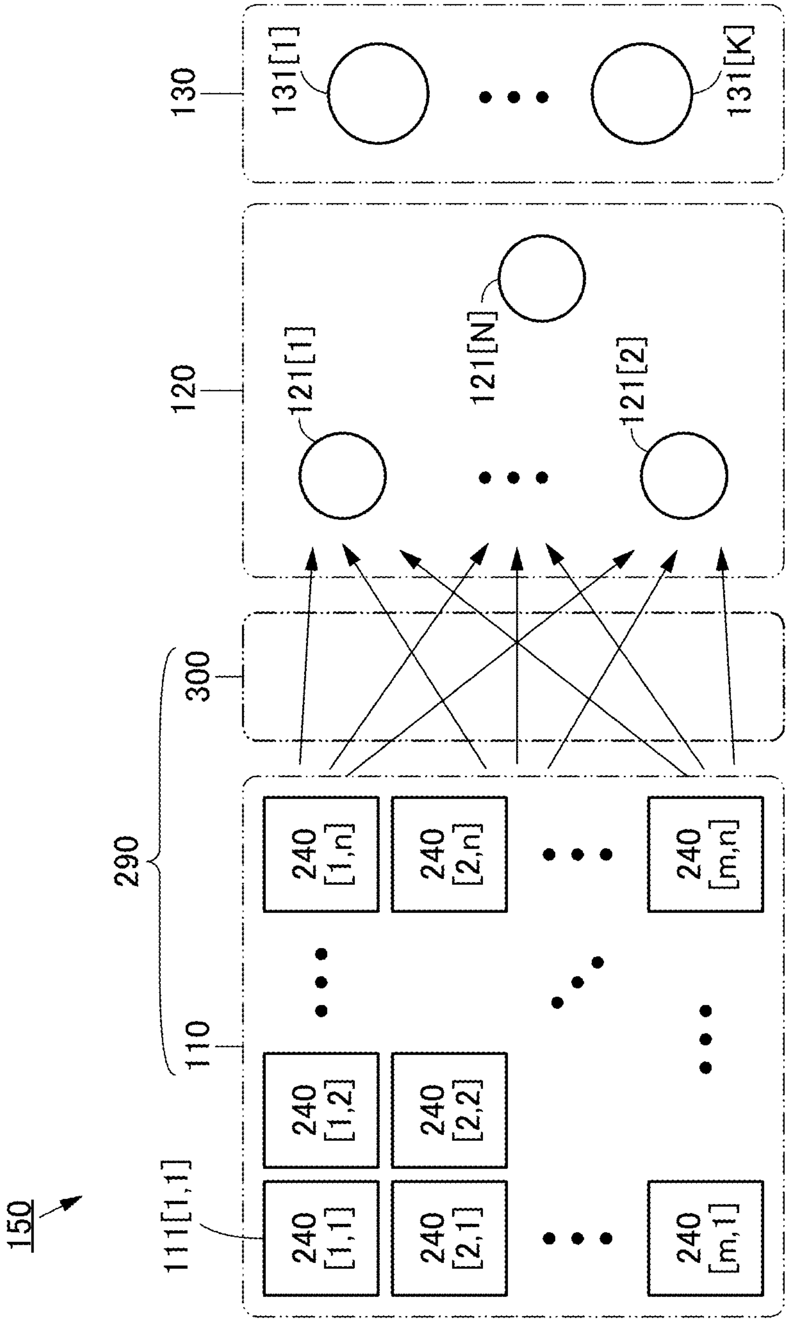
FIG. 6 is a block diagram illustrating a structure of an RC model.

FIG. 6 is a block diagram illustrating a structure of the RC model 150. The RC model 150 is a variation example of the RC model 100. The sensor portion 240 corresponds to the node 111 described in the above embodiment. For matters not described in this embodiment, the description in the other embodiments can be referred to.

In FIG. 6, the sensor portion 240 arranged in the first row and the first column is denoted as a sensor portion 240[1,1]. The sensor portion 240 arranged in the second row and the first column is denoted as a sensor portion 240[2,1]. The sensor portion 240 arranged in the first row and the second column is denoted as a sensor portion 240[1,2]. The sensor portion 240 arranged in the second row and the second column is denoted as a sensor portion 240[2,2]. The sensor portion 240 arranged in the m-th row and the first column is denoted as a sensor portion 240[m,1]. The sensor portion 240 arranged in the first row and the n-th column is denoted as a sensor portion 240[1,*n*]. The sensor portion 240 arranged in the second row and the n-th column is denoted as a sensor portion 240[2,*n*]. The sensor portion 240 arranged in the m-th row and the n-th column is denoted as a sensor portion 240[m,n]. For example, the sensor portion 240[1,1] corresponds to a node 111[1,1].

The first node 121 is denoted as the node 121[1]; the second node 121 is denoted as the node 121[2]; and the N-th node 121 is denoted as a node 121[N].

The first node 131 is denoted as a node 131[1]; the K-th node 131 is denoted as a node 131[K].

Figure 7:
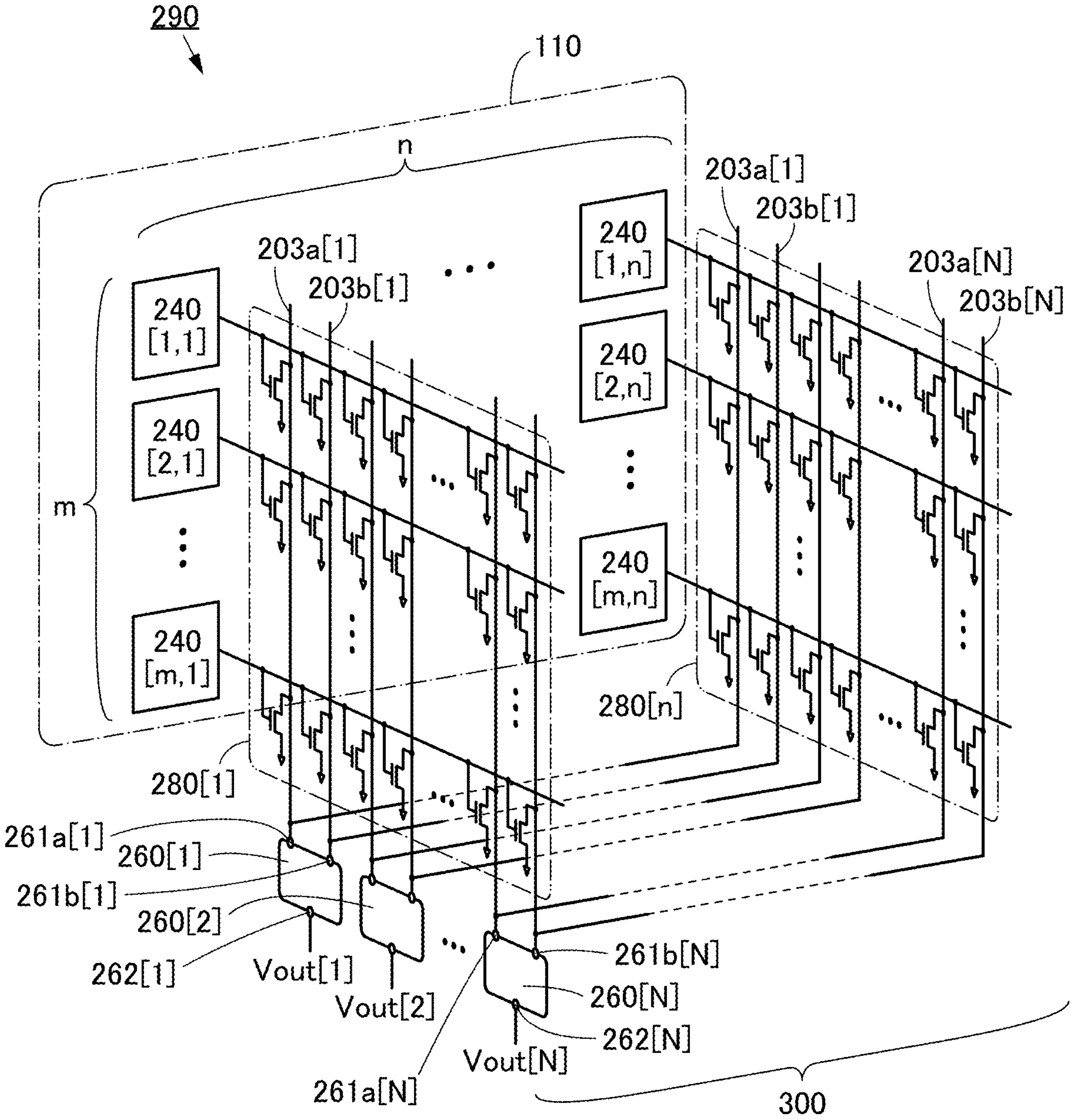
FIG. 7 is a perspective view illustrating a structure example of a semiconductor device.

The product-sum arithmetic portion 300 of one embodiment of the present invention can be used in a connection portion between the input layer 110 and the reservoir layer 120 in the RC model 150. FIG. 7 illustrates an example of a connection structure of a semiconductor device 290 including the input layer 110 and the product-sum arithmetic portion 300.

FIG. 7 is a perspective block diagram of the semiconductor device 290. The product-sum arithmetic portion 300 includes n product arithmetic arrays 280 and N comparison portions 260. The first product arithmetic array 280 (a product arithmetic array 280[1]) is electrically connected to m sensor portions 240 arranged in the first column in the input layer 110. The n-th product arithmetic array 280 (a product arithmetic array 280[n]) is electrically connected to m sensor portions 240 arranged in the n-th column in the input layer 110.

A structure of connection between the sensor portions 240 in each column in the input layer 110 and the product arithmetic array 280 is similar to that in the semiconductor device 270. For example, M described in Embodiment 1 corresponds to m. Thus, detailed description is omitted in this embodiment.

In the semiconductor device 290, the wiring 203*a*[1] included in each of n product arithmetic arrays 280 is electrically connected to the terminal 261*a*[1]. The wiring 203*b*[1] included in each of n product arithmetic arrays 280 is electrically connected to the terminal 261*b*[1].

Accordingly, the voltage Vout[1] supplied to the terminal 262[1] from the comparison portion 260[1] corresponds to a product-sum arithmetic result of weight $W_{in}$ in the first column in each of n product arithmetic arrays 280 and data u(t) supplied from S sensor portions 240.

Similarly, a wiring 203*a*[N] included in each of n product arithmetic arrays 280 is electrically connected to a terminal 261*a*[N]. A wiring 203*b*[N] included in each of n product arithmetic arrays 280 is electrically connected to a terminal 261*b*[N].

Accordingly, voltage Vout[N] supplied to a terminal 262 [N] from a comparison portion 260[N] corresponds to a product-sum arithmetic result of weight $W_{in}$ in the N-th column in each of n product arithmetic arrays 280 and data u(t) supplied from S sensor portions 240.

In this manner, the voltage Vout[1] to the voltage Vout[N] are obtained. The voltage Vout is input to the node 121 included in the reservoir layer 120. For example, the voltage Vout[1] is input to the node 121[1], and the voltage Vout[2] is input to the node 121[2]. The voltage Vout[N] is input to the node 121 [N].

The reservoir layer 120 and the output layer 130 may be configured with software. Product-sum arithmetic of the data u(t) and the weight $W_{in}$ is performed by the input layer 110 and the product-sum arithmetic portion 300 that are implemented in hardware, and arithmetic processing of the reservoir layer 120 and arithmetic processing of the output layer 130 are performed with use of the result of the product-sum arithmetic. In particular, the product-sum arithmetic portion 300 in which a weight does not need to be changed in the RC model is implemented in hardware, whereby arithmetic processing can be performed with low power consumption. Furthermore, high-speed arithmetic processing can be performed.

The weight $W_{res}$ does not need to be changed either as long as it is random in the reservoir layer 120; thus, the reservoir layer 120 may be implemented in hardware. In other words, the layer in which a weight is not changed later may be implemented in hardware.

In the RC model, the weight $W_{out}$ is changed by training in some cases. For that reason, the output layer 130 is preferably configured with software capable of changing a weight easily. The weight $W_{out}$ corresponds to the strength of connection between the node 121 included in the reservoir layer 120 and the node 131 included in the output layer 130. Thus, the reservoir layer 120 and the output layer 130 are preferably configured with software.

The structure described in this embodiment can be used in an appropriate combination with the structures described in the other embodiments.

Embodiment 3

In this embodiment, examples of planar layouts of the product arithmetic portion 250 and the product arithmetic array 280 will be described.

Figure 8A:
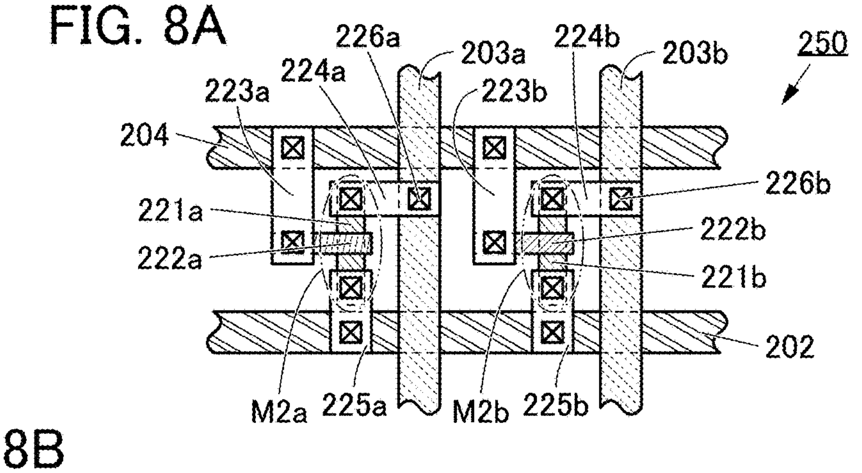
FIG. 8A is a diagram illustrating a planar layout of a product arithmetic portion.

FIG. 8A illustrates an example of a planar layout of the product arithmetic portion 250. In FIG. 8A, a region where a semiconductor layer 221*a* and a conductive layer 222*a* overlap with each other functions as a channel formation region of the transistor M2*a*. Accordingly, the conductive layer 222*a* functions as a gate of the transistor M2*a*. The conductive layer 222*a* is electrically connected to the wiring 204 through a conductive layer 223*a*.

The semiconductor layer 221*a* is electrically connected to the wiring 203*a* through a conductive layer 224*a*. Moreover, the semiconductor layer 221*a* is electrically connected to the wiring 202 through a conductive layer 225*a*.

In FIG. 8A, a region where a semiconductor layer 221*b* and a conductive layer 222*b* overlap with each other functions as a channel formation region of the transistor M2*b*. Accordingly, the conductive layer 222*b* functions as a gate of the transistor M2*b*. The conductive layer 222*b* is electrically connected to the wiring 204 through a conductive layer 223*b*.

The semiconductor layer 221*b* is electrically connected to the wiring 203*b* through a conductive layer 224*b*. Moreover the semiconductor layer 221*b* is electrically connected to the wiring 202 through a conductive layer 225*b*.

Electrical connection between the conductive layer, the semiconductor layer, and the wiring is made in a contact hole portion. For example, the conductive layer 224*a* and the wiring 203*a* are electrically connected to each other through a contact hole 226*a*. Moreover, for example, the conductive layer 224*b* and the wiring 203*b* are electrically connected to each other in a contact hole 226*b*.

Figure 8B:
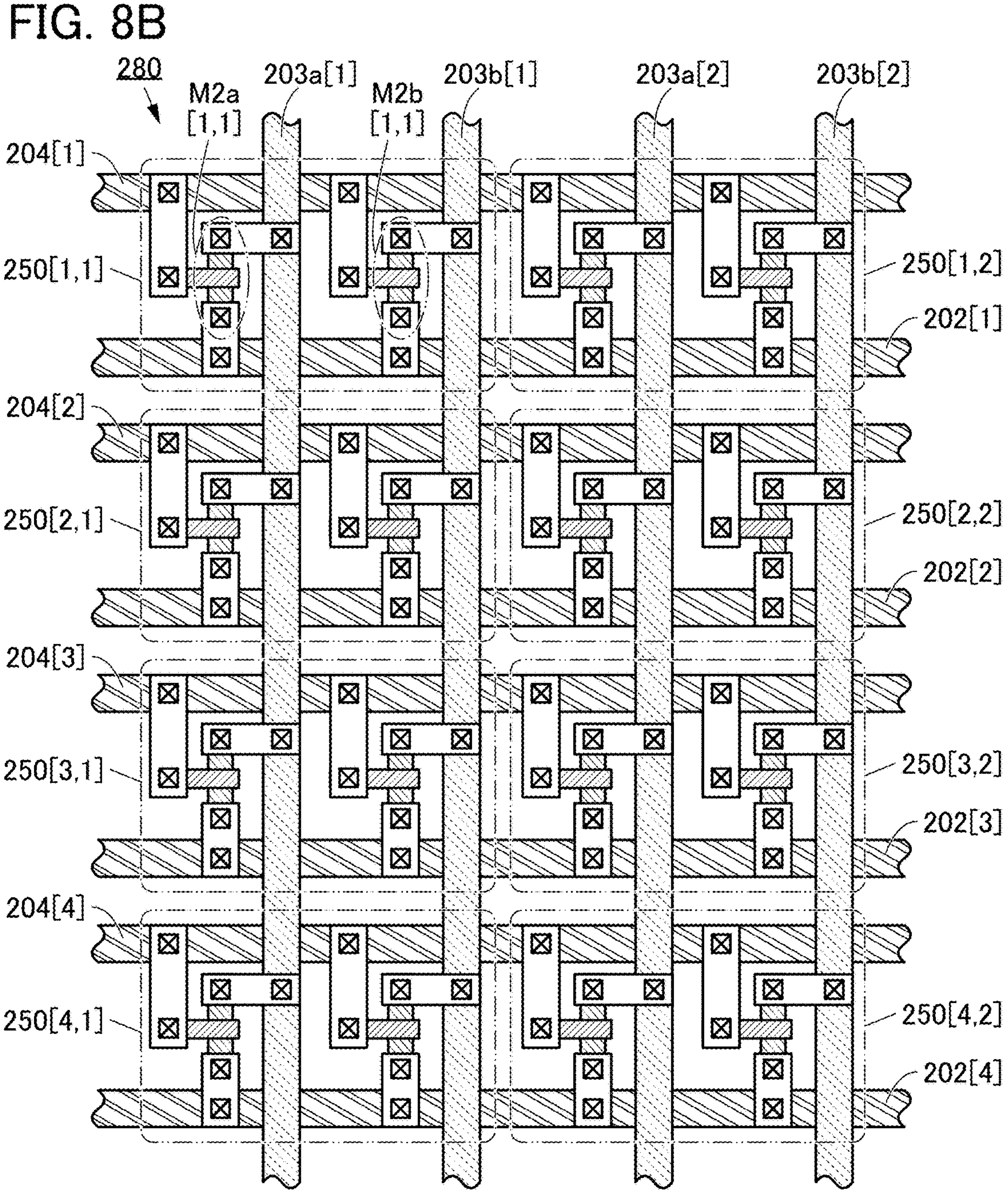
FIG. 8B is a diagram illustrating a planar layout of a product arithmetic array.

FIG. 8B illustrates an example of a planar layout of the product arithmetic array 280. FIG. 8B illustrates an example of a planar layout of the product arithmetic array 280 in which the product arithmetic portions 250 are arranged in four rows and two columns.

In FIG. 8B, the product arithmetic portion 250 in the first row and the first column is denoted as the product arithmetic portion 250[1,1]. The product arithmetic portion 250 in the fourth row and the first column is denoted as a product arithmetic portion 250[4,1], and the product arithmetic portion 250 in the fourth row and the second column is denoted as a product arithmetic portion 250[4,2]. The product arithmetic portions 250 arranged at the other positions are denoted in a similar manner to the above.

The wiring 204 electrically connected to the product arithmetic portions 250 in the first row is denoted as the wiring 204[1], and the wiring 204 electrically connected to the product arithmetic portions 250 in the second row is denoted as the wiring 204[2]. The wiring 204 electrically connected to the product arithmetic portions 250 in the third row is denoted as the wiring 204[3], and the wiring 204 electrically connected to the product arithmetic portions 250 in the fourth row is denoted as a wiring 204[4].

The wiring 202 electrically connected to the product arithmetic portions 250 in the first row is denoted as a wiring 202[1], and the wiring 202 electrically connected to the product arithmetic portions 250 in the second row is denoted as a wiring 202[2]. The wiring 202 electrically connected to the product arithmetic portions 250 in the third row is denoted as a wiring 202[3], and the wiring 202 electrically connected to the product arithmetic portions 250 in the fourth row is denoted as a wiring 202[4].

The wiring 203*a* and the wiring 203*b* electrically connected to the product arithmetic portions 250 in the first column are denoted as the wiring 203*a*[1] and the wiring 203*b*[1], respectively. The wiring 203*a* and the wiring 203*b* electrically connected to the product arithmetic portions 250 in the second column are denoted as the wiring 203*a*[2] and the wiring 203*b*[2], respectively.

Variation Example 1

One or both of the channel length and the channel width of one or both of the transistor M2*a* and the transistor M2*b* in one product arithmetic portion 250 are varied randomly among the plurality of product arithmetic portions 250 constituting the product arithmetic array 280, whereby variation in Vth corresponding to the weight $W_{in}$ can be increased. In other words, variation in the weight $W_{in}$ (randomness) can be increased. The product arithmetic portions 250 may be arranged randomly in the product arithmetic array 280.

Note that the term being "random" in this embodiment and the like means that there is no regularity in a repetition cycle or that a repetition cycle cannot be expressed in linear form (linear function).

Figure 9A:
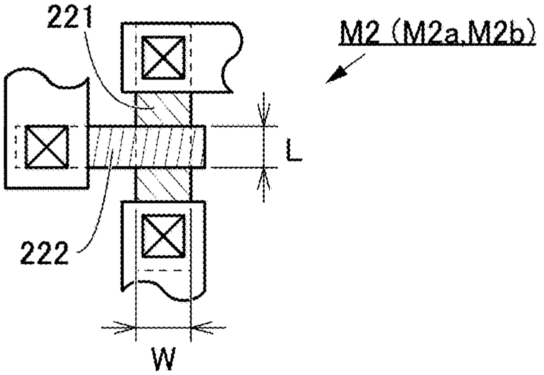
FIG. 9A is a plan view illustrating a transistor.

FIG. 9A is an enlarged plan view of the transistor M2 (one or both of the transistor M2*a* and the transistor M2*b*). In a region in the transistor M2 where a semiconductor layer 221 (the semiconductor layer 221*a* or the semiconductor layer 221*b*) and a conductive layer 222 (the conductive layer 222*a* or the conductive layer 222*b*) overlap with each other, the direction parallel to the direction of drain current flow is the channel length (L) and the direction orthogonal to the direction of drain current flow is the channel width (W).

The channel length of the transistor M2 can be rephrased as the length of the conductive layer 222 parallel to the direction of drain current flow in the region where the semiconductor layer 221 and the conductive layer 222 overlap with each other. The channel width of the transistor M2 can be rephrased as the length of the semiconductor layer 221 orthogonal to the direction of drain current flow in the region where the semiconductor layer 221 and the conductive layer 222 overlap with each other.

Thus, the channel length of the transistor M2 can be changed by adjusting the size of the conductive layer 222. Moreover, the channel width of the transistor M2 can be changed by adjusting the size of the semiconductor layer 221 (the semiconductor layer 221*a* and the semiconductor layer 221*b*).

Figure 9B:
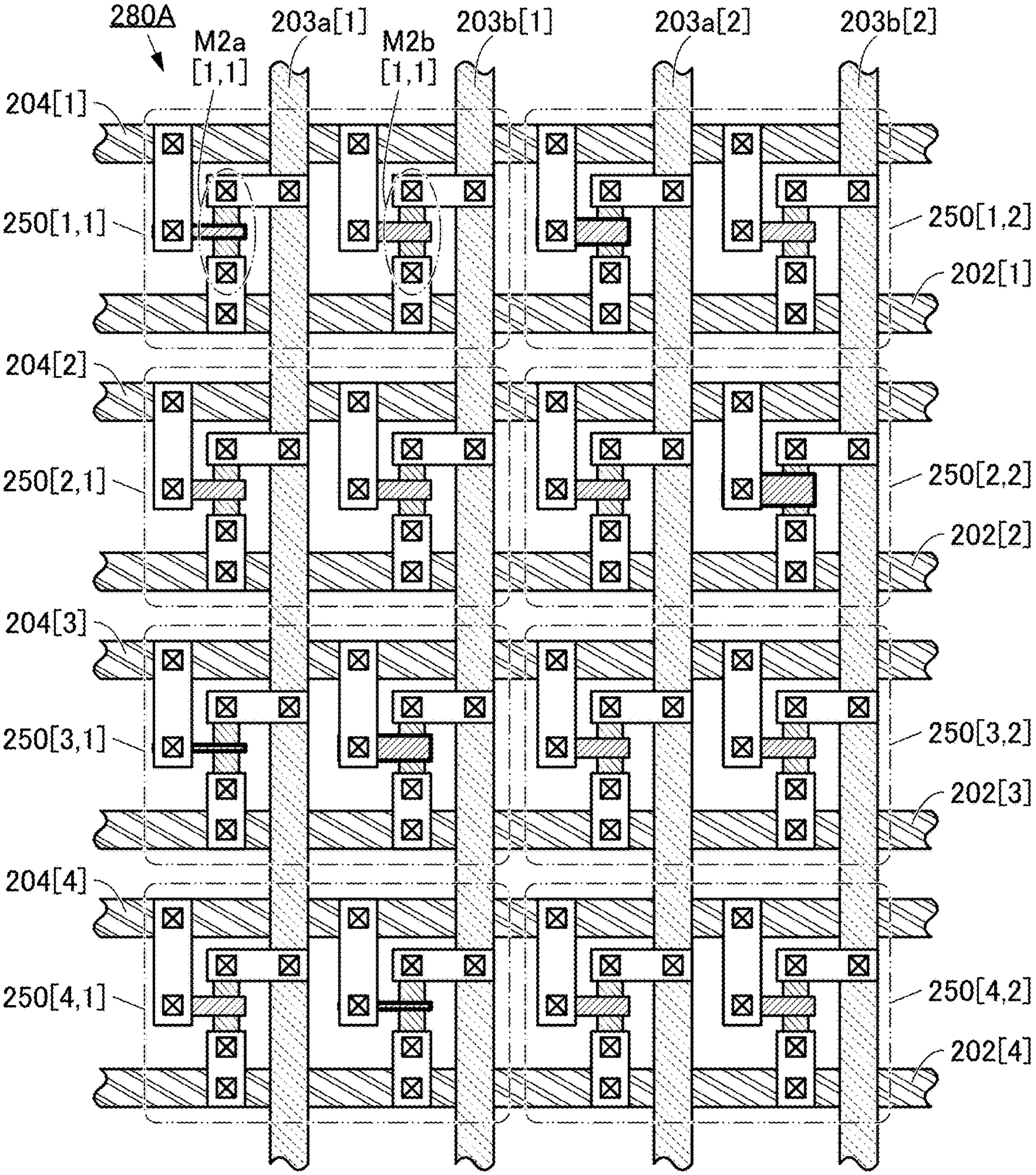
FIG. 9B is a diagram illustrating a planar layout of a product arithmetic array.

FIG. 9B illustrates a planar layout of a product arithmetic array 280A that is a variation example of the product arithmetic array 280. FIG. 9B illustrates a planar layout of the product arithmetic array 280A in which the sizes of the conductive layer 222*a* in the product arithmetic portion 250[1,1], the conductive layer 222*a* in the product arithmetic portion 250[1,2], the conductive layer 222*b* in the product arithmetic portion 250[2,2], the conductive layer 222*a* in the product arithmetic portion 250[3,1], the conductive layer 222*b* in the product arithmetic portion 250[3,1], and the conductive layer 222*b* in the product arithmetic portion 250[4,1] are varied randomly.

Variation Example 2

The product arithmetic portion 250 including only one of the transistor M2*a* and the transistor M2*b* is provided randomly in the product arithmetic array 280, whereby variation in the weight $W_{in}$ can be increased.

For example, in the case where only the transistor M2*a* of the transistor M2*a* and the transistor M2*b* in the product arithmetic portion 250 is provided, at least one of the semiconductor layer 221*b*, the conductive layer 222*b*, the conductive layer 223*b*, the conductive layer 224*b*, and the conductive layer 225*b* may be omitted. Alternatively, at least one of contact holes relating to these layers may be omitted. Similarly, in the case where only the transistor M2*b* is provided, at least one of the semiconductor layer 221*a*, the conductive layer 222*a*, the conductive layer 223*a*, the conductive layer 224*a*, and the conductive layer 225*a* may be omitted. Alternatively, at least one of contact holes relating to these layers may be omitted.

Figure 10:
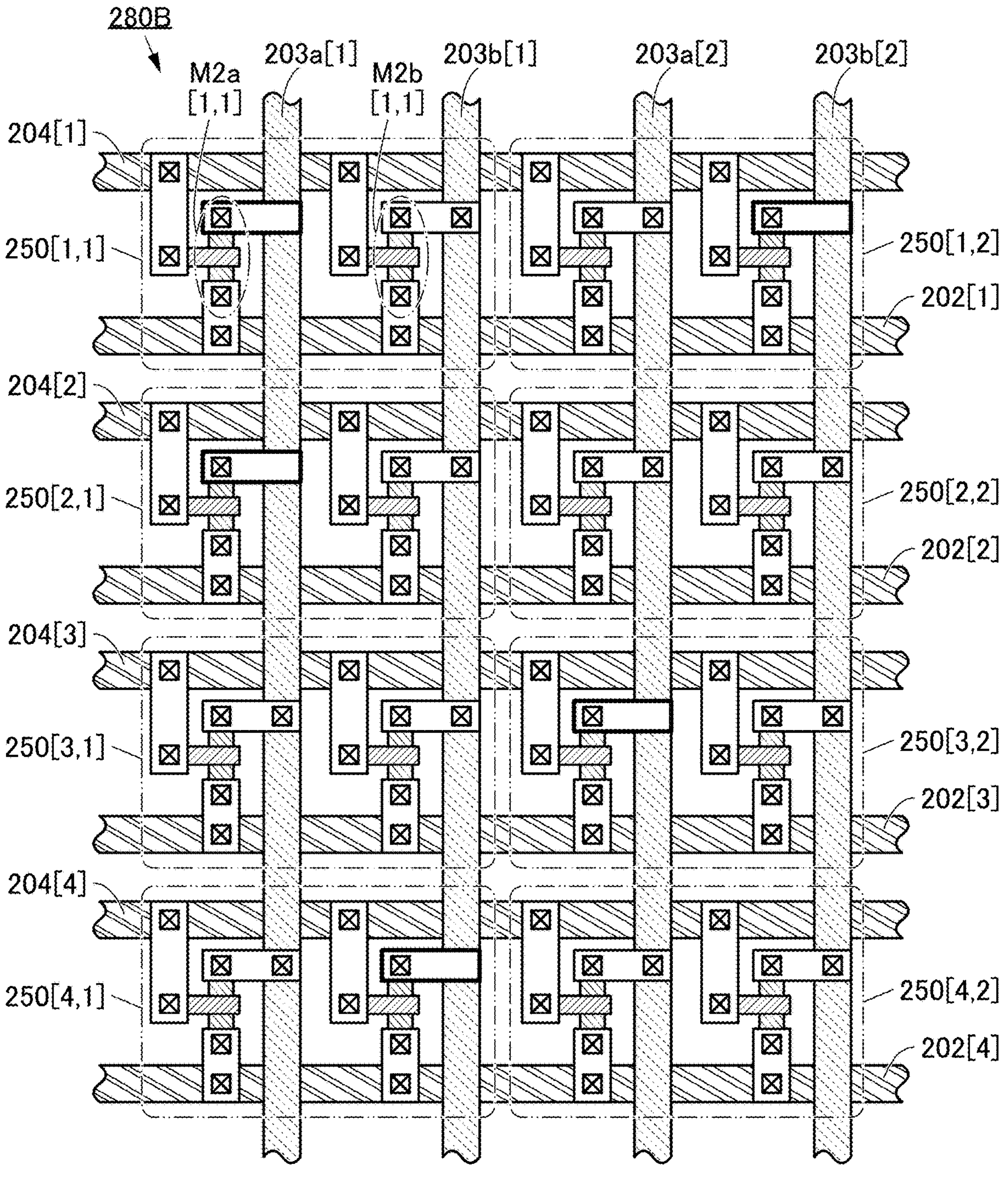
FIG. 10 is a diagram illustrating a planar layout of a product arithmetic array.
Figure 11:
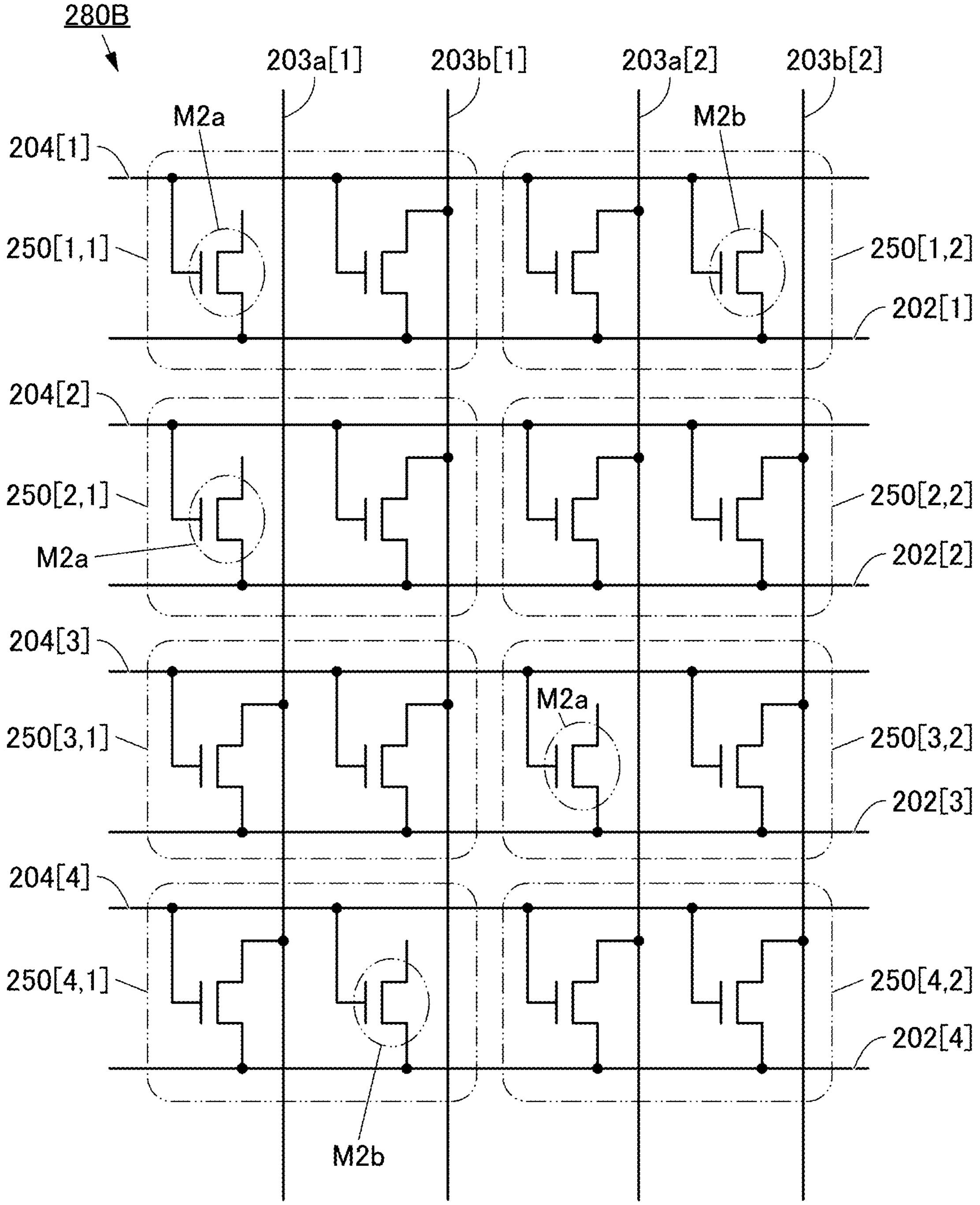
FIG. 11 is an equivalent circuit diagram of the product arithmetic array.

FIG. 10 illustrates a planar layout of a product arithmetic array 280B that is a variation example of the product arithmetic array 280. FIG. 10 illustrates a planar layout of the product arithmetic array 280B in which the contact hole 226*a* in the product arithmetic portion 250[1,1], the contact hole 226*a* in the product arithmetic portion 250[2,1], the contact hole 226*b* in the product arithmetic portion 250[4,1], the contact hole 226*b* in the product arithmetic portion 250[1,2], and the contact hole 226*a* in the product arithmetic portion 250[3,2] are not formed. FIG. 11 is an equivalent circuit diagram of the product arithmetic array 280B.

The structure described in this embodiment can be used in an appropriate combination with the structures described in the other embodiments.

Embodiment 4

In this embodiment, a semiconductor device 270A that is a variation example of the semiconductor device 270 described in the above embodiment will be described. The other embodiments are referred to for matters not described in this embodiment.

Figure 12:
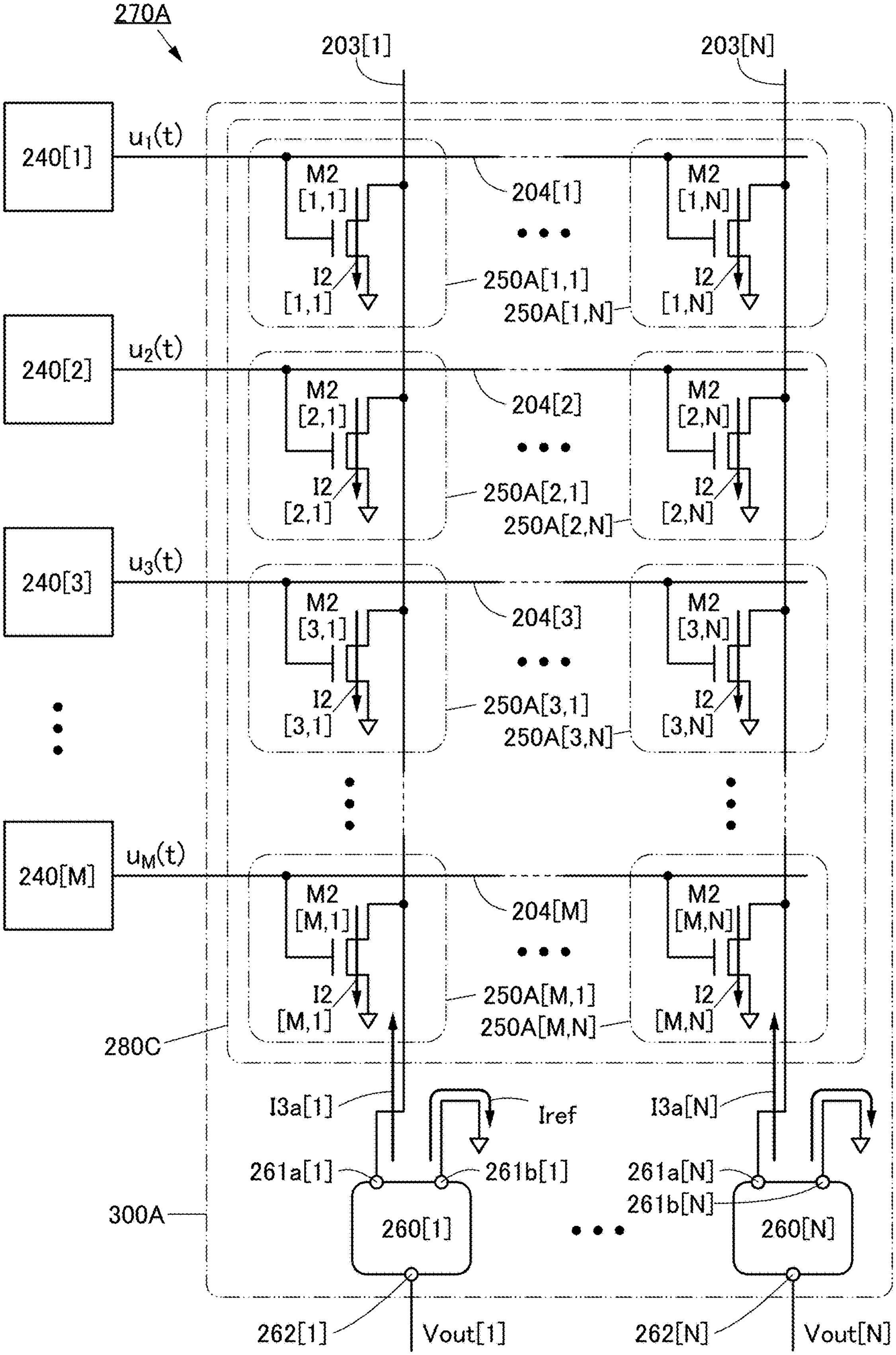
FIG. 12 is a diagram illustrating a structure example of a semiconductor device.

FIG. 12 illustrates a structure example of the semiconductor device 270A. The semiconductor device 270A includes a product-sum arithmetic portion 300A and M sensor portions 240. The product-sum arithmetic portion 300A includes a product arithmetic array 280C and N comparison portions 260. The product arithmetic array 280C includes a plurality of product arithmetic portions 250A arranged in a matrix of M rows and N columns. The product arithmetic array 280C is a variation example of the product arithmetic array 280.

In the above embodiment, one or both of the channel length and the channel width of each of the transistor M2*a* and the transistor M2*b* in one product arithmetic portion 250 are changed, whereby dVth between the transistors is increased. In addition, dVth between the plurality of product arithmetic portions 250 in the product arithmetic array 280 is randomly set.

In the semiconductor device 270A described in this embodiment, the product arithmetic portion 250A includes one transistor M2. The structure of the product arithmetic portion 250A can be regarded as a structure obtained by removing the transistor M2*a* or the transistor M2*b* from the product arithmetic portion 250. In FIG. 12, the transistor M2 included in the product arithmetic portion 250A in the first row and the first column is denoted as a transistor M2[1,1], and current flowing between a source and a drain of the transistor M2[1,1] is denoted as current I2[1,1]. Similarly, the transistor M2 included in the product arithmetic portion 250A in the M-th row and the N-th column is denoted as a transistor M2[M,N], and current flowing between a source and a drain of the transistor M2[M,N] is denoted as current I2[M,N].

In the plurality of product arithmetic portions 250A included in the product arithmetic array 280C, Vth is set such that the amount of Vth varies randomly among the transistors M2. Specifically, one or both of the channel length and the channel width of each of the transistors M2 included in the product arithmetic array 280C are randomly set.

As described in the above embodiment, the channel length of the transistor M2 can be rephrased as the length of the conductive layer 222 in a direction parallel to the direction of drain current flow in the region where the semiconductor layer 221 and the conductive layer 222 overlap with each other (see FIG. 9A). The channel width of the transistor M2 can be rephrased as the length of the semiconductor layer 221 that intersects with the direction of drain current flow in the region where the semiconductor layer 221 and the conductive layer 222 overlap with each other (see FIG. 9A).

Figure 13:
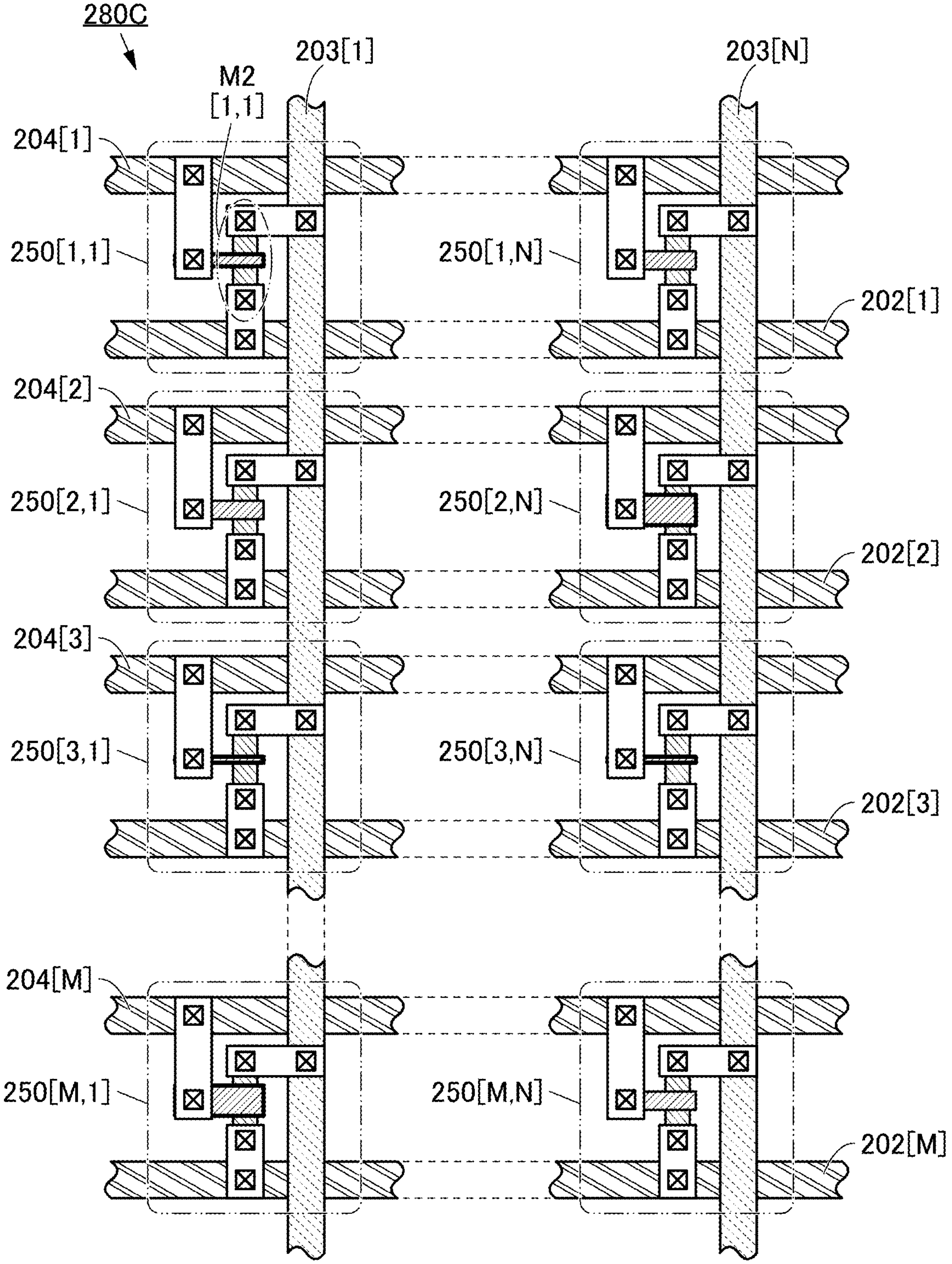
FIG. 13 is a diagram illustrating a planar layout of a product arithmetic array.
Figure 14:
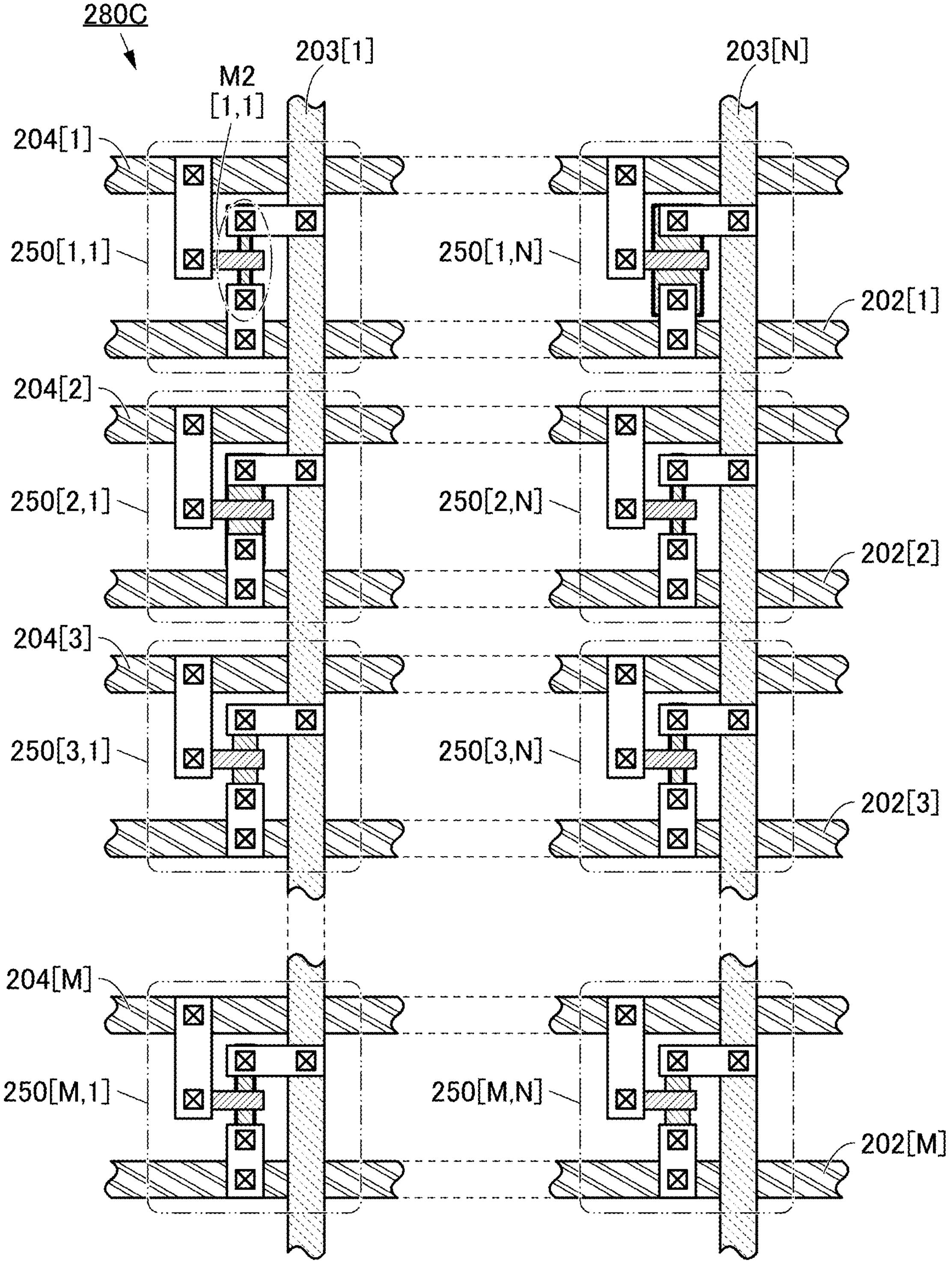
FIG. 14 is a diagram illustrating a planar layout of a product arithmetic array.

As examples, FIG. 13 and FIG. 14 illustrate planar layouts of the product arithmetic array 280C. FIG. 13 illustrates a planar layout in which the channel lengths (the sizes of the conductive layers 222 (see FIG. 9A)) of the plurality of transistors M2 included in the product arithmetic array 280C are varied randomly. FIG. 14 illustrates a planar layout in which the channel widths (the sizes of the semiconductor layers 221 (see FIG. 9A)) of the plurality of transistors M2 included in the product arithmetic array 280C are varied randomly. Note that both the channel lengths and the channel widths may be varied randomly.

As in the semiconductor device 270 described in the above embodiment, the product arithmetic portions 250A in the first row are electrically connected to the sensor portion 240[1] through the wiring 204[1]. The product arithmetic portions 250A in the M-th row are electrically connected to the sensor portion 240[M] through a wiring 204[M]. In FIG. 12, the data u(t) output from the sensor portion 240[M] is denoted as data $u_M(t)$.

FIG. 13 and FIG. 14 each illustrate the state in which gates of the transistors M2 included in the product arithmetic portions 250A in the first row are electrically connected to the wiring 204[1]. The state in which one of a source and a drain of each of the transistors M2 included in the product arithmetic portions 250A in the first row is electrically connected to the wiring 202[1] is also illustrated.

FIG. 13 and FIG. 14 each illustrate the state in which gates of the transistors M2 included in the product arithmetic portions 250A in the M-th row are electrically connected to the wiring 204[M]. The state in which one of a source and a drain of each of the transistors M2 included in the product arithmetic portions 250A in the M-th row is electrically connected to the wiring 202[M] is also illustrated.

FIG. 13 and FIG. 14 each illustrate the state in which the other of the source and the drain of each of the transistors M2 included in the product arithmetic portions 250A in the first column is electrically connected to a wiring 203[1]. The state in which the other of the source and the drain of each of the transistors M2 included in the product arithmetic portions 250A in the N-th column is electrically connected to a wiring 203[N] is also illustrated.

The product arithmetic portions 250A in the first column are electrically connected to the terminal 261*a*[1] of the comparison portion 260[1] through the wiring 203[1]. The product arithmetic portions 250A in the N-th column are electrically connected to the terminal 261*a*[N] of the comparison portion 260[N] through the wiring 203[N] (see FIG. 12).

Current that is the sum of the current I2[1,1] to current I2[M,1] is supplied as the current I3*a*[1] from the comparison portion 260[1] in the first column to the wiring 203[1] through the terminal 261*a*[1]. In addition, reference current Iref is supplied to the terminal 261*b* (the terminal 261*b*[1] to the terminal 261*b*[N]). For example, the reference current Iref flows from the terminal 261*b* toward GND. The reference current Iref corresponds to the current I3*b* described in the above embodiment.

The comparison portion 260[1] supplies, to the terminal 262[1], voltage Vout[1] corresponding to a difference between the current I3*a*[1] and the reference current Iref. The voltage Vout[1] corresponds to a result of product-sum arithmetic of the data $u_1(t)$ to the data $u_M(t)$ and a product arithmetic portion 250A[1,1] to a product arithmetic portion 250A[M,1] in the first column. For example, the product-sum arithmetic result can be positive when the current I3*a*[1] is higher than the reference current Iref and can be negative when the current I3*a*[1] is lower than the reference current Iref.

The current I3*a*[1] may be converted into voltage or digital data without using the comparison portion 260[1]. The current I3*a*[1] may be converted into voltage or digital data and then the voltage or the data may be compared with a reference value to determine whether the product-sum arithmetic result is positive or negative.

Each of the voltage Vout[1] to the voltage Vout[N] corresponds to "$W_{in}$×u(t)" in Formula 1. Moreover, data obtained by converting each of the current I3*a*[1] to current I3*a*[M] into voltage corresponds to "$W_{in}$×u(t)" in Formula 1. Furthermore, digital data obtained by converting each of the current I3*a*[1] to the current I3*a*[N] corresponds to "$W_{in}$×u(t)" in Formula 1.

The power consumption of the semiconductor device increases with increasing current I3*a*. To prevent the current I3*a* from being excessively high, the current I2 is preferably less than or equal to 10 times, further preferably less than or equal to 5 times the current I1.

It is preferable that the amount of the current I2 flowing through the transistor M2 included in the product arithmetic portion 250A be different between at least any three transistors M2 in the same column. The amount of the current I2 in the same column is preferably less than or equal to 0.95 times or greater than or equal to 1.05 times, further preferably less than or equal to 0.7 times or greater than or equal to 1.3 times, still further preferably less than or equal to 0.3 times or greater than or equal to 3 times the average current I2 in the same column.

It is preferable that Vth of the transistor M2 included in the product arithmetic portion 250A be different between at least any three transistors M2 in the same column. The Vth in the same column is preferably less than or equal to 0.9 times and greater than or equal to 1.1 times, further preferably less than or equal to 0.85 times and greater than or equal to 1.15 times, still further preferably less than or equal to 0.8 times and greater than or equal to 1.2 times the average Vth in the same column.

It is preferable that the channel length of the transistor M2 included in the product arithmetic portion 250A be different between at least any three transistors M2 in the same column. The channel length in the same column is preferably less than or equal to 0.9 times and greater than or equal to 1.1 times, further preferably less than or equal to 0.85 times and greater than or equal to 1.15 times, still further preferably less than or equal to 0.8 times and greater than or equal to 1.2 times the average channel length in the same column. Note that as described above, the channel length can be rephrased as the length of the conductive layer 222 in a direction parallel to the direction of drain current flow.

It is preferable that the channel width of the transistor M2 included in the product arithmetic portion 250A be different between at least any three transistors M2 in the same column. The channel width in the same column is preferably less than or equal to 0.9 times and greater than or equal to 1.1 times, further preferably less than or equal to 0.85 times and greater than or equal to 1.15 times, still further preferably less than or equal to 0.8 times and greater than or equal to 1.2 times the average channel width in the same column. As described above, the channel length can be rephrased as the length of the semiconductor layer 221 in a direction that intersects with the direction of drain current flow.

In the plurality of product arithmetic portions 250A included in the product arithmetic array 280C, Vth preferably varies randomly among at least any three transistors M2 in the same column. Note that as long as Vth of the transistor M2 is random at least in the same column or in the product arithmetic array 280C as a whole, Vth of the transistors M2 included in two or more of the plurality of product arithmetic portions 250A may be equal to each other.

Moreover, in the plurality of product arithmetic portions 250A included in the product arithmetic array 280C, the channel length preferably varies randomly among at least any three transistors M2 in the same column. Note that as long as the channel length of the transistor M2 is random at least in the same column or in the product arithmetic array 280C as a whole, the channel lengths of the transistors M2 included in two or more of the plurality of product arithmetic portions 250A may be equal to each other.

Furthermore, in the plurality of product arithmetic portions 250A included in the product arithmetic array 280C, the channel width preferably varies randomly among at least any three transistors M2 in the same column. Note that as long as the channel width of the transistor M2 is random at least in the same column or in the product arithmetic array 280C as a whole, the channel widths of the transistors M2 included in two or more of the plurality of product arithmetic portions 250A may be equal to each other.

The number of transistors used in the product arithmetic portion in the semiconductor device 270A of one embodiment of the present invention can be reduced. Accordingly, the power consumed in product arithmetic can be reduced. Moreover, the area occupied by the product arithmetic portion is reduced. Thus, the packaging density of the product arithmetic portion can be increased.

The structure described in this embodiment can be used in an appropriate combination with the structures described in the other embodiments.

Embodiment 5

Figure 15A:
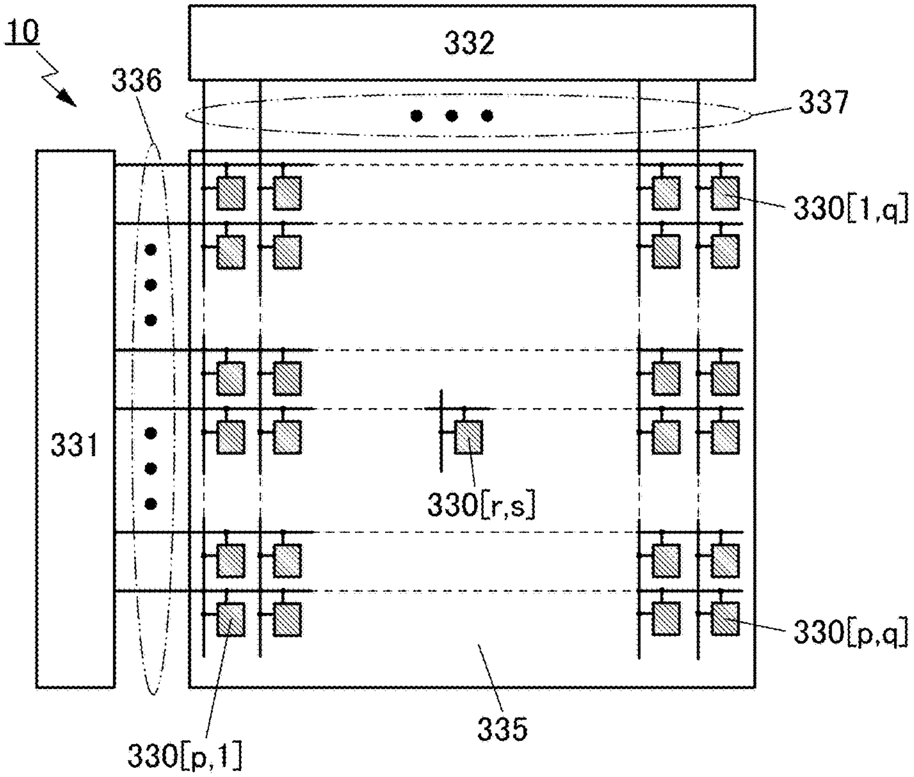
FIG. 15A is a diagram illustrating a display apparatus.
Figure 15A:
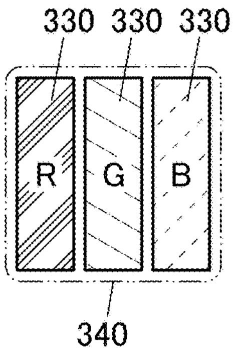
Figure 15A:
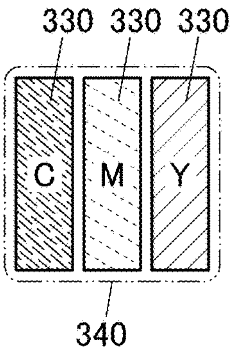
Figure 15A:
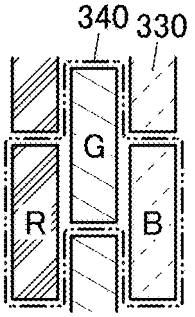
Figure 15A:
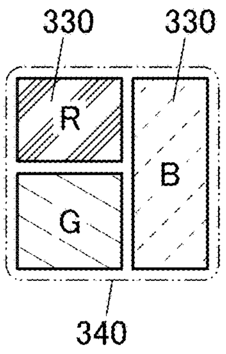
Figure 15A:
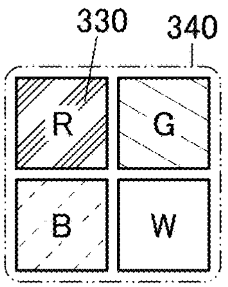
Figure 15A:
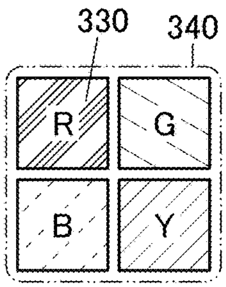
Figure 15A:
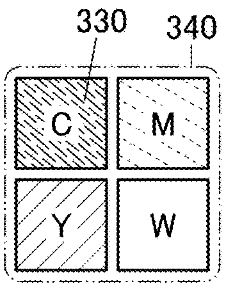

In this embodiment, structure examples of a display apparatus 10 in which the semiconductor device of one embodiment of the present invention can be used will be described. FIG. 15A is a block diagram illustrating the display apparatus 10. The display apparatus 10 includes a display region 335, a first driver circuit portion 331, and a second driver circuit portion 332. The display region 335 includes a plurality of pixels 330 arranged in a matrix.

A circuit included in the first driver circuit portion 331 functions as, for example, a scan line driver circuit. A circuit included in the second driver circuit portion 332 functions as, for example, a signal line driver circuit. Some sort of circuit may be provided to face the first driver circuit portion 331 with the display region 335 positioned therebetween. Some sort of circuit may be provided to face the second driver circuit portion 332 with the display region 335 positioned therebetween. Note that the circuits included in the first driver circuit portion 331 and the second driver circuit portion 332 are collectively referred to as a "peripheral driver circuit" in some cases.

Any of various circuits such as a shift register, a level shifter, an inverter, a latch, an analog switch, and a logic circuit can be used as the peripheral driver circuit. In the peripheral driver circuit, a transistor, a capacitor, and the like can be used. Transistors included in the peripheral driver circuit may be formed in the same steps as the transistors included in the pixels 330.

For example, a transistor using an oxide semiconductor as a semiconductor where a channel is formed (also referred to as an "OS transistor") may be used as the transistors included in the pixels 330, and a transistor using silicon as a semiconductor where a channel is formed (also referred to as a "silicon transistor") may be used as the transistors included in the peripheral driver circuit. The off-state current of the OS transistor is low, so that power consumption can be reduced. Since the Si transistor has a higher operation speed than the OS transistor, the Si transistor is suitably used in the peripheral driver circuit. The display apparatus may include the OS transistors as both the transistors included in the pixels 330 and the transistors included in the peripheral driver circuit and the peripheral driver circuit. The display apparatus may include the Si transistors as both the transistors included in the pixels 330 and the transistors included in the peripheral driver circuit and the peripheral driver circuit. Alternatively, the display apparatus may include the Si transistors as the transistors included in the pixels 330 and the OS transistors as the transistors included in the peripheral driver circuit.

Both the Si transistor and the OS transistor may be used as the transistors included in the pixels 330. Both the Si transistor and the OS transistor may be used as the transistors included in the peripheral driver circuit.

Examples of a material used for the Si transistor include single crystal silicon, polycrystalline silicon, and amorphous silicon. In particular, a transistor containing low-temperature polysilicon (LTPS) in its semiconductor layer (hereinafter, also referred to as an "LTPS transistor") can be used. The LTPS transistor has high field-effect mobility and favorable frequency characteristics.

With the use of the Si transistors such as LTPS transistors, a circuit required to be driven at a high frequency (e.g., a source driver circuit) can be formed on the same substrate as the display portion. Thus, external circuits mounted on the display apparatus can be simplified, and component costs and mounting costs can be reduced.

The OS transistor has extremely higher field-effect mobility than a transistor containing amorphous silicon. The OS transistor has a significantly low off-state current and enables electric charge stored in a capacitor that is series-connected to the transistor to be retained for a long time. Furthermore, the use of the OS transistor can reduce power consumption of the display apparatus.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

The display apparatus 10 includes p (p is an integer greater than or equal to 2) wirings 336 which are arranged substantially parallel to each other and whose potentials are controlled by the circuit included in the first driver circuit portion 331 and q (q is an integer greater than or equal to 2) wirings 337 which are arranged substantially parallel to each other and whose potentials are controlled by the circuit included in the second driver circuit portion 332.

FIG. 15A illustrates an example in which a wiring 336 and a wiring 337 are connected to the pixel 330. Note that the wiring 336 and the wiring 337 are examples, and the wirings connected to the pixel 330 are not limited to the wiring 336 and the wiring 337.

The display region 335 includes a plurality of pixels 330 arranged in a matrix of p rows and q columns. For example, the pixels 330 arranged in the r-th row (r represents a given number and is an integer greater than or equal to 1 and less than or equal to p in this embodiment and the like) are electrically connected to the first driver circuit portion 331 through the r-th wiring 336. The pixels 330 arranged in the s-th column (s represents a given number and is an integer greater than or equal to 1 and less than or equal to q in this embodiment and the like) are electrically connected to the second driver circuit portion 332 through the s-th wiring 337.

In FIG. 15A, the pixel 330 positioned in the first row and the q-th column is denoted as a pixel 330[1,*q*], the pixel 330 positioned in the p-th row and the first column is noted as a pixel 330[*p*,1], and the pixel 330 positioned in the p-th row and the q-th column is denoted as a pixel 330[*p*,*q*]. The pixel 330 positioned in the r-th row and the s-th column is denoted as a pixel 330[*r*,*s*].

Full-color display can be achieved by making the pixel 330 that controls red light, the pixel 330 that controls green light, and the pixel 330 that controls blue light, which are arranged in a stripe pattern, collectively function as one pixel 340 and by controlling the amount of light emission (emission luminance) from each of the pixels 330. Thus, each of the three pixels 330 functions as a subpixel. That is, three subpixels control the emission amount or the like of red light, green light, and blue light (see FIG. 15B1). Note that the colors of light controlled by the three subpixels are not limited to a combination of red (R), green (G), and blue (B) and may be cyan (C), magenta (M), and yellow (Y) (see FIG. 15B2).

Alternatively, three pixels 330 constituting one pixel 340 may be arranged in a delta pattern (see FIG. 15B3). Specifically, three pixels 330 constituting one pixel 340 may be arranged such that a line connecting the center points of the three pixels 330 forms a triangle.

The three subpixels (pixels 330) do not necessarily have the same area. In the case where the emission efficiency, reliability, and the like vary depending on emission colors, the subpixel area may be changed depending on the emission color (see FIG. 15B4). Note that the arrangement of the subpixels illustrated in FIG. 15B4 may be called "S stripe arrangement".

Four subpixels may collectively function as one pixel. For example, a subpixel that controls white light may be added to the three subpixels that control red light, green light, and blue light (see FIG. 15B5). The addition of the subpixel that controls white light can increase the luminance of a display region. Alternatively, a subpixel that controls yellow light may be added to the three subpixels that control red light, green light, and blue light (see FIG. 15B6). Further alternatively, a subpixel that controls white light may be added to the three subpixels that control cyan light, magenta light, and yellow light (see FIG. 15B7).

When the number of subpixels functioning as one pixel is increased and subpixels that control light of red, green, blue, cyan, magenta, yellow, and the like are used in an appropriate combination, the reproducibility of halftones can be increased. Thus, display quality can be improved.

Figure 16A:
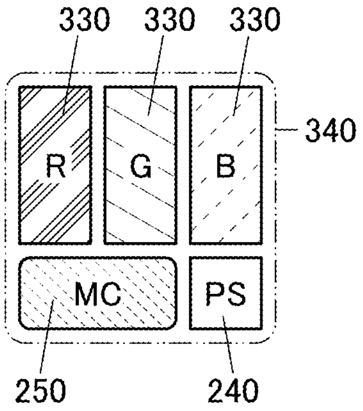
FIG. 16A to FIG. 16D are diagrams illustrating structure examples of pixels.
Figure 16B:
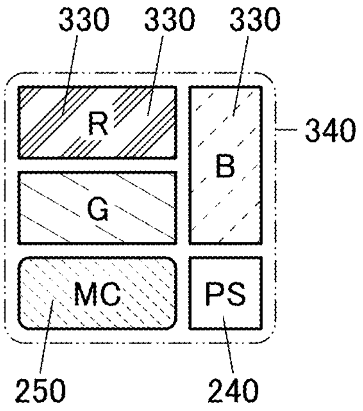

As illustrated in FIG. 16A and FIG. 16B, the pixel 340 may include the sensor portion 240 and the product arithmetic portion 250. FIG. 16A is a variation example of the pixel 340 illustrated in FIG. 15B1, and FIG. 16B is a variation example of the pixel 340 illustrated in FIG. 15B4. In FIG. 16, the sensor portion 240 is marked with "PS", and the product arithmetic portion 250 is marked with "MC".

Figure 16C:
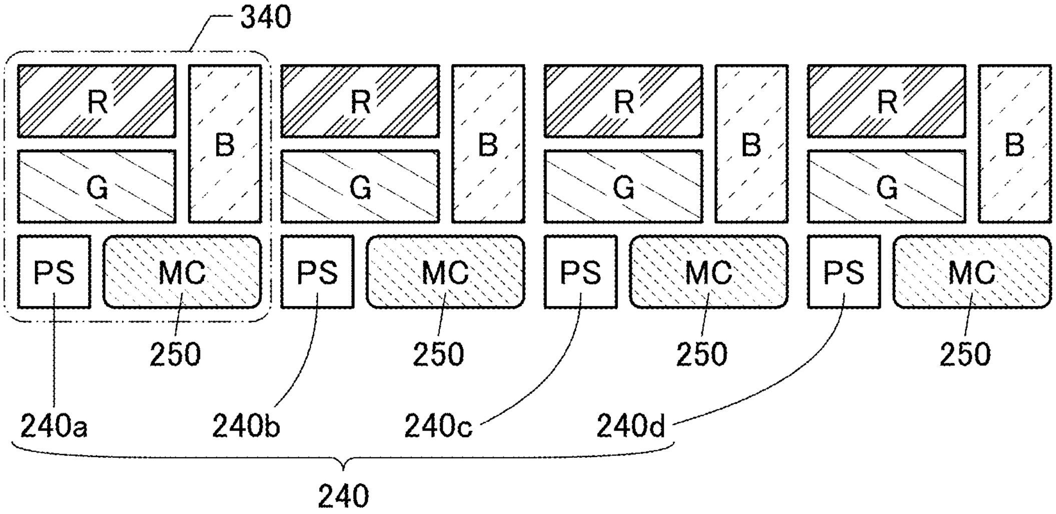

The sensor portions 240 included in the plurality of pixels 340 are connected in parallel, whereby detection sensitivity of the sensor portions 240 can be increased. For example, the sensor portions 240, which include photodiodes, are connected in parallel, whereby light detection sensitivity can be increased. As illustrated in FIG. 16C, for example, a sensor portion 240*a*, a sensor portion 240*b*, a sensor portion 240*c*, and a sensor portion 240*d* may be connected in parallel to function as one sensor portion 240.

Figure 16D:
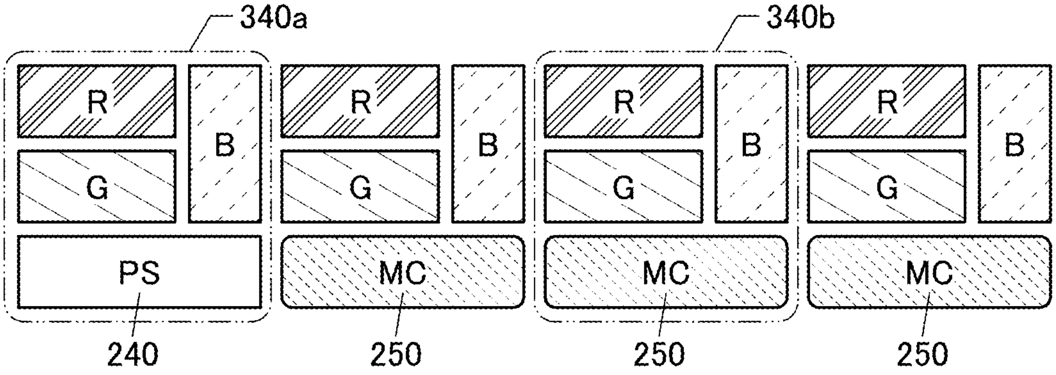

As illustrated in FIG. 16D, a pixel 340*a* including the sensor portion 240 and a pixel 340*b* including the product arithmetic portion 250 may be provided. FIG. 16D illustrates, as an example, one pixel 340*a* and three pixels 340*b*.

The display apparatus of one embodiment of the present invention can reproduce the color gamut of various standards. For example, the display apparatus of one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display apparatuses used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

Using the pixels 340 arranged in a matrix of 1920×1080, the display apparatus 10 that can perform full-color display with a resolution of what is called full high definition (also referred to as "2K resolution", "2K1K", "2K", or the like) can be obtained. For example, using the pixels 340 arranged in a matrix of 3840×2160, the display apparatus 10 that can perform full-color display with a resolution of what is called ultra-high definition (also referred to as "4K resolution", "4K2K", "4K", or the like) can be obtained. For example, using the pixels 340 arranged in a matrix of 7680×4320, the display apparatus 10 that can perform full-color display with a resolution of what is called super high definition (also referred to as "8K resolution", "8K4K", "8K", or the like) can be obtained. By increasing the number of pixels 340, the display apparatus 10 that can perform full-color display with 16K or 32K resolution can also be obtained.

The pixel density of the display region 335 is preferably higher than or equal to 100 ppi and lower than or equal to 10000 ppi, further preferably higher than or equal to 1000 ppi and lower than or equal to 10000 ppi. For example, the pixel density may be higher than or equal to 2000 ppi and lower than or equal to 6000 ppi, or higher than or equal to 3000 ppi and lower than or equal to 5000 ppi.

Note that there is no particular limitation on the aspect ratio of the display region 335. For example, the display region 335 of the display apparatus 10 is compatible with a variety of aspect ratios such as 1:1 (square), 4:3, 16:9, and 16:10.

The diagonal size of the display region 335 is at least greater than or equal to 0.1 inches and less than or equal to 100 inches and may be greater than or equal to 100 inches.

In the case where the display apparatus 10 is used as a display apparatus for virtual reality (VR) or augmented reality (AR), the diagonal size of the display region 335 can be greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the diagonal size of the display region 335 may be 1.5 inches or approximately 1.5 inches. When the diagonal size of the display region 335 is less than or equal to 2.0 inches, preferably around 1.5 inches, the number of times of light exposure treatment using a light exposure apparatus (typified by a scanner apparatus) can be one; thus, the productivity of a manufacturing process can be improved.

The refresh rate of the display region 335 included in the semiconductor device of one embodiment of the present invention can be variable. For example, the refresh rate is adjusted (in the range from 0.01 Hz to 240 Hz, for example) in accordance with contents displayed on the display region 335, whereby power consumption can be reduced. Moreover, driving with a lowered refresh rate that reduces the power consumption of the display region 335 may be referred to as idling stop (IDS) driving.

A touch sensor or a near-touch sensor may be provided in the display region 335. The driving frequency of the touch sensor or the near-touch sensor may be changed in accordance with the refresh rate. In the case where the refresh rate of the display apparatus is 120 Hz, for example, the driving frequency of the touch sensor or the near touch sensor can be higher than 120 Hz (typically 240 Hz). This structure can achieve low power consumption and can increase the response speed of a touch sensor or a near-touch sensor.

Here, a touch sensor or a non-contact sensor has a function of sensing the approach or contact of an object (e.g., a finger, a hand, or a pen). The touch sensor can detect the object when the object come in direct contact with the sensor. Furthermore, the non-contact sensor can detect the object even when the object does not come in direct contact with the sensor. For example, the sensor is preferably capable of detecting an object when the distance between the semiconductor device (or the display region 335) and the object is greater than or equal to 0.1 mm and less than or equal to 300 mm, preferably greater than or equal to 3 mm and less than or equal to 50 mm. This structure enables the semiconductor device to be operated without direct contact of an object; in other words, the semiconductor device can be operated in a non-contact (touchless) manner. With the above-described structure, the semiconductor device can have a reduced risk of being dirty or damaged, or can be controlled without the object directly touching a dirt (e.g., dust or a virus) attached to the semiconductor device.

Note that the contactless sensor function can also be referred to as a hover sensor function, a hover touch sensor function, a near-touch sensor function, a touchless sensor function, or the like. The touch sensor function can also be referred to as a direct touch sensor function or the like.

<Circuit Structure Example of Pixel 330>

Figure 17A:
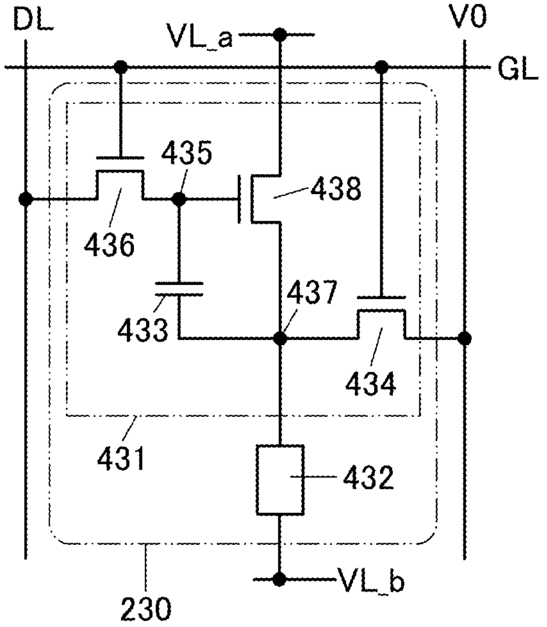
FIG. 17A to FIG. 17D are diagrams illustrating circuit structure examples of pixels.

FIG. 17A is a diagram illustrating a circuit structure example of the pixel 330. The pixel 330 includes a pixel circuit 431 and a display element 432.

Accordingly, each of the wirings 336 is electrically connected to q pixel circuits 431 arranged in a given row among the pixel circuits 431 arranged in p rows and q columns in the display region 335. Each of the wirings 337 is electrically connected to p pixel circuits 431 arranged in a given column among the pixel circuits 431 arranged in p rows and q columns. The pixel circuit 431 includes a transistor 436, a capacitor 433, a transistor 438, and a transistor 434. The pixel circuit 431 is electrically connected to the display element 432.

One of a source electrode and a drain electrode of the transistor 436 is electrically connected to a wiring to which a data signal (also referred to as a "video signal") is supplied (hereinafter referred to as a signal line DL). A gate electrode of the transistor 436 is electrically connected to a wiring to which a gate signal is supplied (hereinafter referred to as a scan line GL). The signal line DL and the scan line GL correspond to the wiring 337 and the wiring 336, respectively. The transistor 436 has a function of controlling writing of the data signal to a node 435.

One of a pair of electrodes of the capacitor 433 is electrically connected to the node 435, and the other is electrically connected to a node 437. The other of the source electrode and the drain electrode of the transistor 436 is electrically connected to the node 435.

The capacitor 433 functions as a storage capacitor for retaining data written to the node 435.

One of a source electrode and a drain electrode of the transistor 438 is electrically connected to a potential supply line VL_a, and the other is electrically connected to the node 437. A gate electrode of the transistor 438 is electrically connected to the node 435.

One of a source electrode and a drain electrode of the transistor 434 is electrically connected to a potential supply line VO, and the other is electrically connected to the node 437. A gate electrode of the transistor 434 is electrically connected to the scan line GL.

One of an anode and a cathode of the display element 432 is electrically connected to a potential supply line VL_b, and the other is electrically connected to the node 437.

As the display element 432, a light-emitting element (also referred to as a "light-emitting device") such as an organic electroluminescent element (also referred to as an "organic EL element") can be used, for example. Note that the display element 432 is not limited thereto; an inorganic EL element formed of an inorganic material may be used, for example. Note that an "organic EL element" and an "inorganic EL element" are collectively referred to as an "EL element" in some cases.

The emission color of the EL element can be white, red, green, blue, cyan, magenta, yellow, or the like depending on the material contained in the EL element.

Examples of a method for achieving color display include a method in which the display element 432 whose emission color is white is combined with a coloring layer and a method in which the display elements 432 with different emission colors are provided in the respective pixels. The former method is more productive than the latter method. By contrast, the latter method, which requires separate formation of the display element 432 pixel by pixel, is less productive than the former method. However, the latter method can provide higher color purity of the emission color than the former method. In the latter method, the color purity can be further increased when the display element 432 has a microcavity structure.

Either a low molecular compound or a high molecular compound can be used for the display element 432, and an inorganic compound may also be contained. The layers included in the display element 432 can each be formed by a method such as an evaporation method (including a vacuum evaporation method), a transfer method, a printing method, an inkjet method, a coating method, or the like.

The display element 432 may contain an inorganic compound such as quantum dots. For example, when used for the light-emitting layer, the quantum dots can function as a light-emitting material.

A high power supply potential Vdd is supplied to one of the potential supply line VL_a and the potential supply line VL_b, and a low power supply potential Vss is supplied to the other, for example.

In the display apparatus including the pixel circuit 431, the pixel circuits 431 are sequentially selected row by row by the circuit included in the peripheral driver circuit, whereby the transistors 436 and the transistors 434 are turned on and a data signal is written to the nodes 435.

When the transistors 436 and the transistors 434 are turned off, the pixel circuits 431 in which the data has been written to the nodes 435 are brought into a retention state. Furthermore, the amount of current flowing between the source electrode and the drain electrode of the transistor 438 is controlled in accordance with the potential of the data written to the node 435, and the display element 432 emits light with a luminance corresponding to the amount of current. This operation is sequentially performed row by row; thus, an image can be displayed. The transistor 438 is also referred to as a "driving transistor".

To increase the emission luminance of the light-emitting device included in the pixel 330, the amount of current fed through the light-emitting device needs to be increased. For this, it is necessary to increase the source-drain voltage of a driving transistor included in the pixel circuit 431. Since an OS transistor has a higher withstand voltage between the source and the drain than a Si transistor, a high voltage can be applied between the source and the drain of the OS transistor. Accordingly, when an OS transistor is used as the driving transistor in the pixel circuit 431, the amount of current flowing through the light-emitting device can be increased, so that the emission luminance of the light-emitting device can be increased.

When transistors operate in a saturation region, a change in source-drain current relative to a change in gate-source voltage is smaller in an OS transistor than in a Si transistor. Accordingly, when an OS transistor is used as the driving transistor in the pixel circuit 431, the amount of current flowing between the source and the drain can be set minutely by a change in gate-source voltage; hence, the amount of current flowing through the light-emitting device can be controlled minutely. Consequently, the number of gray levels in the pixel 330 can be increased.

Regarding saturation characteristics of current flowing when the transistor operates in a saturation region, the OS transistor can make current (saturation current) flow more stably than the Si transistor even when the source-drain voltage gradually increases. Thus, by using an OS transistor as the driving transistor, a stable current can be fed through a light-emitting device that contains an EL material even when the current-voltage characteristics of the light-emitting device vary, for example. In other words, when the OS transistor operates in the saturation region, the source-drain current hardly changes with an increase in the source-drain voltage; hence, the emission luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

Figure 17B:
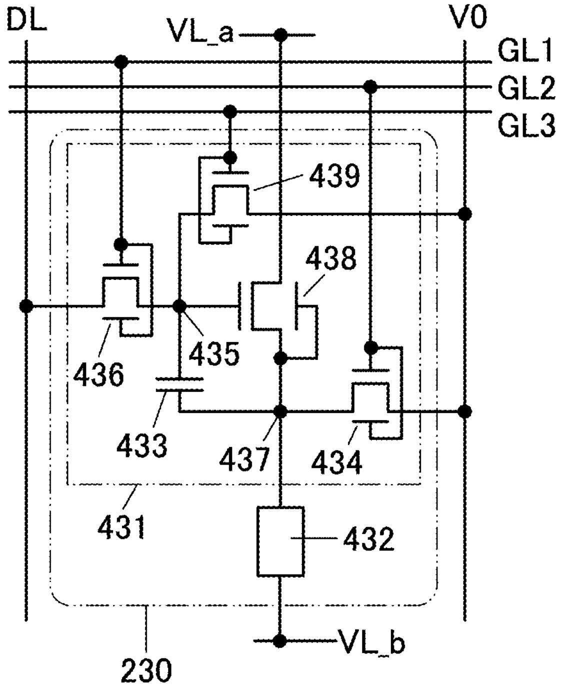

FIG. 17B illustrates a variation example of the circuit structure of the pixel 330 illustrated in FIG. 17A. In a circuit structure illustrated in FIG. 17B, a gate electrode of the transistor 436 is electrically connected to a line to which a first scan signal is supplied (hereinafter, referred to as a scan line GL1). A gate electrode of the transistor 434 is electrically connected to a line to which a second scan signal is supplied (hereinafter, referred to as a scan line GL2).

The circuit structure illustrated in FIG. 17B includes a transistor 439 in addition to the components in the circuit structure illustrated in FIG. 17A. One of a source electrode and a drain electrode of the transistor 439 is electrically connected to a potential supply line VO, and the other is electrically connected to the node 435. A gate electrode of the transistor 439 is electrically connected to a line to which a third scan signal is supplied (hereinafter, referred to as a scan line GL3).

The scan line GL1 corresponds to the wiring 336 illustrated in FIG. 15A. Although wirings corresponding to the scan line GL2 and the scan line GL3 are not illustrated in FIG. 15A, the scan line GL2 and the scan line GL3 are electrically connected to the first driver circuit portion 331.

For example, in the case where the pixel 330 performs black display, both the transistor 434 and the transistor 439 are turned on. This makes the potentials of the source electrode and the gate electrode of the transistor 438 equal to each other. Thus, the gate voltage of the transistor 438 becomes 0 V, so that current flowing through the display element 432 can be blocked.

Some or all of the transistors included in the pixel circuit 431 may be transistors including backgates. Transistors including backgates are used as the transistors in the circuit structure illustrated in FIG. 17B. An example is illustrated in which the gate and the backgate of each of the transistor 434, the transistor 436, and the transistor 439 are electrically connected to each other. In the example illustrated in FIG. 17B, the backgate of the transistor 438 is electrically connected to the node 437.

Figure 17C:
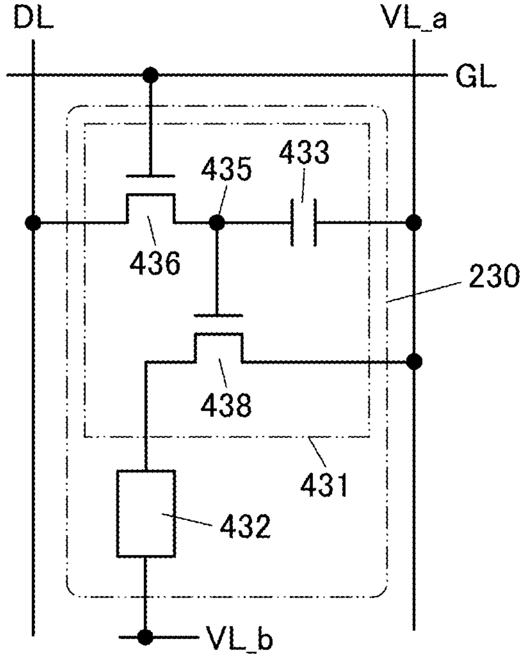

FIG. 17C illustrates a variation example of the circuit structure of the pixel 330 illustrated in FIG. 17A. The circuit illustrated in FIG. 17C has a structure where the transistor 434 and the potential supply line VO are eliminated from the circuit structure illustrated in FIG. 17A. The other structures can be understood by referring to the description of the circuit structure illustrated in FIG. 17A. To avoid repeated description, detailed description of the circuit structure illustrated in FIG. 17C is omitted.

Figure 17D:
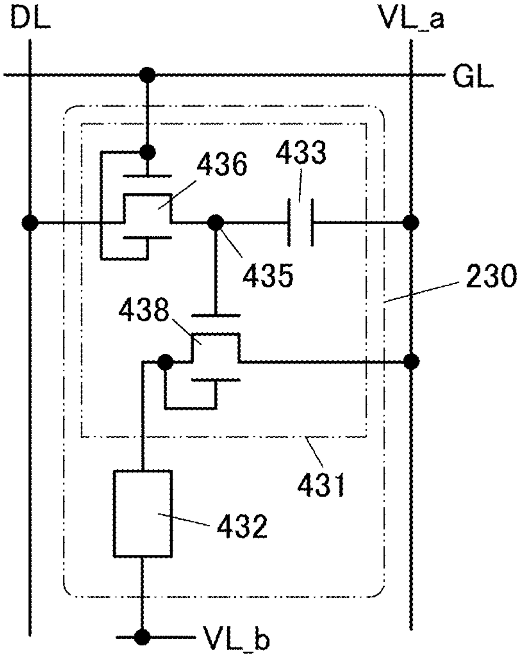

As described above, Some or all of the transistors included in the pixel circuit 431 may be transistors including backgates. For example, as illustrated in FIG. 17D, a transistor including a backgate may be used as the transistor 436 and the backgate and the gate may be electrically connected to each other. Moreover, like the transistor 438 illustrated in FIG. 17D, the backgate and one of the source and the drain of the transistor may be electrically connected to each other.

<Structure Example of Light-Emitting Element>

A light-emitting element that can be used in the semiconductor device of one embodiment of the present invention will be described. A light-emitting element 61 can be used as the display element 432.

<Structure Example of Light-Emitting Element>

Figure 18A:
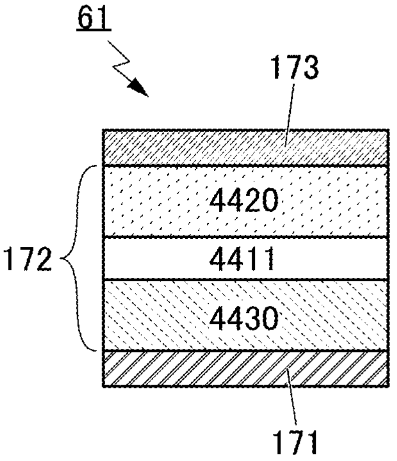
FIG. 18A to FIG. 18D are diagrams illustrating structure examples of light-emitting elements.

As illustrated in FIG. 18A, the light-emitting element 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 18A is referred to as a single structure in this specification and the like.

Figure 18B:
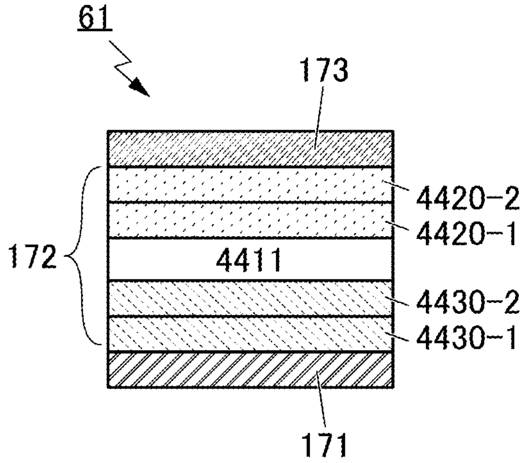

FIG. 18B illustrates a variation example of the EL layer 172 included in the light-emitting element 61 illustrated in FIG. 18A. Specifically, the light-emitting element 61 illustrated in FIG. 18B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. In the case where the conductive layer 171 is an anode and the conductive layer 173 is a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the conductive layer 171 is a cathode and the conductive layer 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Figure 18C:
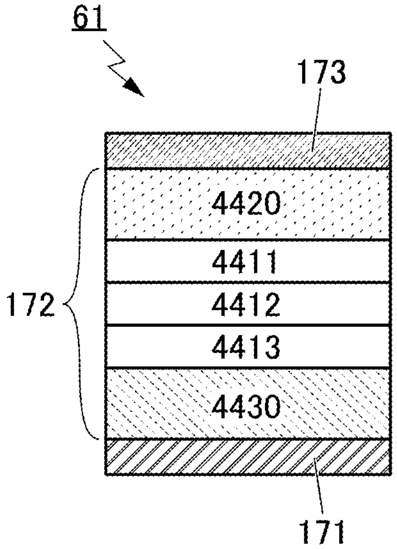

Note that the structure in which a plurality of light-emitting layers (the light-emitting layer 4411, a light-emitting layer 4412, and a light-emitting layer 4413) are provided between the layer 4420 and the layer 4430 as illustrated in FIG. 18C is also an example of the single structure.

Figure 18D:
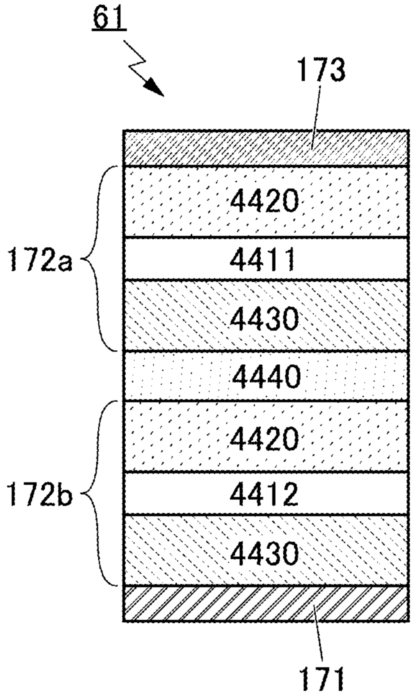

The structure in which a plurality of light-emitting units (an EL layer 172*a* and an EL layer 172*b*) are connected in series with an intermediate layer (charge-generation layer) 4440 therebetween as illustrated in FIG. 18D is referred to as a tandem structure or a stack structure in this specification and the like. The tandem structure enables a light-emitting element capable of high luminance light emission.

In the case where the light-emitting element 61 has the tandem structure illustrated in FIG. 18D, the EL layer 172*a* and the EL layer 172*b* may emit light of the same color. For example, the EL layer 172*a* and the EL layer 172*b* may both emit green light. Note that in the case where the pixel 340 includes three subpixels of R, G, and B and the subpixels each include a light-emitting element, the light-emitting element of each subpixel may have a tandem structure. Specifically, the EL layer 172*a* and the EL layer 172*b* in the subpixel of R each contain a material capable of emitting red light, the EL layer 172*a* and the EL layer 172*b* in the subpixel of G each contain a material capable of emitting green light, and the EL layer 172*a* and the EL layer 172*b* in the subpixel of B each contain a material capable of emitting blue light. In other words, the light-emitting layer 4411 and the light-emitting layer 4412 may contain the same material. When the EL layer 172*a* and the EL layer 172*b* emit light of the same color, the current density per unit emission luminance can be reduced. Thus, the reliability of the light-emitting element 61 can be increased.

The emission color of the light-emitting element can be red, green, blue, cyan, magenta, yellow, white, or the like depending on the material that constitutes the EL layer 172. Furthermore, the color purity can be further increased when the light-emitting element has a microcavity structure.

The light-emitting layer may contain two or more light-emitting substances that emit light of red (R), green (G), blue (B), yellow (Y), orange (O), or the like. The light-emitting element that emits white light preferably contains two or more kinds of light-emitting substances in the light-emitting layer. To obtain white light emission, two or more light-emitting substances are selected such that their emission colors are complementary colors. For example, when the emission color of a first light-emitting layer and the emission color of a second light-emitting layer have a relationship of complementary colors, it is possible to obtain a light-emitting element which emits white light as a whole. The same applies to a light-emitting element including three or more light-emitting layers.

The light-emitting layer preferably contains two or more light-emitting substances that emit light of R (red), G (green), B (blue), Y (yellow), O (orange), or the like. Alternatively, the light-emitting layer preferably contains two or more light-emitting substances that emit light containing two or more of spectral components of R, G, and B.

Examples of a light-emitting substance include a substance that emits fluorescent light (a fluorescent material), a substance that emits phosphorescent light (a phosphorescent material), an inorganic compound (a quantum dot material and the like), and a substance that exhibits thermally activated delayed fluorescence (a thermally activated delayed fluorescence (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting element in a high-luminance region can be inhibited.

<Formation Method of Light-Emitting Element>

A formation method of the light-emitting element 61 that can be used as the display element 432 will be described below.

Figure 19A:
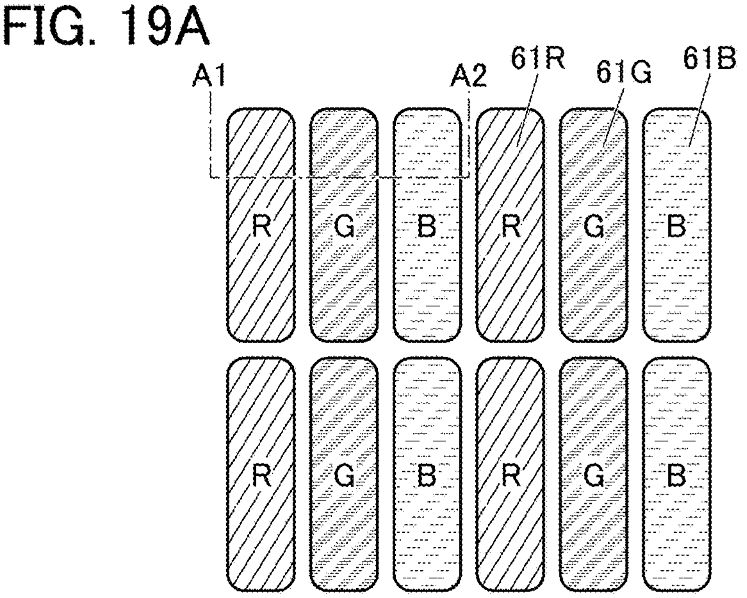
FIG. 19A to FIG. 19D are diagrams illustrating structure examples of light-emitting elements.

FIG. 19A illustrates a schematic top view of the light-emitting element 61. The light-emitting element 61 includes a plurality of light-emitting elements 61R exhibiting red, a plurality of light-emitting elements 61G exhibiting green, and a plurality of light-emitting elements 61B exhibiting blue. In FIG. 19A, light-emitting regions of the light-emitting elements are marked with R, G, and B to easily differentiate the light-emitting elements. Note that the structure of the light-emitting element 61 illustrated in FIG. 19A may be referred to as an SBS (Side By Side) structure. Although the structure illustrated in FIG. 19A has three colors of red (R), green (G), and blue (B), one embodiment of the present invention is not limited thereto. For example, the structure may have four or more colors.

The light-emitting elements 61R, the light-emitting elements 61G, and the light-emitting elements 61B are arranged in a matrix. FIG. 19A illustrates what is called a stripe arrangement, in which the light-emitting elements of the same color are arranged in one direction. Note that the arrangement method of the light-emitting elements is not limited thereto; another arrangement method such as a delta arrangement or a zigzag arrangement may be used or a PenTile arrangement may also be used.

As the light-emitting element 61R, the light-emitting element 61G, and the light-emitting element 61B, an organic EL device such as an OLED (Organic Light Emitting Diode) or a QOLED (Quantum-dot Organic Light Emitting Diode) is preferably used. As a light-emitting substance contained in the EL element, a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescent (TADF) material) can be given, for example.

Figure 19B:
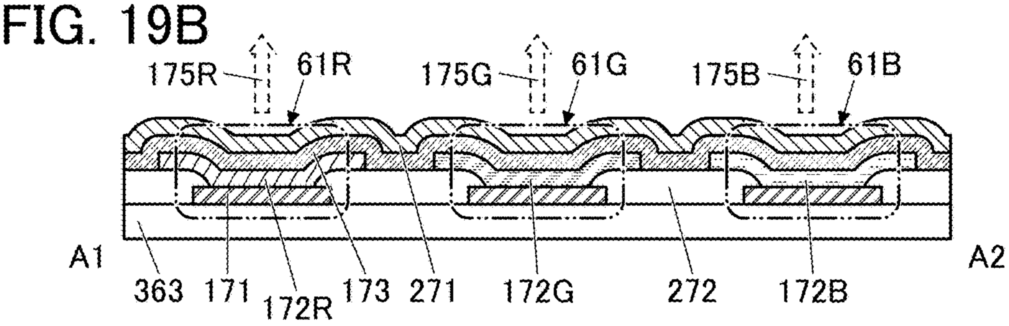

FIG. 19B is a cross-sectional schematic view taken along dashed-dotted line A1-A2 in FIG. 19A. FIG. 19B illustrates cross sections of the light-emitting element 61R, the light-emitting element 61G, and the light-emitting element 61B. The light-emitting element 61R, the light-emitting element 61G, and the light-emitting element 61B are each provided over an insulating layer 363 and include the conductive layer 171 functioning as a pixel electrode and the conductive layer 173 functioning as a common electrode. For the insulating layer 363, one or both of an inorganic insulating film and an organic insulating film can be used. An inorganic insulating film is preferably used as the insulating layer 363. Examples of the inorganic insulating film include an oxide insulating film and a nitride insulating film such as a silicon oxide film, a silicon oxynitride film, a silicon nitride oxide film, a silicon nitride film, an aluminum oxide film, an aluminum oxynitride film, and a hafnium oxide film.

The light-emitting elements 61R each include an EL layer 172R between the conductive layer 171 functioning as a pixel electrode and the conductive layer 173 functioning as a common electrode. The EL layer 172R contains at least a light-emitting organic compound that emits light with an intensity in a red wavelength range. An EL layer 172G included in the light-emitting element 61G contains at least a light-emitting organic compound that emits light with an intensity in a green wavelength range. An EL layer 172B included in the light-emitting element 61B contains at least a light-emitting organic compound that emits light with an intensity in a blue wavelength range.

The EL layer 172R, the EL layer 172G, and the EL layer 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided in each of the light-emitting elements. The conductive layer 173 functioning as a common electrode is provided as a continuous layer shared by the light-emitting elements. A conductive film that has a property of transmitting visible light is used for either the conductive layer 171 functioning as a pixel electrode or the conductive layer 173 functioning as a common electrode, and conductive film that has a reflective property is used for the other. When the conductive layer 171 functioning as a pixel electrode has a light-transmitting property and the conductive layer 173 functioning as a common electrode has a reflective property, a bottom-emission display apparatus can be obtained, whereas when the conductive layer 171 functioning as a pixel electrode has a reflective property and the conductive layer 173 functioning as a common electrode has a light-transmitting property, a top-emission display apparatus can be obtained. Note that when both the conductive layer 171 functioning as a pixel electrode and the conductive layer 173 functioning as a common electrode have a light-transmitting property, a dual-emission display apparatus can be obtained.

For example, in the case where the light-emitting element 61R has a top-emission structure, light 175R is emitted from the light-emitting element 61R to the conductive layer 173 side. In the case where the light-emitting element 61R has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

An insulating layer 272 is provided to cover end portions of the conductive layer 171 functioning as a pixel electrode. End portions of the insulating layer 272 are preferably tapered. For the insulating layer 272, a material similar to the material that can be used for the insulating layer 363 can be used.

The insulating layer 272 is provided to prevent an unintentional electric short-circuit between adjacent light-emitting elements 61 and unintended light emission therefrom. The insulating layer 272 also has a function of preventing the contact of a metal mask with the conductive layer 171 in the case where the metal mask is used to form the EL layer 172.

The EL layer 172R, the EL layer 172G, and the EL layer 172B each include a region in contact with a top surface of the conductive layer 171 functioning as a pixel electrode and a region in contact with a surface of the insulating layer 272. End portions of the EL layer 172R, the EL layer 172G, and the EL layer 172B are positioned over the insulating layer 272.

As illustrated in FIG. 19B, there is a gap between the two EL layers of the light-emitting elements with different colors. In this manner, the EL layer 172R, the EL layer 172G, and the EL layer 172B are preferably provided so as not to be in contact with each other. This suitably prevents unintentional light emission (also referred to as crosstalk) from being caused by current flowing through two adjacent EL layers. As a result, the contrast can be increased to achieve a display apparatus with high display quality.

The EL layer 172R, the EL layer 172G, and the EL layer 172B can be formed separately by a vacuum evaporation method or the like using a shadow mask such as a metal mask. Alternatively, these layers may be formed separately by a photolithography method. The use of a photolithography method achieves a display apparatus with high resolution, which is difficult to obtain in the case of using a metal mask.

In this specification and the like, a device manufactured using an MM (metal mask) may be referred to as a device having an MM (metal mask) structure. In addition, in this specification and the like, a device manufactured using an FMM (fine metal mask or high-resolution metal mask) may be referred to as a device having an FMM structure. Note that the device having an FMM structure may be included in the device having an MM structure. In this specification and the like, a device manufactured without using an MM or an FMM may be referred to as a device having an MML (metal maskless) structure. A display apparatus having an MML structure is formed without using an MM and thus has higher flexibility in designing the pixel arrangement, the pixel shape, and the like than a display apparatus having an FMM structure or an MM structure.

Note that in the method for manufacturing a display apparatus having an MML structure, an island-shaped EL layer is formed not by patterning with the use of a metal mask but by processing after formation of an EL layer over an entire surface. Accordingly, a high-definition display apparatus or a display apparatus with a high aperture ratio, which has been difficult to achieve, can be manufactured. Moreover, EL layers can be formed separately for the respective colors, enabling the display apparatus to perform extremely clear display with high contrast and high display quality. In addition, a sacrificial layer provided over an EL layer can reduce damage to the EL layer in the manufacturing process of the display apparatus, increasing the reliability of the light-emitting device.

In the case where a display apparatus is a device having a fine metal mask (FMM) structure, the pixel arrangement structure or the like is limited in some cases. Here, the FMM structure will be described below.

To manufacture the FMM structure, a metal mask provided with an opening portion (also referred to as an FMM) is set to be opposed to a substrate so that an EL material can be deposited to a desired region at the time of EL evaporation. Then, the EL material is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM. Therefore, the weight and strength of the FMM are important parameters.

Therefore, a pixel arrangement structure in a display apparatus with an FMM structure needs to be designed under certain restrictions; for example, the above-described parameters and the like need to be considered. Bn contrast, in the display apparatus of one embodiment of the present invention manufactured using an MML structure, an excellent effect such as higher flexibility in the pixel arrangement structure or the like than the FMM structure can be exhibited. This structure is highly compatible with a flexible device or the like, for example, and thus one or both of a pixel and a driver circuit can have a variety of circuit arrangements.

A protective layer 271 is provided over the conductive layer 173 functioning as a common electrode so as to cover the light-emitting element 61R, the light-emitting element 61G, and the light-emitting element 61B. The protective layer 271 has a function of preventing diffusion of impurities such as water into the light-emitting elements from above.

The protective layer 271 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide (IGZO) may be used for the protective layer 271. Note that the protective layer 271 may be formed by an atomic layer deposition (ALD) method, a chemical vapor deposition (CVD) method, or a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film. Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

In the case where an indium gallium zinc oxide is used for the protective layer 271, the indium gallium zinc oxide can be processed by a wet etching method or a dry etching method. For example, in the case where IGZO is used as the protective layer 271, a chemical solution of oxalic acid, phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

Figure 19C:
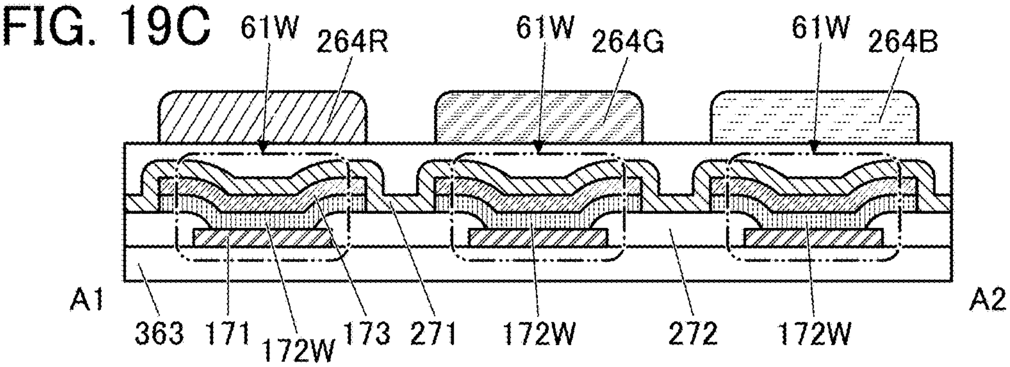

FIG. 19C illustrates an example different from the above. Specifically, in FIG. 19C, light-emitting elements 61W that emit white light are provided. The light-emitting elements 61W each include an EL layer 172W that emits white light between the conductive layer 171 functioning as a pixel electrode and the conductive layer 173 functioning as a common electrode.

The EL layer 172W can have, for example, a structure in which two or more light-emitting layers that are selected so as to emit light of complementary colors are stacked. It is also possible to use a stacked EL layer in which a charge-generation layer is provided between light-emitting layers.

FIG. 19C illustrates three light-emitting elements 61W side by side. A coloring layer 264R is provided above the light-emitting element 61W on the left. The coloring layer 264R functions as a band path filter that transmits red light. Similarly, a coloring layer 264G that transmits green light is provided above the light-emitting element 61W in the middle, and a coloring layer 264B that transmits blue light is provided above the light-emitting element 61W on the right. Thus, the display apparatus can display an image with colors.

Here, the EL layer 172W and the conductive layer 173 functioning as a common electrode are each separated between two adjacent light-emitting elements 61W. This can prevent unintentional light emission from being caused by current flowing through the EL layers 172W of the two adjacent light-emitting elements 61W. Particularly when stacked EL layers in which a charge-generation layer is provided between two light-emitting layers are used as the EL layer 172W, crosstalk is more significant as the resolution increases, i.e., as the distance between adjacent pixels decreases, leading to lower contrast. Thus, the above structure can achieve a display apparatus having both high resolution and high contrast.

The EL layer 172W and the conductive layer 173 functioning as a common electrode are preferably separated by a photolithography method. This can reduce the distance between light-emitting elements, enabling a display apparatus with a higher aperture ratio than that formed using, for example, a shadow mask such as a metal mask.

Note that in the case of a bottom-emission light-emitting element, a coloring layer may be provided between the conductive layer 171 functioning as a pixel electrode and the insulating layer 363.

Figure 19D:
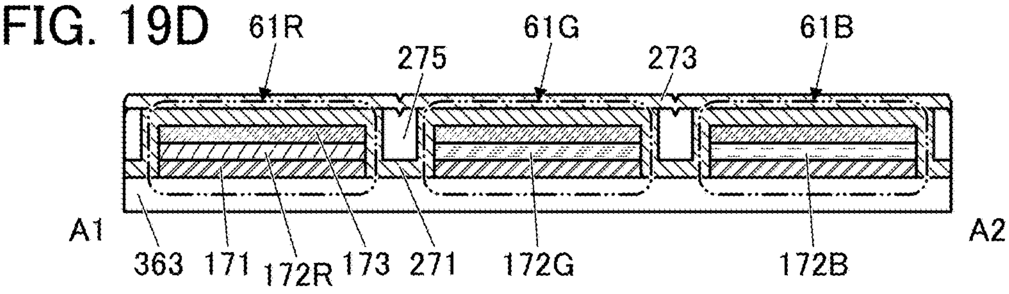

FIG. 19D illustrates an example different from the above. Specifically, in FIG. 19D, the insulating layers 272 that covers end portions of the conductive layers 171 are not provided between the light-emitting element 61R, the light-emitting element 61G, and the light-emitting element 61B. In other words, an insulator is not provided between the conductive layer 171 and the EL layer 172. With such a structure, light can be efficiently extracted from the EL layer, leading to extremely low viewing angle dependence. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle dependence and high image visibility.

When the insulating layer 272 is not provided, a display apparatus with a high aperture ratio can be achieved. The protective layer 271 covers side surfaces of the EL layer 172R, the EL layer 172G, and the EL layer 172B. With this structure, impurities (typically, water or the like) can be inhibited from entering the EL layer 172R, the EL layer 172G, and the EL layer 172B through their side surfaces. In the structure illustrated in FIG. 19D, the top shapes of the conductive layer 171, the EL layer 172R, and the conductive layer 173 are substantially the same. This structure can be formed in such a manner that the conductive layer 171, the EL layer 172R, and the conductive layer 173 are formed and collectively processed using a resist mask or the like. In this process, the EL layer 172R and the conductive layer 173 are processed using the conductive layer 173 as a mask, and thus this process can be called self-alignment patterning. Although the EL layer 172R is described here, the EL layer 172G and the EL layer 172B can each have a similar structure.

In FIG. 19D, a protective layer 273 is further provided over the protective layer 271. For example, the protective layer 271 can be formed with an apparatus that can deposit a film with excellent coverage (typically, an ALD apparatus), and the protective layer 273 can be formed with an apparatus that can deposit a film with coverage inferior to that of the protective layer 271 (typically, a sputtering apparatus), whereby a region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, any one or more selected from air, nitrogen, oxygen, carbon dioxide, and Group 18 elements (typically, helium, neon, argon, xenon, and krypton). Furthermore, for example, a gas used during the deposition of the protective layer 273 is sometimes included in the region 275. For example, in the case where the protective layer 273 is deposited using a sputtering method, any one or more of the above-described Group 18 elements is sometimes included in the region 275. In the case where a gas is included in the region 275, a gas can be identified with a gas chromatography method or the like. Alternatively, in the case where the protective layer 273 is deposited by a sputtering method, a gas used in the sputtering is sometimes contained in the protective layer 273. In this case, an element such as argon is sometimes detected when the protective layer 273 is analyzed by an energy dispersive X-ray analysis (EDX analysis) or the like.

In the case where the refractive index of the region 275 is lower than the refractive index of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be inhibited from entering an adjacent pixel in some cases. This can inhibit color mixture of light emitted from adjacent pixels and thus can improve the display quality of the display apparatus.

In the case of the structure illustrated in FIG. 19D, a region between the light-emitting element 61R and the light-emitting element 61G or a region between the light-emitting element 61G and the light-emitting element 61B (hereinafter simply referred to as a distance between the light-emitting elements) can be small. Specifically, the distance between the light-emitting elements can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region in which an interval between the side surface of the EL layer 172R and the side surface of the EL layer 172G or an interval between the side surface of the EL layer 172G and the side surface of the EL layer 172B is less than or equal to 1 μm, preferably less than or equal to 0.5 μm (500 nm), further preferably less than or equal to 100 nm.

In the case where the region 275 includes a gas, the light-emitting elements can be separated from each other and color mixing of light or crosstalk between the light-emitting elements can be inhibited.

Alternatively, the region 275 may be filled with a filler. Examples of the filler include an epoxy resin, an acrylic resin, a silicone resin, a phenol resin, a polyimide resin, a polyamide resin, a polyimide-amide resin, a siloxane resin, a benzocyclobutene-based resin, a PVC (polyvinyl chloride) resin, a PVB (polyvinyl butyral) resin, and an EVA (ethylene vinyl acetate) resin. A photosensitive resin (e.g., a resist material) may be used as the filler. The photosensitive resin used as the filler may be either of positive type or of negative type.

With the use of a photosensitive resin as the filler, the region 275 can be filled only by light exposure and development steps. The region 275 may be filled with a negative photosensitive resin used as the filler. A material that absorbs visible light is suitably used as the filler. When the region 275 is filled with a material that absorbs visible light, light emitted from the EL layer can be absorbed by the region 275, so that light that might leak to the adjacent EL layer (stray light) can be inhibited. Accordingly, a semiconductor device that has high display quality can be provided.

When the above-described white-light-emitting device (having the single structure or the tandem structure) and a light-emitting device having the SBS structure are compared with each other, the light-emitting device having the SBS structure can have lower power consumption than the white-light-emitting device. To reduce power consumption, a light-emitting device having the SBS structure is preferably used. Meanwhile, the white light-emitting device is preferable in terms of low manufacturing cost or high manufacturing yield because the manufacturing process of the white light-emitting device is simpler than that of the light-emitting device having the SBS structure.

Figure 20A:
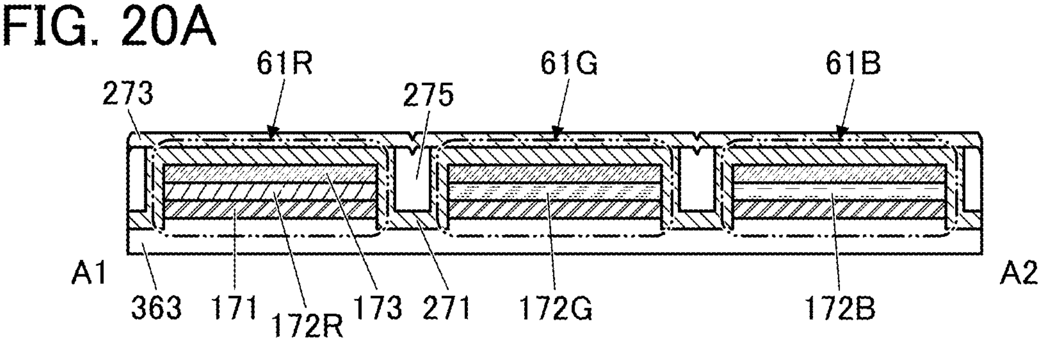
FIG. 20A to FIG. 20D are diagrams illustrating structure examples of light-emitting elements.

FIG. 20A illustrates an example different from the above. Specifically, the structure illustrated in FIG. 20A is different from the structure illustrated in FIG. 19D in the structure of the insulating layer 363. A top surface of the insulating layer 363 is partly removed when the light-emitting element 61R, the light-emitting element 61G, and the light-emitting element 61B are processed, so that the insulating layer 363 has a depressed portion. In addition, the protective layer 271 is formed in the depressed portion. In other words, in the cross-sectional view, a region is provided, in which the bottom surface of the protective layer 271 is positioned below the bottom surface of the conductive layer 171. With the region, impurities (typically, water or the like) can be suitably inhibited from entering the light-emitting element 61R, the light-emitting element 61G, and the light-emitting element 61B from the bottom. It is likely that the recessed portion can be formed when impurities (also referred to as residue) that could be attached to the side surfaces of the light-emitting element 61R, the light-emitting element 61G, and the light-emitting element 61B in processing of the light-emitting elements are removed by e.g., wet etching. After the residue is removed, the side surfaces of the light-emitting elements are covered with the protective layer 271, whereby a highly reliable display apparatus can be provided.

Figure 20B:
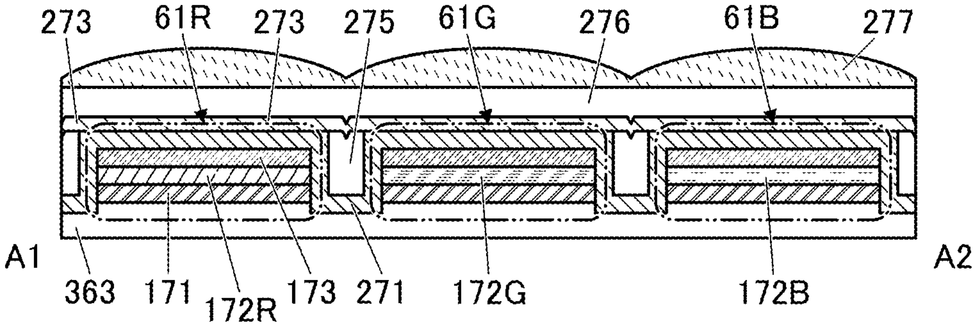

FIG. 20B illustrates an example different from the above. Specifically, the structure illustrated in FIG. 20B includes an insulating layer 276 and a microlens array 277 in addition to the structure illustrated in FIG. 20A. The insulating layer 276 functions as an adhesive layer. Note that when the refractive index of the insulating layer 276 is lower than that of the microlens array 277, the microlens array 277 can condense light emitted from the light-emitting element 61R, the light-emitting element 61G, and the light-emitting element 61B. This can increase the light extraction efficiency of the display apparatus. In particular, this is suitable, because a user can see bright images when the user sees the display surface from the front of the display apparatus. As the insulating layer 276, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-liquid-mixture-type resin may be used. An adhesive sheet or the like may be used.

Figure 20C:
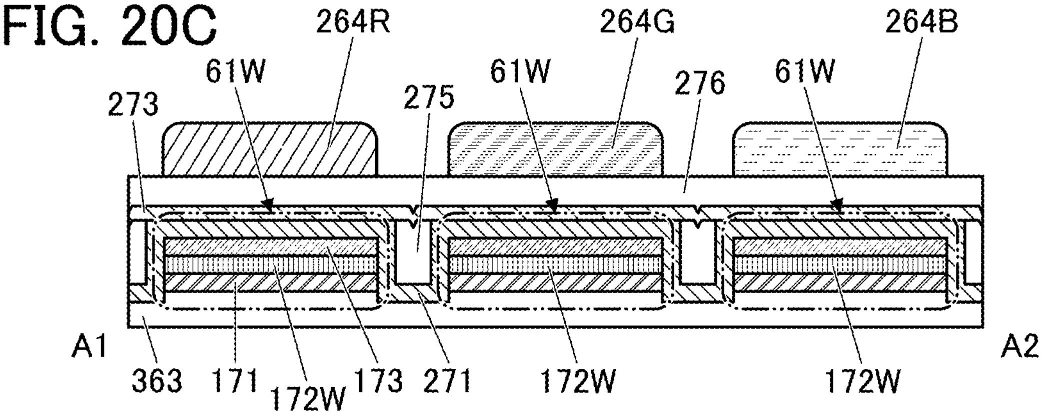

FIG. 20C illustrates an example different from the above. Specifically, the structure illustrated in FIG. 20C includes three light-emitting elements 61W instead of the light-emitting element 61R, the light-emitting element 61G, and the light-emitting element 61B in the structure illustrated in FIG. 20A. In addition, the insulating layer 276 is provided over the three light-emitting elements 61W, and the coloring layer 264R, the coloring layer 264G, and the coloring layer 264B are provided over the insulating layer 276. Specifically, the coloring layer 264R that transmits red light is provided at a position overlapping with the light-emitting element 61W on the left, the coloring layer 264G that transmits green light is provided at a position overlapping with the light-emitting element 61W in the middle, and the coloring layer 264B that transmits blue light is provided at a position overlapping with the light-emitting element 61W on the right. Thus, the semiconductor device can display an image with colors. The structure illustrated in FIG. 20C is also a variation example of the structure illustrated in FIG. 19C. Note that a coloring layer may be referred to as a "color filter".

The light-emitting elements 61W illustrated in FIG. 20C can have the above-described structure capable of white light emission (the single structure or the tandem structure). The tandem structure is preferable to obtain high-luminance light emission.

When the above-described structure capable of white light emission (one or both of the single structure and the tandem structure), color filters, and the MML structure of one embodiment of the present invention are combined, a display apparatus with a high contrast ratio can be obtained.

Figure 20D:
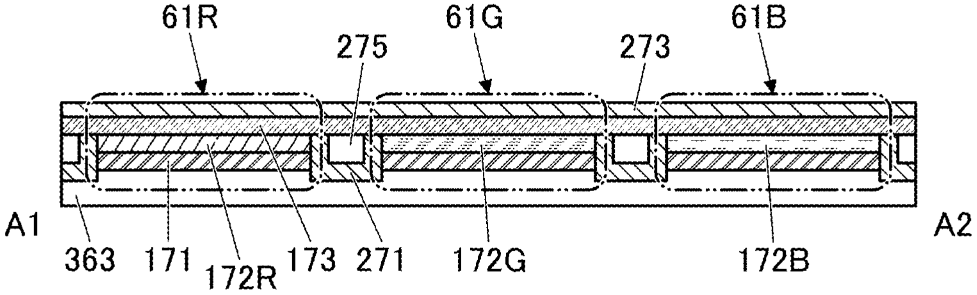

FIG. 20D illustrates an example different from the above. Specifically, in the structure illustrated in FIG. 20D, the protective layer 271 is provided adjacent to the side surfaces of the conductive layer 171 and the EL layer 172. The conductive layer 173 is provided as a continuous layer shared by the light-emitting elements. In the structure illustrated in FIG. 20D, the region 275 is preferably filled with a filler.

Furthermore, the color purity of emitted light can be further increased when the light-emitting element 61 has a microcavity structure. In order that the light-emitting element 61 has a microcavity structure, a product of a distance d between the conductive layer 171 and the conductive layer 173 and a refractive index n of the EL layer 172 (optical path length) is set to m times half of a wavelength h (m is an integer of 1 or more). The distance d can be obtained by Formula 4.

$$d = m \times h/(2 \times n) \qquad \text{Formula 4}$$

According to Formula 4, in the light-emitting element 61 having the microcavity structure, the distance d is determined in accordance with the wavelength (emission color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G in some cases.

To be exact, the distance d is a distance from a reflection region in the conductive layer 171 functioning as a reflective electrode to a reflection region in the conductive layer 173 functioning as a transflective electrode. For example, in the case where the conductive layer 171 is a stack of silver and ITO (Indium Tin Oxide) that is a transparent conductive film and the ITO is positioned on the EL layer 172 side, the distance d suitable for the emission color can be set by adjusting the thickness of the ITO. That is, even when the EL layer 172R, the EL layer 172G, and the EL layer 172B have the same thickness, the distance d suitable for the emission color can be obtained by adjusting the thickness of the ITO.

However, it is sometimes difficult to determine the exact position of the reflection region in each of the conductive layer 171 and the conductive layer 173. In that case, it is assumed that the effect of the microcavity structure can be fully obtained with a certain position in each of the conductive layer 171 and the conductive layer 173 being supposed as the reflection region.

The light-emitting element 61 includes a hole-injection layer, a hole-transport layer, a light-emitting layer, an electron-transport layer, an electron-injection layer, and the like. In order to increase the outcoupling efficiency in the microcavity structure, the optical path length from the conductive layer 171 functioning as a reflective electrode to the light-emitting layer is preferably set to an odd multiple of h/4. In order to achieve this optical distance, the thicknesses of the layers in the light-emitting element 61 are preferably adjusted as appropriate.

In the case where light is emitted from the conductive layer 173 side, the reflectance of the conductive layer 173 is preferably higher than the transmittance thereof. The light transmittance of the conductive layer 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductive layer 173 is set low (the reflectance is set high), the effect of the microcavity can be enhanced.

The structure described in this embodiment can be used in an appropriate combination with the structures described in the other embodiments.

Embodiment 6

In this embodiment, stacked-layer structure examples of a display apparatus 10 will be described.

Figure 21A:
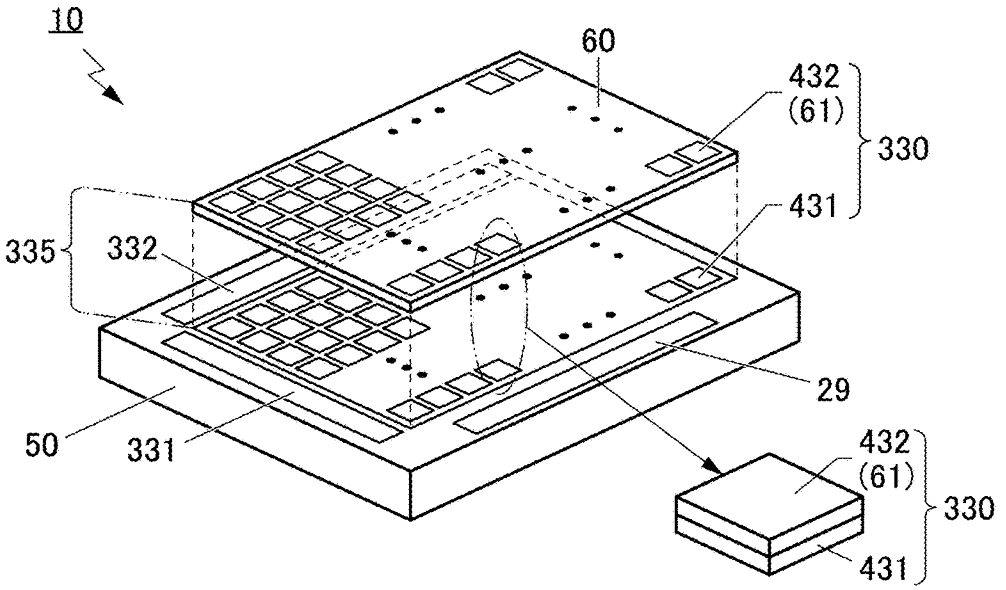
FIG. 21A and FIG. 21B are perspective views of a display apparatus.
Figure 21B:
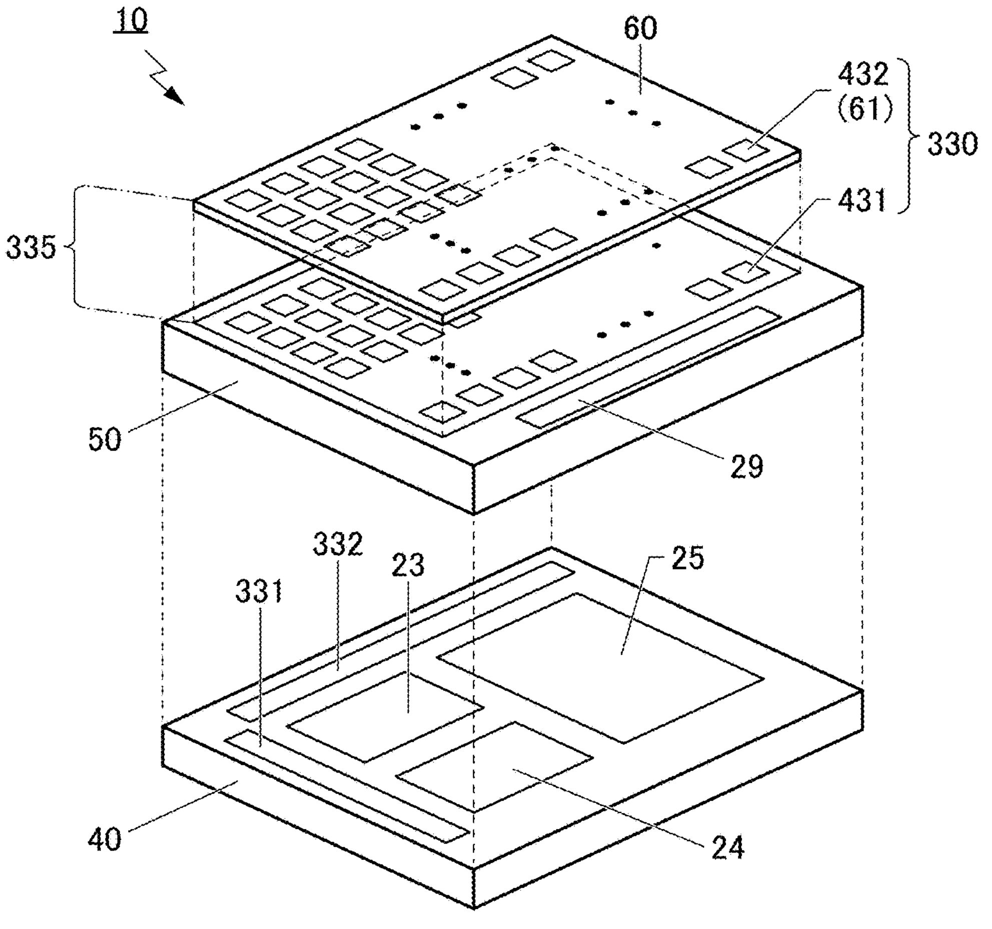

FIG. 21A and FIG. 21B are perspective views of the display apparatus 10. The display apparatus 10 illustrated in FIG. 21A includes a layer 60 overlapping with a layer 50. The layer 50 includes a plurality of pixel circuits 431 arranged in a matrix, the first driver circuit portion 331, the second driver circuit portion 332, and an input/output terminal portion 29. The layer 60 includes a plurality of display elements 432 arranged in a matrix.

In the display apparatus 10 illustrated in FIG. 21A and FIG. 21B, one pixel circuit 431 and one display element 432 are electrically connected to each other to function as one pixel 330. Thus, a region where the plurality of pixel circuits 431 included in the layer 50 and the plurality of display elements 432 included in the layer 60 overlap with each other functions as the display region 335. As the display element 432, the light-emitting element 61 described in the above embodiment can be used, for example.

Power, a signal, and the like necessary for the operation of the display apparatus 10 are supplied to the display apparatus 10 through the input/output terminal portion 29. In the display apparatus 10 illustrated in FIG. 21A, the transistors included in the peripheral driver circuit can be formed in the same steps as the transistors included in the pixels 330.

The display apparatus 10 may have a structure illustrated in FIG. 21B in which a layer 40, the layer 50, and the layer 60 are provided to overlap with each other. In FIG. 21B, the plurality of pixel circuits 431 arranged in a matrix are provided in the layer 50, and the first driver circuit portion 331 and the second driver circuit portion 332 are provided in the layer 40. By providing the first driver circuit portion 331 and the second driver circuit portion 332 in a layer different from the layer where the pixel circuits 431 are provided, the width of the bezel around the display region 335 can be small; thus, the area occupied by the display region 335 can be increased.

The resolution of the display region 335 can be increased with increasing area occupied by the display region 335. Under a fixed resolution of the display region 335, the area occupied by one pixel can be increased. Thus, the emission luminance of the display region 335 can be increased. In addition, the proportion of the light-emitting region to the area occupied by one pixel (also referred to as an "aperture ratio") can be increased. For example, the pixel aperture ratio can be greater than or equal to 40% and less than 100%, preferably greater than or equal to 50% and less than or equal to 95%, further preferably greater than or equal to 60% and less than or equal to 95%. The density of current supplied to the display element 432 can be reduced with increasing area occupied by one pixel. Thus, the load on the display element 432 can be reduced, leading to improved reliability of the display apparatus 10.

The display region 335, the peripheral driver circuit, and the like are stacked, whereby the wiring for electrical connection between them can be shortened. Thus, the wiring resistance and the parasitic capacitance can be lowered, and the operation speed of the display apparatus 10 can be increased. Furthermore, power consumption of the display apparatus 10 is reduced.

The layer 40 may include a CPU 23 (Central Processing Unit), a GPU 24 (Graphics Processing Unit), and a memory circuit portion 25 in addition to the peripheral driver circuit. In this embodiment and the like, the peripheral driver circuit, the CPU 23, the GPU 24, and the memory circuit portion 25 are collectively referred to as a "functional circuit" in some cases.

For example, the CPU 23 has a function of controlling the operations of the GPU 24 and the circuits provided in the layer 40 in accordance with a program stored in the memory circuit portion 25. The GPU 24 has a function of performing arithmetic processing for generating image data. Furthermore, the GPU 24 can perform a large number of matrix operations (product-sum arithmetics) in parallel and thus can perform arithmetic processing using a neural network at high speed, for example. The GPU 24 has a function of correcting image data using correction data stored in the memory circuit portion 25, for example. The GPU 24 has a function of generating image data in which brightness, hue, contrast, and/or the like are/is corrected, for example.

Upconversion or downconversion of image data may be performed using the GPU 24. A super-resolution circuit may be provided in the layer 40. The super-resolution circuit has a function of determining a potential of any pixel included in the display region 335 by a product-sum arithmetic of weights and potentials of pixels in the periphery of the pixel. The super-resolution circuit has a function of upconverting image data with a resolution lower than that of the display region 335. The super-resolution circuit has a function of downconverting image data with a resolution higher than that of the display region 335.

Providing the super-resolution circuit can reduce the load on the GPU 24. For example, the GPU 24 executes processing up to 2K resolution (or 4K resolution) and the super-resolution circuit performs upconversion to 4K resolution (or 8K resolution), whereby the load on the GPU 24 can be reduced. Downconversion can be performed in a similar manner.

Note that the functional circuit included in the layer 40 does not necessarily include all of these components, and may include another component. For example, a potential generating circuit that generates a plurality of different potentials, and/or a power management circuit that controls supply and stop of electrical power for each circuit included in the display apparatus 10 may be provided.

The supply and stop of electrical power may be performed per circuit included in the CPU 23. For example, power consumption can be reduced by stopping supply of electrical power to a circuit, which is determined to be not used for a while, of the circuits included in the CPU 23, and restarting the supply of electrical power to the circuit as needed. Data necessary for restarting supply of electrical power may be stored in a memory circuit in the CPU 23, the memory circuit portion 25, or the like before the circuit is stopped. By storing data necessary for recovery of the circuit, high-speed recovery of the circuit stopped can be performed. Note that supply of a clock signal may be stopped to stop the circuit operation.

As the functional circuit, a DSP circuit, a sensor circuit, a communication circuit, an FPGA (Field Programmable Gate Array), and/or the like may be included.

Some of the transistors in the functional circuit included in the layer 40 may be provided in the layer 50. Some of the transistors in the pixel circuit 431 included in the layer 50 may be provided in the layer 40. Thus, the functional circuit may include a Si transistor and an OS transistor. The pixel circuit 431 may include a Si transistor and an OS transistor.

Transistors included in the display apparatus 10 may be either n-channel transistors or p-channel transistors. Both n-channel transistors and p-channel transistors may be used. For example, a CMOS structure in which an n-channel transistor and a p-channel transistor are combined may be employed the circuits included in the display apparatus 10.

As described above, the sensor portion 240 and the product arithmetic portion 250 may be provided in the display region 335. The comparison portion 260 may be provided in the layer 40. The product arithmetic portion 250 and the comparison portion 260 may be provided in the layer 40. A program that realizes the operations of the reservoir layer 120 and the output layer 130 is stored in the memory circuit portion 25, whereby arithmetic processing of an RC model can be performed in the display apparatus 10.

<Structure Example of Display Module>

Next, a structure example of a display module including the display apparatus of one embodiment of the present invention will be described below.

Figure 22A:
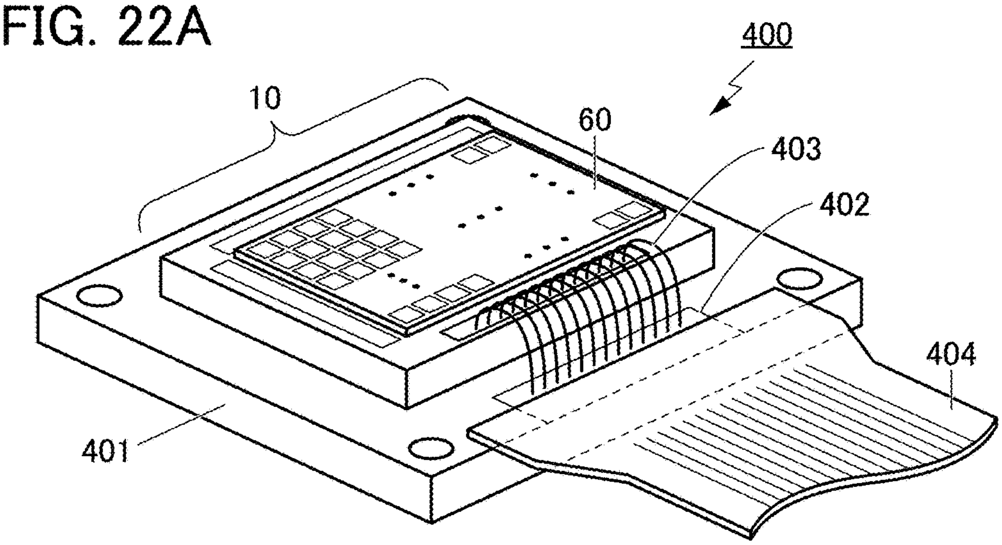
FIG. 22A to FIG. 22C are schematic perspective views of a display module.
Figure 22B:
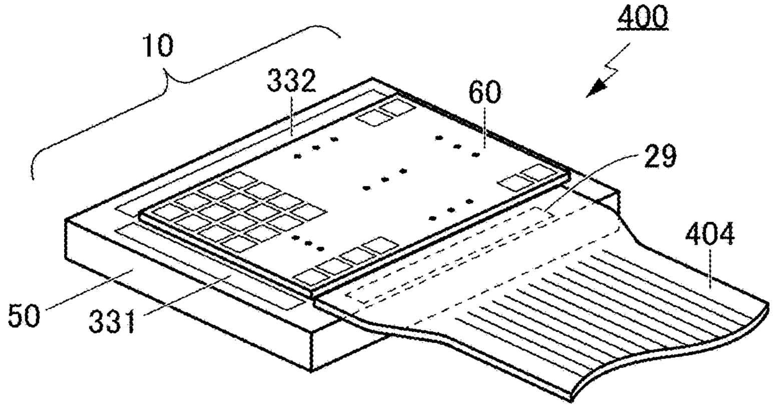
Figure 22C:
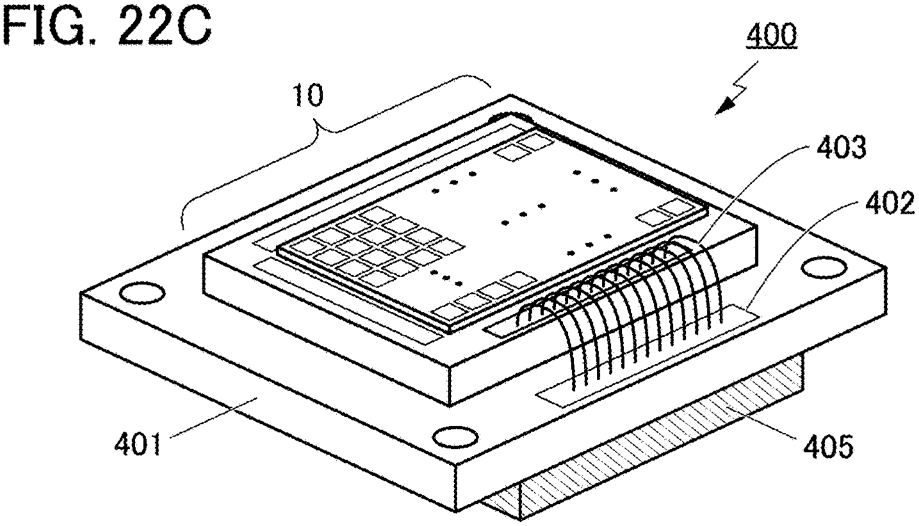

FIG. 22A to FIG. 22C are each a schematic perspective view of a display module 400. The display module 400 illustrated in FIG. 22A includes the display apparatus 10 over a printed wiring board 401. The printed wiring board 401 includes wirings inside a substrate formed of an insulator and/or on the surface of the substrate.

In the display module 400 illustrated in FIG. 22A, the input/output terminal portion 29 of the display apparatus 10 is electrically connected to a terminal portion 402 of the printed wiring board 401 through a wire 403. The wire 403 can be formed by a wire bonding method. After the wire 403 is formed, the wire 403 may be covered with a resin material or the like. Note that the display apparatus 10 and the printed wiring board 401 may be electrically connected to each other by a method other than the wire bonding method.

The display module 400 in FIG. 22A is electrically connected to an FPC 404 (Flexible printed circuits). The FPC 404 has a structure in which a film formed of an insulator is provided with a wiring. The FPC 404 is flexible. The FPC 404 functions as a wiring for supplying a video signal, a control signal, a power supply potential, and the like to the display apparatus 10 from the outside. An IC may be mounted on the FPC 404.

The printed wiring board 401 can be provided with a variety of elements such as a resistor, a capacitor, and a semiconductor element. Specifically, the distance (pitch) between electrodes in the input/output terminal portion 29 can be changed to the distance between electrodes in the terminal portion 402 with the use of wirings formed on the printed wiring board 401. Accordingly, even when the electrode pitch in the input/output terminal portion 29 is different from the electrode pitch in the FPC 404, electrical connection between the electrodes can be obtained.

In the display module 400, the FPC 404 may be directly connected to the input/output terminal portion 29 of the display apparatus 10 as illustrated in FIG. 22B. In the case where the pitch of the electrodes included in the input/output terminal portion 29 is equal to the pitch of the electrodes included in the FPC 404, the input/output terminal portion 29 may be electrically connected to the FPC 404 without using the printed wiring board 401.

As in the display module 400 illustrated in FIG. 22C, the terminal portion 402 may be electrically connected to a connection portion 405 provided on a bottom surface (a surface where the display apparatus 10 is not provided) of the printed wiring board 401. With the use of a socket-type connection portion as the connection portion 405, for example, the display module 400 can be easily attached to and detached from another device.

Figure 23:
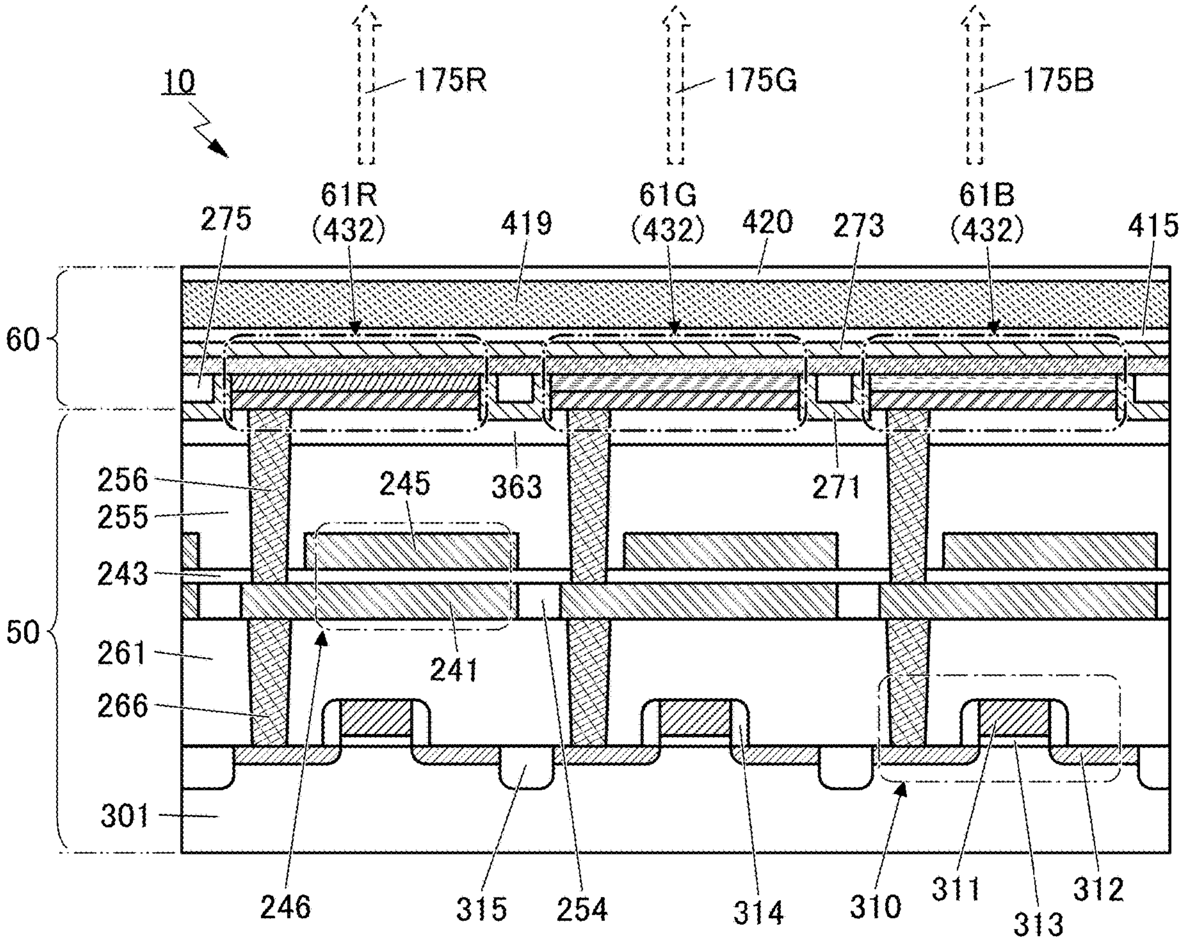
FIG. 23 is a cross-sectional view illustrating an example of a display apparatus.

FIG. 23 illustrates a cross-sectional structure example of part of the display apparatus 10 illustrated in FIG. 21A. The display apparatus 10 illustrated in FIG. 23 includes the layer 50 including a substrate 301, a capacitor 246, and a transistor 310 and the layer 60 including the display element 432. The layer 60 is provided over the insulating layer 363 included in the layer 50. FIG. 23 to FIG. 26 each illustrate a cross-sectional structure example in the case where the light-emitting elements 61 (the light-emitting element 61R, the light-emitting element 61G, and the light-emitting element 61B) are used as the display elements.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and insulating layers 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain.

The insulating layer 314 is provided to cover a side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 246 is provided over the insulating layer 261.

The capacitor 246 includes a conductive layer 241, a conductive layer 245, and an insulating layer 243 positioned therebetween. The conductive layer 241 functions as one electrode of the capacitor 246, the conductive layer 245 functions as the other electrode of the capacitor 246, and the insulating layer 243 functions as a dielectric of the capacitor 246.

The conductive layer 241 is provided over the insulating layer 261 and is embedded in an insulating layer 254. The conductive layer 241 is electrically connected to one of a source and a drain of the transistor 310 through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246, the insulating layer 363 is provided over the insulating layer 255, and the light-emitting element 61R, the light-emitting element 61G, and the light-emitting element 61B are provided over the insulating layer 363. A protective layer 415 is provided over the light-emitting element 61R, the light-emitting element 61G, and the light-emitting element 61B, and a substrate 420 is provided over the top surface of the protective layer 415 with a resin layer 419 therebetween.

The pixel electrode of the light-emitting element is electrically connected to one of the source and the drain of the transistor 310 through a plug 256 embedded in the insulating layer 255 and the insulating layer 363, the conductive layer 241 embedded in the insulating layer 254, and the plug 266 embedded in the insulating layer 261.

Figure 24:
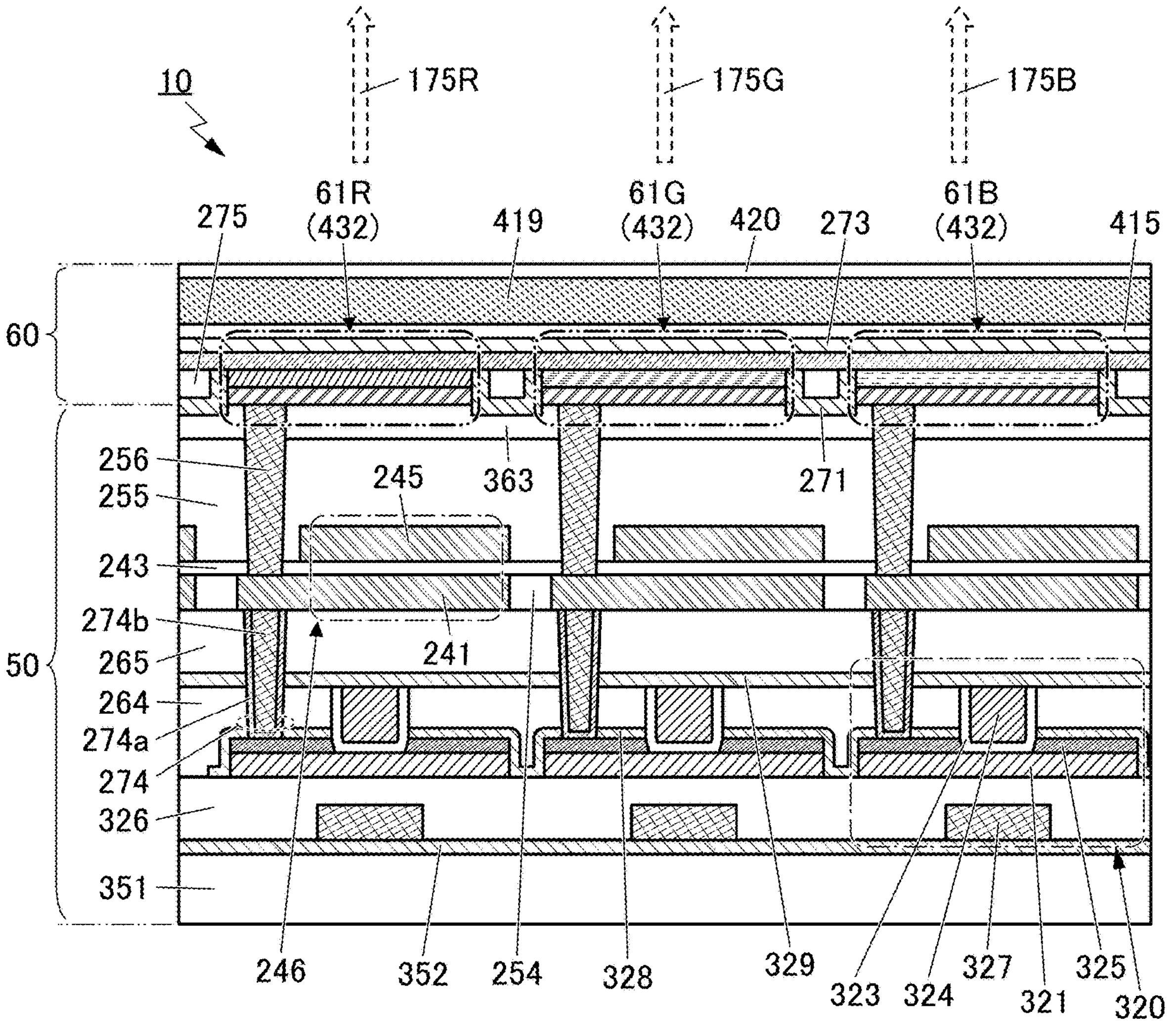
FIG. 24 is a cross-sectional view illustrating an example of a display apparatus.

FIG. 24 illustrates a variation example of the cross-sectional structure example illustrated in FIG. 23. The cross-sectional structure example of the display apparatus 10 illustrated in FIG. 24 is different from the cross-sectional structure example illustrated in FIG. 23 mainly in that a transistor 320 is provided instead of the transistor 310. Note that portions similar to those in FIG. 23 are not described in some cases.

The transistor 320 is a transistor in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327

As the substrate 351, an insulating substrate or a semiconductor substrate can be used.

An insulating layer 352 is provided over the substrate 351. The insulating layer 352 functions as a barrier layer that prevents diffusion of impurities such as water or hydrogen from the substrate 351 into the transistor 320 and release of oxygen from the semiconductor layer 321 to the insulating layer 352 side. As the insulating layer 352, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 352, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a film of a metal oxide (also referred to as an oxide semiconductor) having semiconductor characteristics. A material that can be suitably used for the semiconductor layer 321 will be described in detail later.

The pair of conductive layers 325 is provided on and in contact with the semiconductor layer 321 and functions as a source electrode and a drain electrode.

An insulating layer 328 is provided to cover the top surface and side surface of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 352 can be used.

An opening reaching the semiconductor layer 321 is provided in the insulating layer 328 and the insulating layer 264. The conductive layer 324 and the insulating layer 323 that is in contact with side surfaces of the insulating layer 264, the insulating layer 328, and the conductive layer 325 and a top surface of the semiconductor layer 321 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are substantially level with each other, and an insulating layer 329 and an insulating layer 265 are provided to cover these layers The insulating layer 264 and the insulating layer 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layer 328 and the insulating layer 352 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers side surfaces of openings in the insulating layer 265, the insulating layer 329, the insulating layer 264, and the insulating layer 328 and part of a top surface of the conductive layer 325, and a conductive layer 274*b* in contact with a top surface of the conductive layer 274*a*. In that case, a conductive material in which hydrogen and oxygen are less likely to diffuse is preferably used for the conductive layer 274*a*.

Figure 25:
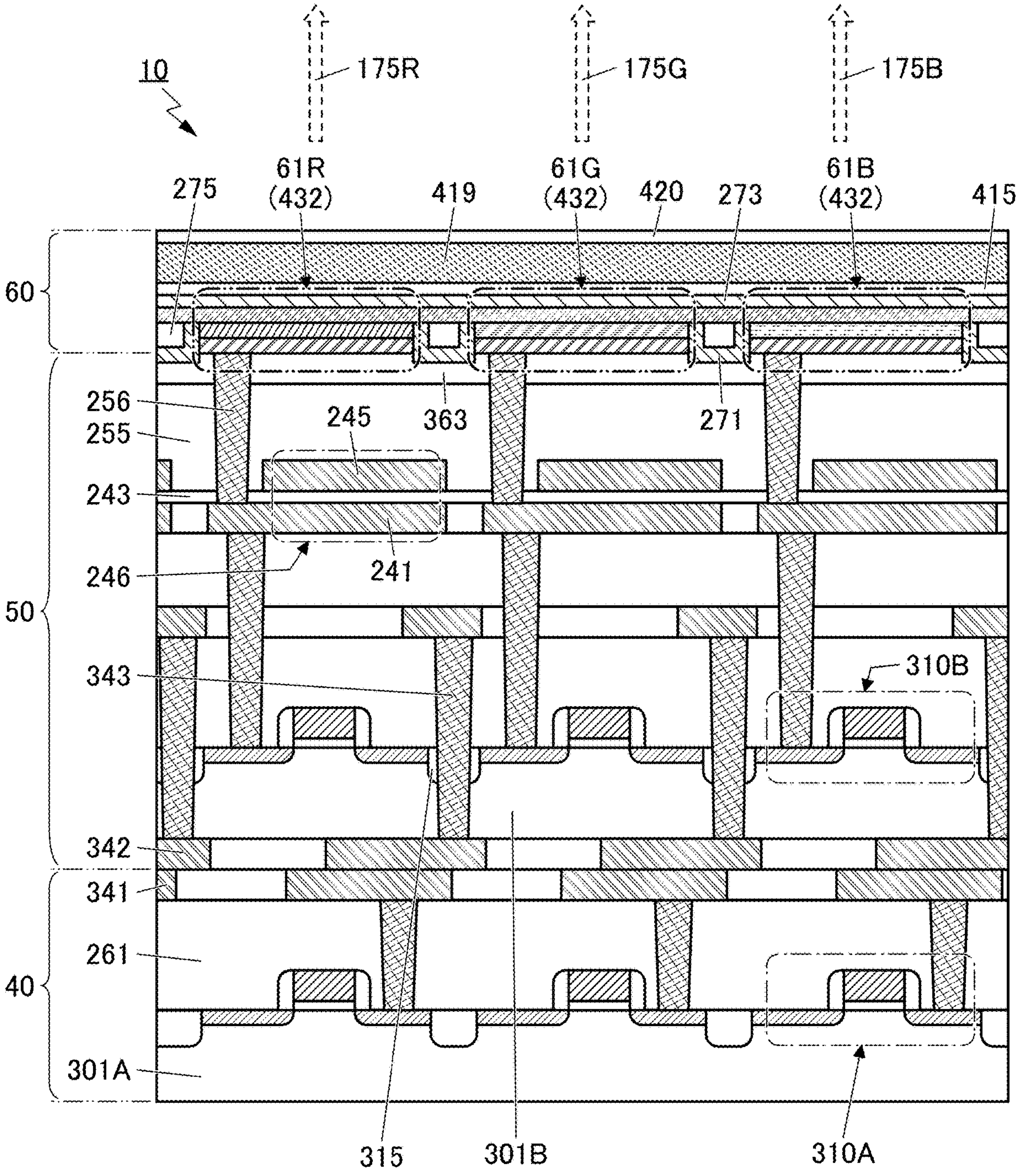
FIG. 25 is a cross-sectional view illustrating an example of a display apparatus.

FIG. 25 illustrates a cross-sectional structure example of part of the display apparatus 10 illustrated in FIG. 21B. The display apparatus 10 illustrated in FIG. 25 has a structure in which a transistor 310A whose channel is formed in a substrate 301A included in the layer 40 and a transistor 310B whose channel is formed in the substrate 301A included in the layer 40 are stacked. A material similar to that of the substrate 301 can be used for the substrate 301A.

The display apparatus 10 illustrated in FIG. 25 has a structure in which the layer 60 including the light-emitting element 61 as the display element 432, the layer 50 including a substrate 301B, the transistor 310B, and the capacitor 246, and the layer 40 including the substrate 301A and the transistor 310A are attached to each other.

The substrate 301B is provided with a plug 343 that penetrates the substrate 301B. The plug 343 functions as a Si through electrode (TSV: Through Silicon Via). The plug 343 is electrically connected to a conductive layer 342 provided on a rear surface of the substrate 301 (a surface opposite to the substrate 420 side). Meanwhile, over the substrate 301A, a conductive layer 341 is provided over the insulating layer 261.

The conductive layer 341 and the conductive layer 342 are bonded to each other, whereby the layer 40 and the layer 50 are electrically connected to each other The conductive layer 341 and the conductive layer 342 are preferably formed using the same conductive material. For example, a metal film containing an element selected from A1, Cr, Cu, Ta, Sn, Zn, Au, Ag, Pt, Ti, Mo, and W, a metal nitride film containing the above element as its component (a titanium nitride film, a molybdenum nitride film, or a tungsten nitride film), or the like can be used. Copper is particularly preferably used for the conductive layer 341 and the conductive layer 342. In that case, it is possible to employ a copper-to-copper (Cu-to-Cu) direct bonding technique (a technique for achieving electrical continuity by connecting copper (Cu) pads to each other). Note that the conductive layer 341 and the conductive layer 342 may be bonded to each other with a bump therebetween.

Figure 26:
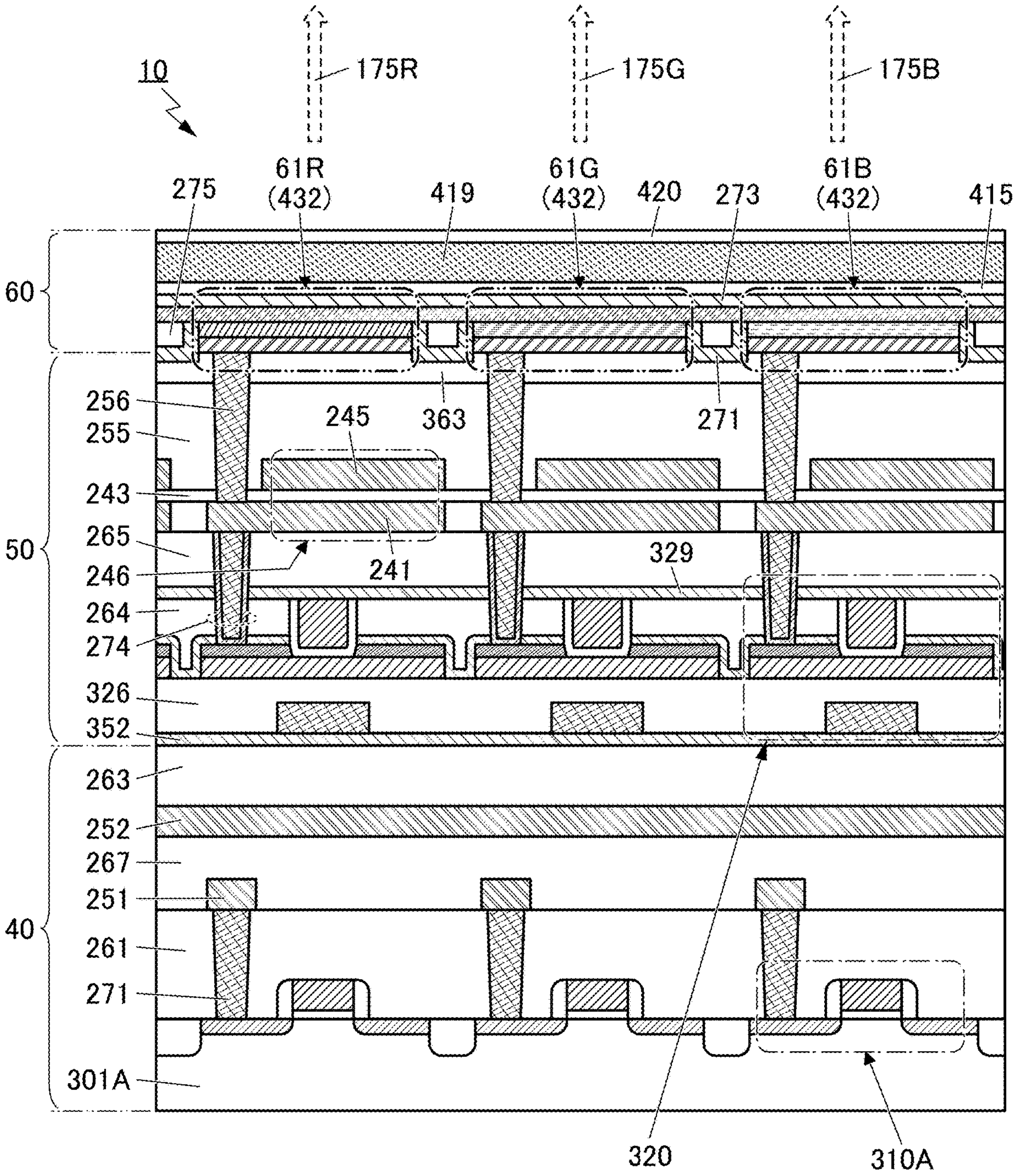
FIG. 26 is a cross-sectional view illustrating an example of a display apparatus.

FIG. 26 illustrates a variation example of the cross-sectional structure example illustrated in FIG. 25. In the cross-sectional structure example of the display apparatus 10 illustrated in FIG. 26, the transistor 310A whose channel is formed in the substrate 301A and the transistor 320 including a metal oxide in the semiconductor layer where the channel is formed are stacked. Note that portions similar to those in FIG. 23 to FIG. 25 are not described in some cases.

The layer 50 illustrated in FIG. 26 has a structure in which the substrate 351 is removed from the layer 50 illustrated in FIG. 24. In the layer 40 illustrated in FIG. 26, the insulating layer 261 is provided to cover the transistor 310A, and a conductive layer 251 is provided over the insulating layer 261. An insulating layer 267 is provided to cover the conductive layer 251, and a conductive layer 252 is provided over the insulating layer 267. The conductive layer 251 and the conductive layer 252 each function as a wiring. An insulating layer 263 and the insulating layer 352 are provided to cover the conductive layer 252, and the transistor 320 is provided over the insulating layer 352. The insulating layer 265 is provided to cover the transistor 320, and the capacitor 246 is provided over the insulating layer 265. The capacitor 246 and the transistor 320 are electrically connected to each other through the plug 274. The layer 50 is provided to overlap with the insulating layer 263 included in the layer 40.

The transistor 320 can be used as a transistor included in the pixel circuit 431. The transistor 310 can be used as a transistor included in the pixel circuit 431 or the a transistor included in the peripheral driver circuit. The transistor 310 and the transistor 320 can also be used as transistors included in a functional circuit such as an arithmetic circuit or a memory circuit.

Such a structure enables the peripheral driver circuit or the like as well as the pixel circuit 431 to be formed directly under the layer 60 including the display element 432. Thus, the display apparatus can be downsized as compared with the case where a driver circuit is provided around a display region.

The structure described in this embodiment can be used in an appropriate combination with the structures described in the other embodiments.

Embodiment 7

In this embodiment, transistors that can be used in the semiconductor device of one embodiment of the present invention will be described.

<Structure Example of Transistor>

Figure 27A:
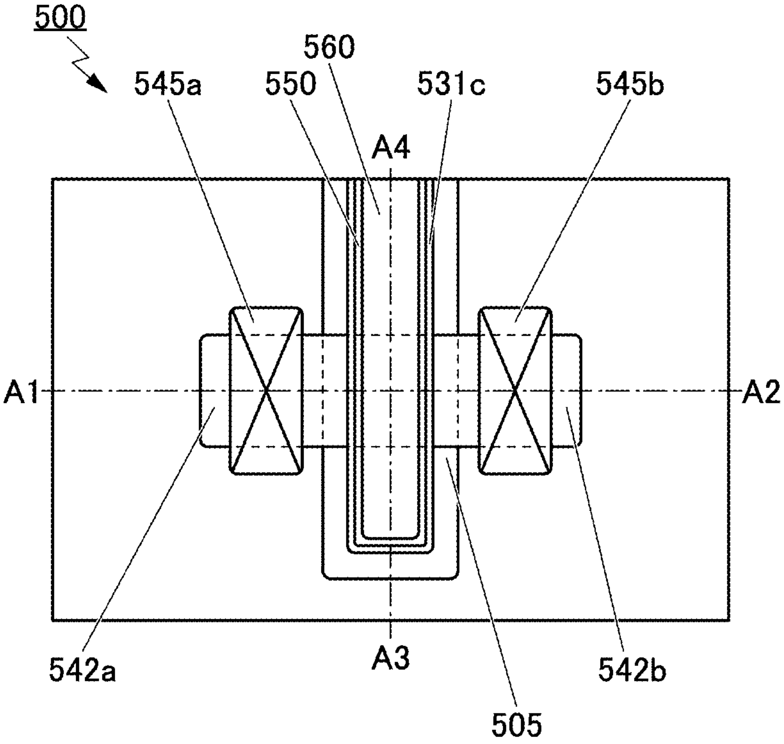
FIG. 27A is a top view illustrating a structure example of a transistor.
Figure 27C:
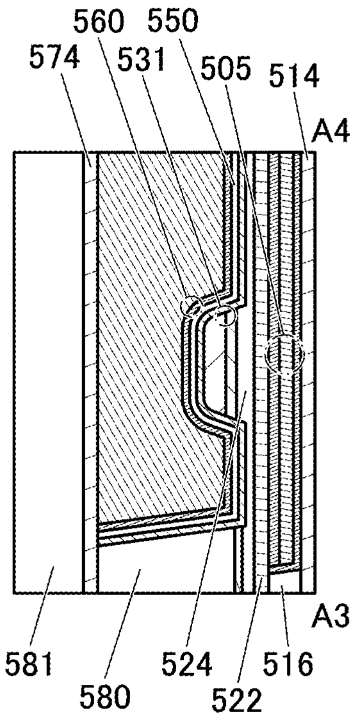
FIG. 27B and FIG. 27C are cross-sectional views illustrating structure examples of the transistor.
Figure 27B:
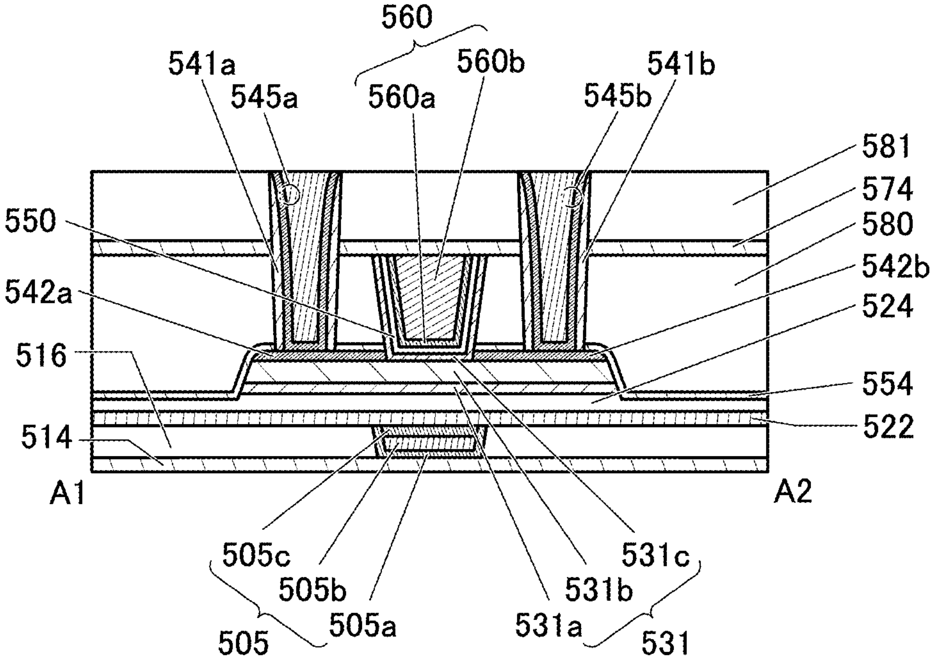

FIG. 27A, FIG. 27B, and FIG. 27C are a top view and cross-sectional views of a transistor 500 that can be used in the semiconductor device of one embodiment of the present invention. The transistor 500 can be used in the semiconductor device of one embodiment of the present invention.

FIG. 27A is the top view of the transistor 500. FIG. 27B and FIG. 27C are the cross-sectional views of the transistor 500. FIG. 27B is a cross-sectional view of a portion indicated by the dashed-dotted line A1-A2 in FIG. 27A and is a cross-sectional view of the transistor 500 in the channel length direction. FIG. 27C is a cross-sectional view of a portion indicated by the dashed-dotted line A3-A4 in FIG. 27A and is a cross-sectional view of the transistor 500 in the channel width direction. Note that some components are omitted in the top view of FIG. 27A for clarity of the drawing.

As illustrated in FIG. 27, the transistor 500 includes a metal oxide 531*a* placed over a substrate (not illustrated); a metal oxide 531*b* placed over the metal oxide 531*a*; a conductor 542*a* and a conductor 542*b* that are placed apart from each other over the metal oxide 531*b*; an insulator 580 that is placed over the conductor 542*a* and the conductor 542*b* and has an opening between the conductor 542*a* and the conductor 542*b*; a conductor 560 placed in the opening; an insulator 550 placed between the conductor 560 and the metal oxide 531*b*, the conductor 542*a*, the conductor 542*b*, and the insulator 580; and a metal oxide 531*c* placed between the insulator 550 and the metal oxide 531*b*, the conductor 542*a*, the conductor 542*b*, and the insulator 580. Here, as illustrated in FIG. 27B and FIG. 27C, preferably, the top surface of the conductor 560 is substantially level with the top surfaces of the insulator 550, the insulator 554, the metal oxide 531*c*, and the insulator 580. Hereinafter, the metal oxide 531*a*, the metal oxide 531*b*, and the metal oxide 531*c* may be collectively referred to as a metal oxide 531. The conductor 542*a* and the conductor 542*b* may be collectively referred to as a conductor 542.

In the transistor 500 illustrated in FIG. 27, the side surfaces of the conductor 542*a* and the conductor 542*b* on the conductor 560 side are substantially perpendicular. Note that the transistor 500 illustrated in FIG. 27 is not limited thereto, and the angle formed between the side surfaces and bottom surfaces of the conductor 542*a* and the conductor 542*b* may be greater than or equal to 10° and less than or equal to 80°, preferably greater than or equal to 30° and less than or equal to 60°. The side surfaces of the conductor 542*a* and the conductor 542*b* that face each other may have a plurality of surfaces.

As illustrated in FIG. 27, the insulator 554 is preferably placed between the insulator 580 and an insulator 524, the metal oxide 531*a*, the metal oxide 531*b*, the conductor 542*a*, the conductor 542*b*, and the metal oxide 531*c*. Here, as illustrated in FIG. 27B and FIG. 27C, the insulator 554 is preferably in contact with the side surface of the metal oxide 531*c*, the top surface and side surface of the conductor 542*a*, the top surface and side surface of the conductor 542*b*, the side surfaces of the metal oxide 531*a* and the metal oxide 531*b*, and the top surface of the insulator 524.

In the transistor 500, three layers of the metal oxide 531*a*, the metal oxide 531*b*, and the metal oxide 531*c* are stacked in and around a region where a channel is formed (hereinafter, also referred to as a channel formation region); however, the present invention is not limited thereto. For example, a two-layer structure of the metal oxide 531*b* and the metal oxide 531*c* or a stacked-layer structure of four or more layers may be employed. Although the conductor 560 is illustrated to have a stacked-layer structure of two layers in the transistor 500, the present invention is not limited thereto. For example, the conductor 560 may have a single-layer structure or a stacked-layer structure of three or more layers. Furthermore, each of the metal oxide 531*a*, the metal oxide 531*b*, and the metal oxide 531*c* may have a stacked-layer structure of two or more layers.

For example, in the case where the metal oxide 531*c* has a stacked-layer structure including a first metal oxide and a second metal oxide over the first metal oxide, the first metal oxide preferably has a composition similar to that of the metal oxide 531*b* and the second metal oxide preferably has a composition similar to that of the metal oxide 531*a*.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. Here, the positions of the conductor 560, the conductor 542*a*, and the conductor 542*b* are selected in a self-aligned manner with respect to the opening of the insulator 580. In other words, in the transistor 500, the gate electrode can be placed between the source electrode and the drain electrode in a self-aligned manner. Therefore, the conductor 560 can be formed without an alignment margin, resulting in a reduction in the area occupied by the transistor 500. Accordingly, the display apparatus can have higher resolution. In addition, the display apparatus can have a narrow bezel.

As illustrated in FIG. 27, the conductor 560 preferably includes a conductor 560*a* provided inside the insulator 550 and a conductor 560*b* provided to be embedded inside the conductor 560*a*.

The transistor 500 preferably includes an insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. The metal oxide 531*a* is preferably placed over the insulator 524.

An insulator 574 and an insulator 581 functioning as interlayer films are preferably placed over the transistor 500. Here, the insulator 574 is preferably placed in contact with the top surfaces of the conductor 560, the insulator 550, the insulator 554, the metal oxide 531*c*, and the insulator 580.

The insulator 522, the insulator 554, and the insulator 574 preferably have a function of inhibiting diffusion of hydrogen (e.g., at least one of a hydrogen atom, a hydrogen molecule, and the like). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., at least one of an oxygen atom, an oxygen molecule, and the like). For example, the insulator 522 and the insulator 554 preferably have a lower oxygen permeability than the insulator 524, the insulator 550, and the insulator 580.

Here, the insulator 524, the metal oxide 531, and the insulator 550 are separated from the insulator 580 and the insulator 581 by the insulator 554 and the insulator 574. This can inhibit the entry of impurities such as hydrogen contained in the insulator 580 and the insulator 581 into the insulator 524, the metal oxide 531, and the insulator 550 and excess oxygen into the insulator 524, the metal oxide 531*a*, the metal oxide 531*b*, and the insulator 550.

A conductor 545 (a conductor 545*a* and a conductor 545*b*) that is electrically connected to the transistor 500 and functions as a plug is preferably provided. Note that an insulator 541 (an insulator 541*a* and an insulator 541*b*) is provided in contact with a side surface of the conductor 545 functioning as a plug. In other words, the insulator 541 is provided in contact with the inner wall of an opening in the insulator 554, the insulator 580, the insulator 574, and the insulator 581. In addition, a structure may be employed in which a first conductor of the conductor 545 is provided in contact with the side surface of the insulator 541 and a second conductor of the conductor 545 is provided on the inner side of the first conductor. Here, the top surface of the conductor 545 and the top surface of the insulator 581 can be substantially level with each other. Although the transistor 500 has a structure in which the first conductor of the conductor 545 and the second conductor of the conductor 545 are stacked, the present invention is not limited thereto. For example, the conductor 545 may have a single-layer structure or a stacked-layer structure of three or more layers. In the case where a component has a stacked-layer structure, layers may be distinguished by ordinal numbers corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531*a*, the metal oxide 531*b*, and the metal oxide 531*c*). For example, it is preferable to use a metal oxide having a band gap of 2.0 eV or more, preferably 2.5 eV or more as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). The element M further preferably contains one or both of Ga and Sn.

As illustrated in FIG. 27B, the metal oxide 531*b* in a region that does not overlap with the conductor 542 sometimes has a smaller thickness than the metal oxide 531*b* in a region that overlaps with the conductor 542. The thin region is formed when part of the top surface of the metal oxide 531*b* is removed at the time of forming the conductor 542*a* and the conductor 542*b*. When a conductive film to be the conductor 542 is formed, a low-resistance region is sometimes formed on the top surface of the metal oxide 531*b* in the vicinity of the interface with the conductive film. Removing the low-resistance region positioned between the conductor 542*a* and the conductor 542*b* on the top surface of the metal oxide 531*b* in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 500 that can be used in the display apparatus of one embodiment of the present invention is described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505*a*, a conductor 505*b*, and a conductor 505*c*. The conductor 505*a* is provided in contact with the bottom surface and the sidewall of the opening provided in the insulator 516. The conductor 505*b* is provided to be embedded in a recessed portion formed by the conductor 505*a*. Here, the top surface of the conductor 505*b* is lower in level than the top surface of the conductor 505*a* and the top surface of the insulator 516. The conductor 505*c* is provided in contact with the top surface of the conductor 505*b* and the side surface of the conductor 505*a*. Here, the top surface of the conductor 505*c* is substantially level with the top surface of the conductor 505*a* and the top surface of the insulator 516. That is, the conductor 505*b* is surrounded by the conductor 505*a* and the conductor 505*c*.

Here, for the conductor 505*a* and the conductor 505*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 505*a* and the conductor 505*c* are formed using a conductive material having a function of inhibiting diffusion of hydrogen, impurities such as hydrogen contained in the conductor 505*b* can be inhibited from diffusing into the metal oxide 531 through the insulator 524 and the like. When the conductor 505*a* and the conductor 505*c* are formed using a conductive material having a function of inhibiting diffusion of oxygen, the conductivity of the conductor 505*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 505*a* is a single layer or stacked layers of the above conductive materials. For example, titanium nitride is used for the conductor 505*a*.

A conductive material containing tungsten, copper, or aluminum as its main component is preferably used for the conductor 505*b*. For example, tungsten is used for the conductor 505*b*.

The conductor 560 sometimes functions as a first gate (also referred to as top gate) electrode. The conductor 505 sometimes functions as a second gate (also referred to as bottom gate) electrode. In that case, Vth of the transistor 500 can be controlled by changing a potential applied to the conductor 560 independently of a potential applied to the conductor 560. In particular, by applying a negative potential to the conductor 505, Vth of the transistor 500 can be higher than 0 V and the off-state current can be made low. Thus, a drain current at the time when a potential applied to the conductor 560 is 0 V can be lower in the case where a negative potential is applied to the conductor 505 than in the case where a negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 27C. In other words, the conductor 505 and the conductor 560 preferably overlap with each other with the insulator positioned therebetween, in a region outside the side surface of the metal oxide 531 in the channel width direction.

With the above structure, the channel formation region of the metal oxide 531 can be electrically surrounded by electric fields of the conductor 560 having a function of the first gate electrode and electric fields of the conductor 505 having a function of the second gate electrode.

As illustrated in FIG. 27C, the conductor 505 extends to function as a wiring as well. However, without limitation to this structure, a structure in which a conductor functioning as a wiring is provided below the conductor 505 may be employed.

The insulator 514 preferably functions as a barrier insulating film that inhibits the entry of impurities such as water or hydrogen to the transistor 500 from the substrate side. Accordingly, it is preferable to use, for the insulator 514, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

For example, aluminum oxide or silicon nitride is preferably used for the insulator 514. Accordingly, it is possible to inhibit diffusion of impurities such as water or hydrogen to the transistor 500 side from the substrate side through the insulator 514. Alternatively, it is possible to inhibit diffusion of oxygen contained in the insulator 524 and the like to the substrate side through the insulator 514.

The permittivity of each of the insulator 516, the insulator 580, and the insulator 581 functioning as an interlayer film is preferably lower than that of the insulator 514. When a material with a low permittivity is used for an interlayer film, the parasitic capacitance generated between wirings can be reduced. For the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 each function as a gate insulator.

Here, the insulator 524 in contact with the metal oxide 531 preferably releases oxygen by heating. In this specification, oxygen that is released by heating is referred to as excess oxygen in some cases. For example, silicon oxide, silicon oxynitride, or the like can be used as appropriate for the insulator 524. When an insulator containing oxygen is provided in contact with the metal oxide 531, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably within the range of 100° C. to 700° C. or 100° C. to 400° C.

As illustrated in FIG. 27C, the insulator 524 is sometimes thinner in a region that overlaps with neither the insulator 554 nor the metal oxide 531*b* than in the other regions. In the insulator 524, the region that overlaps with neither the insulator 554 nor the metal oxide 531*b* preferably has a thickness with which the above oxygen can be adequately diffused.

Like the insulator 514 and the like, the insulator 522 preferably functions as a barrier insulating film that inhibits the entry of impurities such as water or hydrogen into the transistor 500 from the substrate side. For example, the insulator 522 preferably has a lower hydrogen permeability than the insulator 524. When the insulator 524, the metal oxide 531, the insulator 550, and the like are surrounded by the insulator 522, the insulator 554, and the insulator 574, the entry of impurities such as water or hydrogen into the transistor 500 from outside can be inhibited.

Furthermore, it is preferable that the insulator 522 have a function of inhibiting diffusion of oxygen (e.g., at least one of an oxygen atom, an oxygen molecule, and the like) (it is preferable that the oxygen be less likely to pass through the insulator 522). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer inhibiting release of oxygen from the metal oxide 531 and entry of impurities such as hydrogen into the metal oxide 531 from the periphery of the transistor 500.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over any of the above insulators.

The insulator 522 may be a single layer or a stacked layer using an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). With further miniaturization and higher integration of a transistor, a problem such as generation of leakage current may arise because of a thinned gate insulator. When a high-k material is used for the insulator functioning as a gate insulator, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed. For example, an insulator similar to the insulator 524 may be provided below the insulator 522.

The metal oxide 531 includes the metal oxide 531*a*, the metal oxide 531*b* over the metal oxide 531*a*, and the metal oxide 531*c* over the metal oxide 531*b*. When the metal oxide 531 includes the metal oxide 531*a* under the metal oxide 531*b*, it is possible to inhibit diffusion of impurities into the metal oxide 531*b* from the components formed below the metal oxide 531*a*. Moreover, when the metal oxide 531 includes the metal oxide 531*c* over the metal oxide 531*b*, it is possible to inhibit diffusion of impurities into the metal oxide 531*b* from the components formed above the metal oxide 531*c*.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably greater than the atomic ratio of the element M to In in the metal oxide 531*b*. Here, a metal oxide that can be used as the metal oxide 531*a* or the metal oxide 531*b* can be used as the metal oxide 531*c*.

The energy of the conduction band minimum of each of the metal oxide 531*a* and the metal oxide 531*c* is preferably higher than the energy of the conduction band minimum of the metal oxide 531*b*. In other words, the electron affinity of each of the metal oxide 531*a* and the metal oxide 531*c* is preferably smaller than the electron affinity of the metal oxide 531*b*. In this case, a metal oxide that can be used as the metal oxide 531*a* is preferably used as the metal oxide 531*c*. Specifically, the proportion of the number of atoms of the element M contained in the metal oxide 531*c* to the number of atoms of all elements that constitute the metal oxide 531*c* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*c* is preferably greater than the atomic ratio of the element M to In in the metal oxide 531*b*.

Here, the energy level of the conduction band minimum gently changes at junction portions between the metal oxide 531*a*, the metal oxide 531*b*, and the metal oxide 531*c*. In other words, at junction portions between the metal oxide 531*a*, the metal oxide 531*b*, and the metal oxide 531*c*, the energy level of the conduction band minimum continuously changes or the energy levels are continuously connected. This can be achieved by decreasing the density of defect states in a mixed layer formed at the interface between the metal oxide 531*a* and the metal oxide 531*b* and the interface between the metal oxide 531*b* and the metal oxide 531*c*.

Specifically, when the metal oxide 531*a* and the metal oxide 531*b* or the metal oxide 531*b* and the metal oxide 531*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 531*a* and the metal oxide 531*c*, in the case where the metal oxide 531*b* is an In—Ga—Zn oxide. The metal oxide 531*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 531*c* may have a stacked-layer structure of an In—Ga—Zn oxide and an oxide that does not contain In.

Specifically, as the metal oxide 531*a*, a metal oxide with In:Ga:Zn=1:3:4 [atomic ratio] or 1:1:0.5 [atomic ratio] can be used. As the metal oxide 531*b*, a metal oxide with In:Ga:Zn=4:2:3 [atomic ratio] or 3:1:2 [atomic ratio] can be used. As the metal oxide 531*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 531*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

In this case, the metal oxide 531*b* serves as a main carrier path. When the metal oxide 531*a* and the metal oxide 531*c* have the above structure, the density of defect states at the interface between the metal oxide 531*a* and the metal oxide 531*b* and the interface between the metal oxide 531*b* and the metal oxide 531*c* can be made low. Thus, the influence of interface scattering on carrier conduction is small, and the transistor 500 can have a high on-state current and high frequency characteristics. Note that in the case where the metal oxide 531*c* has a stacked-layer structure, not only the effect of reducing the density of defect states at the interface between the metal oxide 531*b* and the metal oxide 531*c*, but also the effect of inhibiting diffusion of the constituent element contained in the metal oxide 531*c* to the insulator 550 side can be expected. Specifically, the metal oxide 531*c* has a stacked-layer structure in which an oxide not containing In is positioned in the upper layer of the stacked-layer structure, whereby the diffusion of In to the insulator 550 side can be inhibited. Since the insulator 550 functions as a gate insulator, the transistor has defects in characteristics when In diffuses. Thus, the metal oxide 531*c* having a stacked-layer structure allows a highly reliable display apparatus to be provided.

The conductor 542 (the conductor 542*a* and the conductor 542*b*) functioning as the source electrode and the drain electrode is provided over the metal oxide 531*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier concentration of the region in the metal oxide 531 in the vicinity of the conductor 542 increases, and the region becomes a low-resistance region.

Here, the region between the conductor 542*a* and the conductor 542*b* is formed to overlap with the opening of the insulator 580. Accordingly, the conductor 560 can be placed in a self-aligned manner between the conductor 542*a* and the conductor 542*b*.

The insulator 550 functions as a gate insulator. The insulator 550 is preferably positioned in contact with the top surface of the metal oxide 531*c*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 524, the concentration of impurities such as water or hydrogen in the insulator 550 is preferably reduced. The thickness of the insulator 550 is preferably greater than or equal to 1 nm and less than or equal to 20 nm.

A metal oxide may be provided between the insulator 550 and the conductor 560. The metal oxide preferably inhibits diffusion of oxygen from the insulator 550 to the conductor 560. Accordingly, oxidation of the conductor 560 due to oxygen in the insulator 550 can be inhibited.

The metal oxide functions as part of the gate insulator in some cases. Therefore, when silicon oxide, silicon oxynitride, or the like is used for the insulator 550, a metal oxide that is a high-k material with a high dielectric constant is preferably used as the metal oxide. When the gate insulator has a stacked-layer structure of the insulator 550 and the metal oxide, the stacked-layer structure can be thermally stable and have a high dielectric constant. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 560 has a two-layer structure in FIG. 27, the conductor 560 may have a single-layer structure or a stacked-layer structure of three or more layers.

The conductor 560*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560*b* is preferably formed using a conductive material containing tungsten, copper, or aluminum as its main component. Furthermore, the conductor 560 also functions as a wiring and thus is preferably a conductor having high conductivity. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

As illustrated in FIG. 27A and FIG. 27C, the side surface of the metal oxide 531 is covered with the conductor 560 in a region where the metal oxide 531*b* does not overlap with the conductor 542, that is, the channel formation region of the metal oxide 531. Accordingly, the electric field of the conductor 560 functioning as the first gate electrode is likely to act on the side surface of the metal oxide 531. Thus, the on-state current of the transistor 500 can be increased and the frequency characteristics can be improved.

The insulator 554, like the insulator 514 and the like, preferably functions as a barrier insulating film that inhibits the entry of impurities such as water or hydrogen into the transistor 500 from the insulator 580 side. The insulator 554 preferably has a lower hydrogen permeability than the insulator 524, for example. Furthermore, as illustrated in FIG. 27B and FIG. 27C, the insulator 554 is preferably in contact with the side surface of the metal oxide 531*c*, the top and side surfaces of the conductor 542*a*, the top and side surfaces of the conductor 542*b*, the side surfaces of the metal oxide 531*a* and the metal oxide 531*b*, and the top surface of the insulator 524. Such a structure can inhibit the entry of hydrogen contained in the insulator 580 into the metal oxide 531 through the top surfaces or side surfaces of the conductor 542*a*, the conductor 542*b*, the metal oxide 531*a*, the metal oxide 531*b*, and the insulator 524.

Furthermore, it is preferable that the insulator 554 have a function of inhibiting diffusion of oxygen (e.g., at least one of an oxygen atom, an oxygen molecule, and the like) (it is preferable that the oxygen be less likely to pass through the insulator 554). For example, the insulator 554 preferably has a lower oxygen permeability than the insulator 580 or the insulator 524.

The insulator 554 is preferably formed by a sputtering method. When the insulator 554 is formed by a sputtering method in an oxygen-containing atmosphere, oxygen can be added to the vicinity of a region of the insulator 524 that is in contact with the insulator 554. Thus, oxygen can be supplied from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531. Accordingly, oxygen vacancies in the metal oxide 531 can be reduced, so that the transistor can be prevented from having normally-on characteristics.

As the insulator 554, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 524, the insulator 550, and the metal oxide 531 are covered with the insulator 554 having a barrier property against hydrogen, whereby the insulator 580 is isolated from the insulator 524, the metal oxide 531, and the insulator 550 by the insulator 554. This can inhibit the entry of impurities such as hydrogen from outside of the transistor 500, resulting in favorable electrical characteristics and high reliability of the transistor 500.

The insulator 580 is provided over the insulator 524, the metal oxide 531, and the conductor 542 with the insulator 554 therebetween. The insulator 580 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of impurities such as water or hydrogen in the insulator 580 is preferably reduced. In addition, the top surface of the insulator 580 may be planarized.

Like the insulator 514 and the like, the insulator 574 preferably functions as a barrier insulating film that inhibits the entry of impurities such as water or hydrogen into the insulator 580 from above. As the insulator 574, for example, the insulator that can be used as the insulator 514, the insulator 554, and the like can be used.

The insulator 581 functioning as an interlayer film is preferably provided over the insulator 574. As in the insulator 524 or the like, the concentration of impurities such as water or hydrogen in the insulator 581 is preferably reduced.

The conductor 545*a* and the conductor 545*b* are placed in openings formed in the insulator 581, the insulator 574, the insulator 580, and the insulator 554. The conductor 545*a* and the conductor 545*b* are provided to face each other with the conductor 560 therebetween. Note that the top surfaces of the conductor 545*a* and the conductor 545*b* may be on the same plane as the top surface of the insulator 581.

The insulator 541*a* is provided in contact with the inner wall of the opening in the insulator 581, the insulator 574, the insulator 580, and the insulator 554, and the first conductor of the conductor 545*a* is formed in contact with the side surface of the insulator 541*a*. The conductor 542*a* is positioned on at least part of the bottom portion of the opening, and the conductor 545*a* is in contact with the conductor 542*a*. Similarly, the insulator 541*b* is provided in contact with the inner wall of the opening in the insulator 581, the insulator 574, the insulator 580, and the insulator 554, and the first conductor of the conductor 545*b* is formed in contact with the side surface of the insulator 541*b*. The conductor 542*b* is positioned on at least part of the bottom portion of the opening, and the conductor 545*b* is in contact with the conductor 542*b*.

The conductor 545*a* and the conductor 545*b* are preferably formed using a conductive material containing tungsten, copper, or aluminum as its main component. The conductor 545*a* and the conductor 545*b* may have a stacked-layer structure.

In the case where the conductor 545 has a stacked-layer structure, the aforementioned conductor having a function of inhibiting diffusion of impurities such as water or hydrogen is preferably used as the conductor in contact with the metal oxide 531*a*, the metal oxide 531*b*, the conductor 542, the insulator 554, the insulator 580, the insulator 574, and the insulator 581. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 580 from being absorbed by the conductor 545*a* and the conductor 545*b*. Moreover, impurities such as water or hydrogen can be inhibited from entering the metal oxide 531 through the conductor 545*a* and the conductor 545*b* from a layer above the insulator 581.

As the insulator 541*a* and the insulator 541*b*, for example, the insulator that can be used as the insulator 554 or the like can be used. Since the insulator 541*a* and the insulator 541*b* are provided in contact with the insulator 554, impurities such as water or hydrogen in the insulator 580 or the like can be inhibited from entering the metal oxide 531 through the conductor 545*a* and the conductor 545*b*. Furthermore, oxygen contained in the insulator 580 can be inhibited from being absorbed by the conductor 545*a* and the conductor 545*b*.

Although not illustrated, a conductor functioning as a wiring may be placed in contact with the top surface of the conductor 545*a* and the top surface of the conductor 545*b*. For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulator. When a high-k material is used for the insulator functioning as a gate insulator, the voltage at the time of the operation of the transistor can be reduced while the physical thickness is maintained. By contrast, when a material with a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 514, the insulator 522, the insulator 554, and the insulator 574), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 531, oxygen vacancies included in the metal oxide 531 can be compensated for.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably has a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of this embodiment can be implemented in combination with the other embodiments described in this specification as appropriate.

The structure described in this embodiment can be used in an appropriate combination with the structures described in the other embodiments.

Embodiment 8

Described in this embodiment is a metal oxide (hereinafter, also referred to as an oxide semiconductor) that can be used in the OS transistor described in the above embodiment.

<Classification of Crystal Structure>

First, the classification of the crystal structures of an oxide semiconductor will be described with reference to FIG. 28A. FIG. 28A is a diagram showing the classification of crystal structures of an oxide semiconductor, typically IGZO (a metal oxide containing In, Ga, and Zn).

As shown in FIG. 28A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that in the classification of "Crystalline," single crystal, poly crystal, and completely amorphous are excluded. The term "Crystal" includes single crystal and poly crystal.

Note that the structures in the thick frame shown in FIG. 28A are in an intermediate state between "Amorphous" and "Crystal", and belong to a new crystalline phase. That is, these structures are completely different from "Crystal" and "Amorphous", which is energetically unstable.

Note that a crystal structure of a film or a substrate can be evaluated with an X-ray diffraction (XRD) spectrum. FIG. 28B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 28B and obtained by GIXD measurement is hereinafter simply referred to as an XRD spectrum. The CAAC-IGZO film in FIG. 28B has a composition of In:Ga:Zn=4:2:3 [atomic ratio] or the neighborhood thereof. The CAAC-IGZO film in FIG. 28B has a thickness of 500 nm.

As shown in FIG. 28B, a clear peak indicating crystallinity is observed in the XRD spectrum of the CAAC-IGZO film. Specifically, a peak indicating c-axis alignment is detected at 2θ of around 31° in the XRD spectrum of the CAAC-IGZO film. As shown in FIG. 28B, the peak at 2θ of around 31° is asymmetric with the angle at which the peak intensity is detected as the axis.

A crystal structure of a film or a substrate can also be evaluated with a diffraction pattern obtained by a nanobeam electron diffraction method (NBED) (such a pattern is also referred to as a nanobeam electron diffraction pattern). FIG. 28C shows a diffraction pattern of the CAAC-IGZO film. FIG. 28C shows a diffraction pattern obtained by the NBED method in which an electron beam is incident in the direction parallel to the substrate. The CAAC-IGZO film in FIG. 28C has a composition of In:Ga:Zn=4:2:3 [atomic ratio] or the neighborhood thereof. In the nanobeam electron diffraction method, electron diffraction is performed with a probe diameter of 1 nm.

As shown in FIG. 28C, a plurality of spots indicating c-axis alignment are observed in the diffraction pattern of the CAAC-IGZO film.

[Structure of Oxide Semiconductor]

Oxide semiconductors might be classified in a manner different from that in FIG. 28A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. In addition, the crystal region refers to a region having a periodic atomic arrangement. Note that when an atomic arrangement is regarded as a lattice arrangement, the crystal region also refers to a region with a uniform lattice arrangement. Furthermore, the CAAC-OS has a region where a plurality of crystal regions are connected in an a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layered structure is observed as a lattice image in a high-resolution TEM image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear crystal grain boundary (also referred to as grain boundary) cannot be observed even in the vicinity of the distortion in the CAAC-OS. That is, it is found that formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, and/or the like, the CAAC-OS can be regarded as an oxide semiconductor that has small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed.

Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. Furthermore, the second region can be rephrased as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a highly reliable transistor can be achieved.

It is particularly preferable to use an oxide containing indium (In), gallium (Ga), and zinc (Zn) (also referred to as "IGZO") for a semiconductor layer where a channel is formed. Alternatively, an oxide containing indium (In), aluminum (Al), and zinc (Zn) (also referred to as "LAZO") may be used for the semiconductor layer. Alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of a transistor, reducing the impurity concentration in an oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, alkali metal, alkaline earth metal, iron, nickel, and silicon.

<Impurity>

Here, the influence of each impurity in the oxide semiconductor will be described.

When silicon and/or carbon, which are each one of Group 14 elements, is contained in the oxide semiconductor, defect states are formed in the oxide semiconductor. Thus, the concentration of silicon and carbon in the oxide semiconductor and the concentration of silicon and carbon in the vicinity of an interface with the oxide semiconductor (the concentrations obtained by SIMS) are each set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus forms an oxygen vacancy in some cases. The entry of hydrogen into the oxygen vacancy generates an electron serving as a carrier in some cases. Furthermore, in some cases, some hydrogen is bonded to oxygen bonded to a metal atom and generates an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

The structure described in this embodiment can be used in an appropriate combination with the structures described in the other embodiments.

Embodiment 9

In this embodiment, electronic devices in which the semiconductor device of one embodiment of the present invention can be used will be described.

The semiconductor device of one embodiment of the present invention can be used in a display portion of an electronic device. Thus, an electronic device with high display quality can be obtained. An electronic device with an extremely high resolution can be obtained. A highly reliable electronic device can be obtained.

Examples of electronic devices including the semiconductor device or the like of one embodiment of the present invention include display apparatuses of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, car phones, cellular phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and it is preferable that the secondary battery be capable of being charged by contactless power transmission.

Examples of the secondary battery include a lithium ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, and the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radioactive rays, flow rate, humidity, a gradient, oscillation, odor, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that functions of the electronic device of one embodiment of the present invention are not limited thereto, and the electronic devices can have a variety of functions.

The semiconductor device of one embodiment of the present invention can display high-resolution images. Thus, the light-emitting apparatus of one embodiment of the present invention can be suitably used especially for a portable electronic device, a wearable electronic device (wearable device), an e-book reader, and the like. In addition, the semiconductor device can be suitably used for xR devices such as a VR device and an AR device.

Figure 29A:
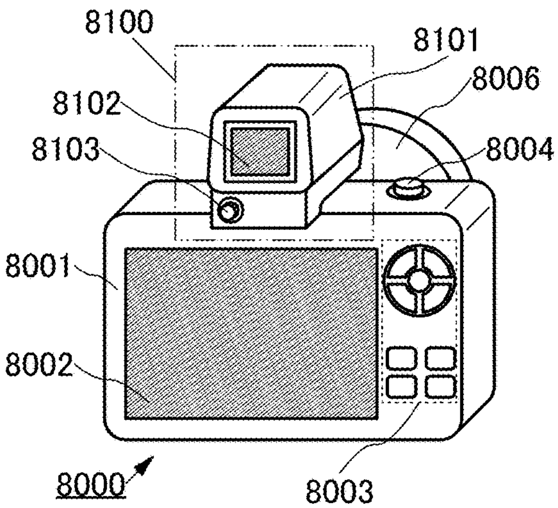
FIG. 29A to FIG. 29F are diagrams illustrating examples of electronic devices.

FIG. 29A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. The finder 8100 can display a video received from the camera 8000 and the like on the display portion 8102.

The button 8103 functions as a power supply button or the like.

For example, the semiconductor device of one embodiment of the present invention can be used in the display portion 8002 of the camera 8000 and the display portion 8102 of the finder 8100. Note that the finder 8100 may be incorporated in the camera 8000.

Figure 29B:
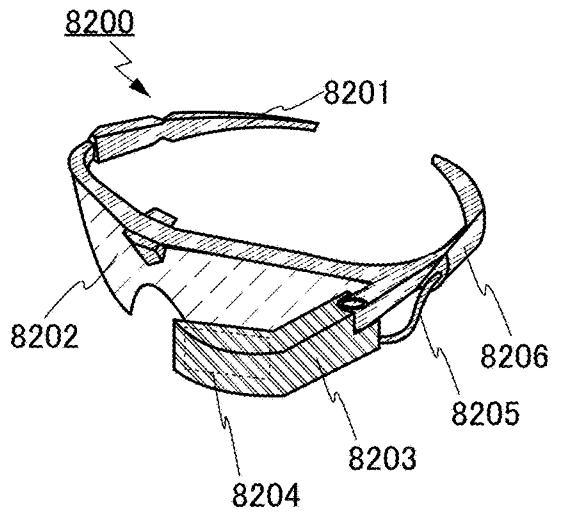

FIG. 29B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with use of current flowing through the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

For example, the semiconductor device of one embodiment of the present invention can be used in the display portion 8204.

Figure 29C:
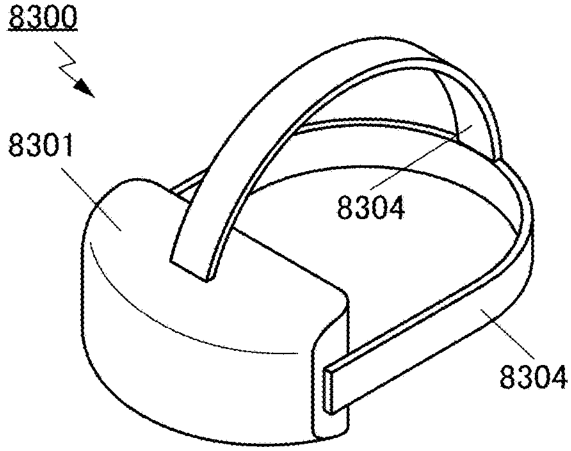
Figure 29D:
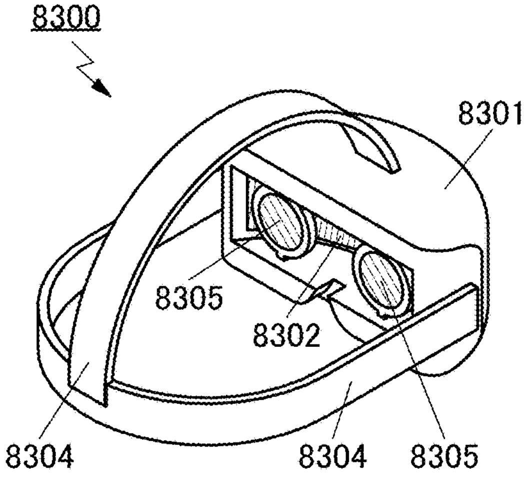
Figure 29E:
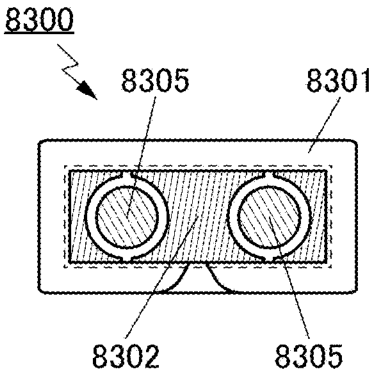

FIG. 29C to FIG. 29E are diagrams illustrating the appearance of a head-mounted display 8300. The head-mounted display 8300 includes a housing 8301, a display portion 8302, a band-like fixing member 8304, and a pair of lenses 8305.

A user can perceive display on the display portion 8302 through the lenses 8305. Note that the display portion 8302 is preferably curved and placed because the user can feel a high realistic sensation. Another image displayed in another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

For example, the semiconductor device of one embodiment of the present invention can be used for the display portion 8302. The semiconductor device of one embodiment of the present invention can achieve extremely high definition. For example, a pixel is not easily seen by the user even when the user sees display that is magnified by the use of the lenses 8305 as illustrated in FIG. 29E. In other words, a video with a strong sense of reality can be seen by the user with use of the display portion 8302.

Figure 29F:
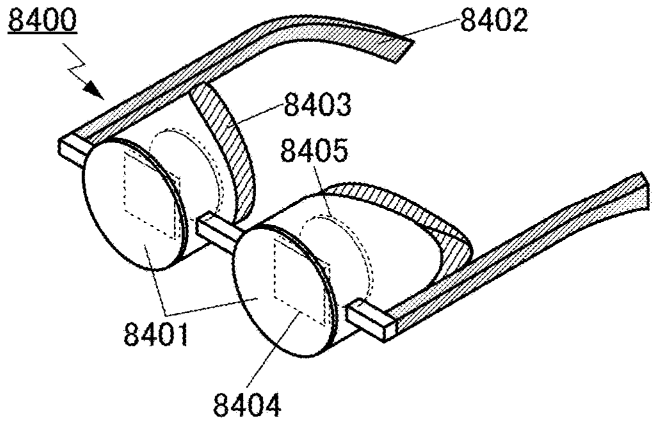

FIG. 29F is a diagram illustrating the appearance of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member to be in contact with the user's skin, such as the cushion 8403 or the wearing portion 8402, is preferably detachable, in which case cleaning or replacement can be easily performed.

Figure 30A:
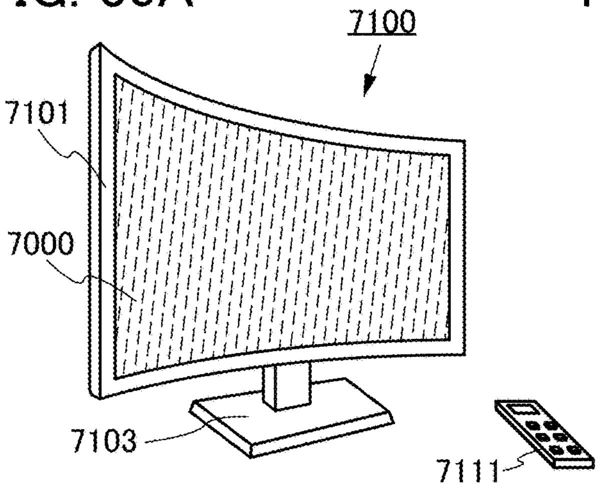
FIG. 30A to FIG. 30F are diagrams illustrating examples of electronic devices.

FIG. 30A illustrates an example of a television device. In a television device 7100, a display portion 7000 is incorporated in a housing 7101. Here, a structure in which the housing 7101 is supported by a stand 7103 is illustrated.

For example, the semiconductor device of one embodiment of the present invention can be used for the display portion 7000.

Operation of the television device 7100 illustrated in FIG. 30A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 30B:
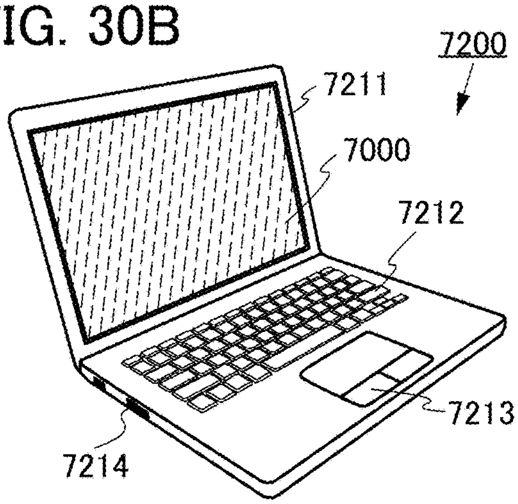

FIG. 30B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

For example, the semiconductor device of one embodiment of the present invention can be used for the display portion 7000.

Figure 30C:
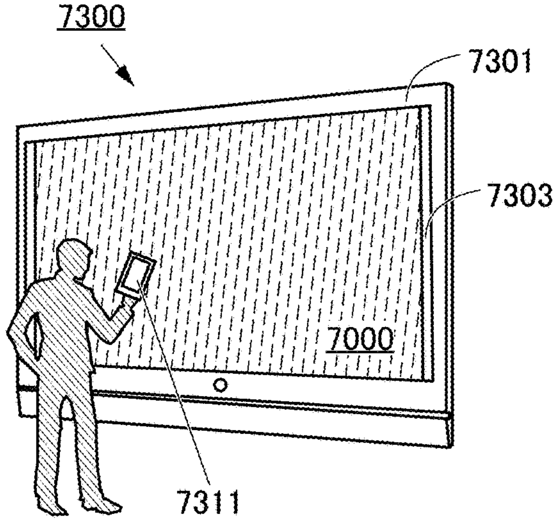
Figure 30D:
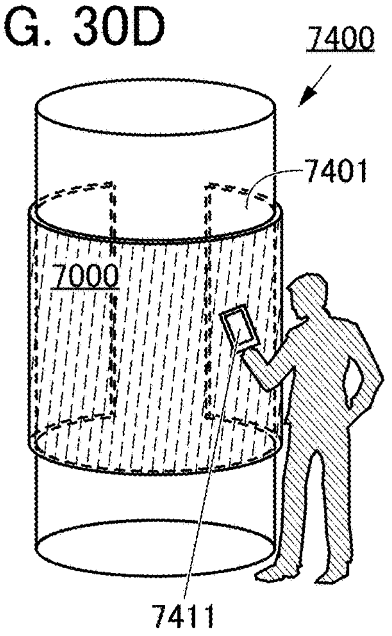

FIG. 30C and FIG. 30D illustrate examples of digital signage.

Digital signage 7300 illustrated in FIG. 30C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 30D is digital signage 7400 attached to a cylindrical pillar 7401. The digital signage 7400 includes the display portion 7000 provided along a curved surface of the pillar 7401. In FIG. 30C and FIG. 30D, the semiconductor device of one embodiment of the present invention can be used for the display portion 7000.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 30C and FIG. 30D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 30E:
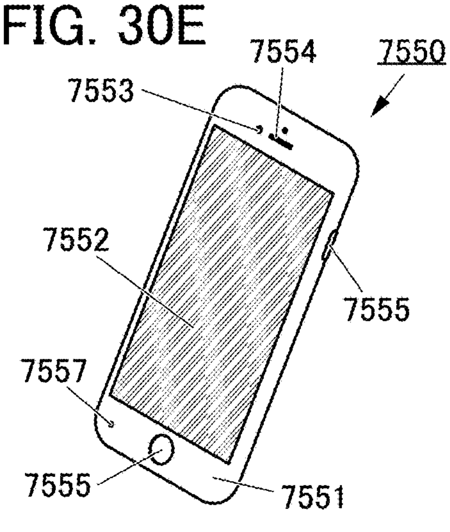

An information terminal 7550 illustrated in FIG. 30E includes a housing 7551, a display portion 7552, a microphone 7557, a speaker portion 7554, a camera 7553, operation switches 7555, and the like. For example, the semiconductor device of one embodiment of the present invention can be used for the display portion 7552. The display portion 7552 functions as a touch panel.

The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

Figure 30F:
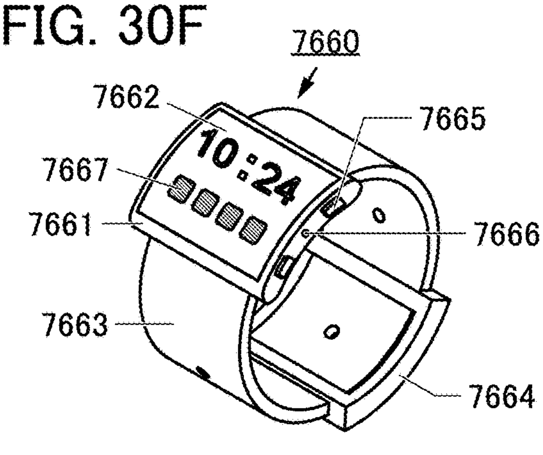

FIG. 30F illustrates an example of a watch-type information terminal. An information terminal 7660 includes a housing 7661, a display portion 7662, a band 7663, a buckle 7664, an operation switch 7665, an input/output terminal 7666, and the like. In addition, the information terminal 7660 includes an antenna, a battery, and the like inside the housing 7661. The information terminal 7660 is capable of executing a variety of applications such as mobile phone calls, e-mailing, viewing and editing texts, music reproduction, Internet communication, and a computer game.

In addition, the display portion 7662 includes a touch sensor, and operation can be performed by touching the screen with a finger, a stylus, or the like. For example, with a touch on an icon 7667 displayed on the display portion 7662, an application can be started. The operation switches 7665 can have a variety of functions such as time setting, power on/off operation, on/off operation of wireless communication, setting and cancellation of a silent mode, and setting and cancellation of a power saving mode. For example, the functions of the operation switches 7665 can be set by the operation system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 includes an input/output terminal 7666, and can perform data transmission and reception with another information terminal through the input/output terminal 7666. In addition, charging can be performed via the input/output terminal 7666. Note that the charging operation may be performed by wireless power feeding without using the input/output terminal 7666.

Figure 31A:
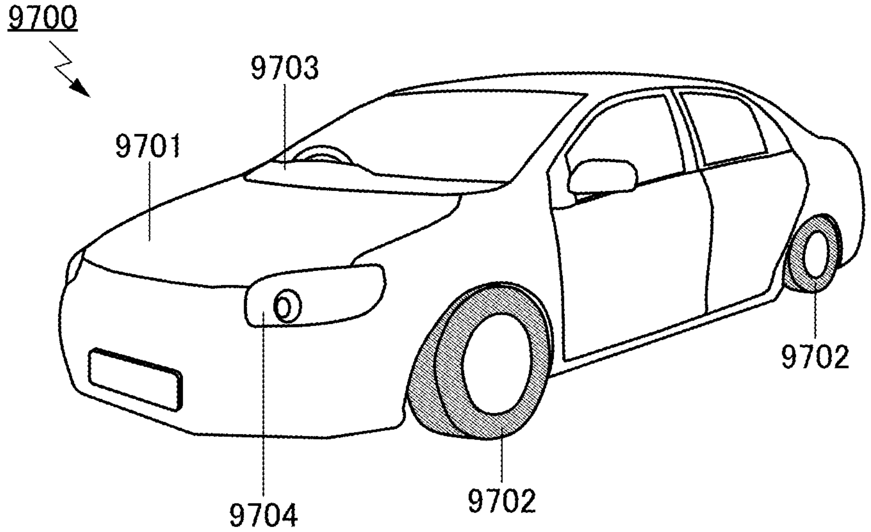
FIG. 31A and FIG. 31B are diagrams illustrating an example of an electronic device.
Figure 31B:
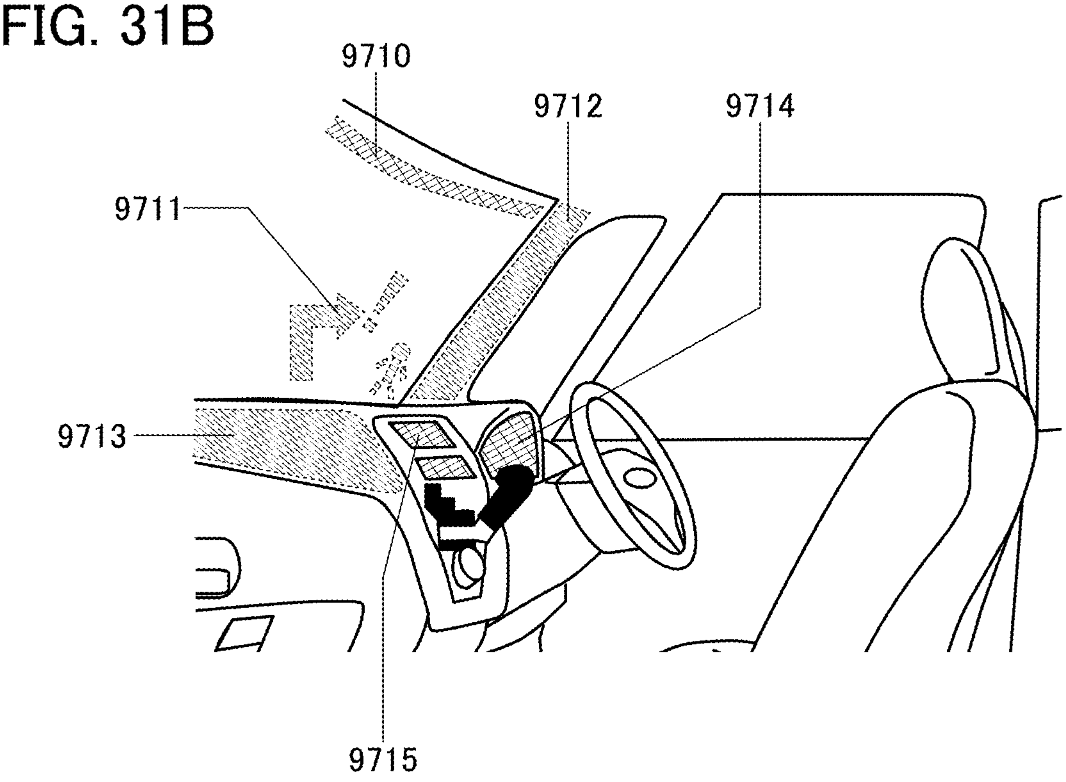

FIG. 31A illustrates the appearance of an automobile 9700. FIG. 31B illustrates a driver's seat of the automobile 9700. The automobile 9700 includes an automobile body 9701, wheels 9702, a dashboard 9703, lights 9704, and the like. The display apparatus of one embodiment of the present invention can be used in, for example, a display portion of the automobile 9700. For example, the display apparatus of one embodiment of the present invention can be provided for a display portion 9710 to a display portion 9715 illustrated in FIG. 31B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Therefore, the display apparatus of one embodiment of the present invention can be provided in the windshield of the automobile 9700. Note that in the case where a transistor or the like for driving the display apparatus is provided in the display apparatus, a transistor having a light-transmitting property, such as an organic transistor using an organic semiconductor material or a transistor using an oxide semiconductor, is preferably used.

The display portion 9712 is a display apparatus provided on a pillar portion. For example, the display portion 9712 can compensate for the view hindered by the pillar by displaying an image taken by an imaging means provided on the automobile body. The display portion 9713 is a display apparatus provided on a dashboard. For example, the display portion 9713 can compensate for the view hindered by the dashboard by displaying an image taken by an imaging means provided on the automobile body. That is, display of an image taken by an imaging means provided on the exterior of the automobile can compensate for blind areas and enhance safety. Display of an image that complements for the area that cannot be seen makes it possible to confirm safety more naturally and comfortably.

Figure 32:
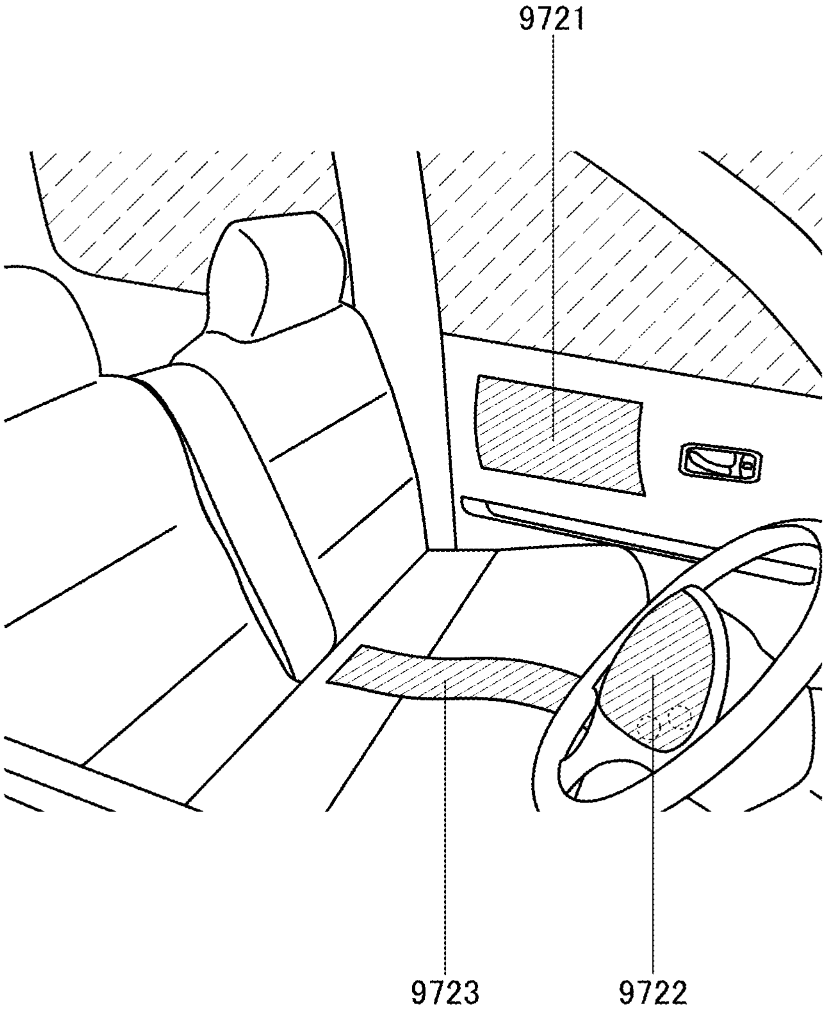
FIG. 32 is a diagram illustrating an example of an electronic device.

FIG. 32 illustrates the inside of an automobile in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the automobile body. A display portion 9722 is a display apparatus provided in a steering wheel. A display portion 9723 is a display apparatus provided in the middle of a seating face of the bench seat.

The display portion 9714, the display portion 9715, and the display portion 9722 can provide a variety of kinds of information by displaying navigation information, speed, the number of engine revolutions, a mileage, the remaining amount of fuel, a gearshift state, air-condition setting, and the like. The content, layout, and the like of the display on the display portions can be changed freely by a user as appropriate. The above information can also be displayed on the display portion 9710 to the display portion 9713, the display portion 9721, and the display portion 9723. The display portion 9710 to the display portion 9715 and the display portion 9721 to the display portion 9723 can also be used as lighting devices.

The structure described in this embodiment can be used in an appropriate combination with the structures described in the other embodiments.

REFERENCE NUMERALS

100: RC model, 110: input layer, 111: node, 120: reservoir layer, 121: node, 130: output layer, 131: node, 150: RC model, 171: conductive layer, 172: EL layer, 173: conductive layer, 201: wiring, 202: wiring, 203: wiring, 204: wiring, 205: wiring, 210: photodiode, 220: current mirror circuit, 221: semiconductor layer, 222: conductive layer, 230: semiconductor device, 240: sensor portion

The invention claimed is:

1. A semiconductor device comprising:

a first circuit, a second circuit, and a third circuit; and a first wiring, a second wiring, and a third wiring, wherein the first circuit comprises a first transistor and a second transistor, wherein the first wiring is electrically connected to a first electrode of a photodiode provided in the second circuit, a gate of the first transistor, and a gate of the second transistor, wherein the second wiring is electrically connected to the third circuit and one of a source and a drain of the first transistor, wherein the third wiring is electrically connected to the third circuit and one of a source and a drain of the second transistor, wherein the third circuit is configured to output voltage corresponding to a difference between current flowing through the second wiring and current flowing through the third wiring, and wherein threshold voltage of the first transistor and threshold voltage of the second transistor are different from each other.

2. The semiconductor device according to claim 1, wherein the threshold voltage of the second transistor is less than or equal to 0.9 times or greater than or equal to 1.1 times the threshold voltage of the first transistor.

3. The semiconductor device according to claim 1, wherein a channel length of the second transistor is less than or equal to 0.9 times or greater than or equal to 1.1 times a channel length of the first transistor.

4. The semiconductor device according to claim 1, wherein the first transistor comprises an oxide semiconductor.

5. The semiconductor device according to claim 1, wherein the second transistor comprises an oxide semiconductor.

6. The semiconductor device according to claim 4, wherein the oxide semiconductor comprises at least one of indium and zinc.

7. A semiconductor device comprising:

a plurality of first circuits arranged in a matrix of M rows and N columns;

M second circuits;

N third circuits; and

M first wirings, N second wirings, and N third wirings, wherein M and N are each an integer greater than or equal to 2, wherein each of the plurality of first circuits comprises a first transistor and a second transistor, wherein an i-th first wiring is electrically connected to a gate of a third transistor provided in an i-th second circuit, a gate of the first transistor included in each of the first circuits in an i-th row, and a gate of the second transistor included in each of the first circuits in the i-th row, wherein i is an integer greater than or equal to 1 and less than or equal to M, wherein a j-th second wiring is electrically connected to a j-th third circuit and one of a source and a drain of the first transistor included in each of the first circuits in a j-th column, wherein j is an integer greater than or equal to 1 and less than or equal to N, wherein a j-th third wiring is electrically connected to the j-th third circuit and one of a source and a drain of the second transistor included in each of the first circuits in the j-th column, wherein the third circuits are configured to output voltage corresponding to a difference between current flowing through the second wiring and current flowing through the third wiring, wherein a difference between threshold voltage of the first transistor and threshold voltage of the second transistor varies randomly among the plurality of first circuits, and wherein one of a source and a drain of the third transistor is electrically connected to the i-th first wiring.

8. The semiconductor device according to claim 7, wherein the threshold voltage of the second transistor is less than or equal to 0.9 times or greater than or equal to 1.1 times the threshold voltage of the first transistor.

9. The semiconductor device according to claim 7, wherein a channel length of the second transistor is less than or equal to 0.9 times or greater than or equal to 1.1 times a channel length of the first transistor.

10. The semiconductor device according to claim 7, wherein the first transistor comprises an oxide semiconductor.

11. The semiconductor device according to claim 7, wherein the second transistor comprises an oxide semiconductor.

12. The semiconductor device according to claim 10, wherein the oxide semiconductor comprises at least one of indium and zinc.

13. A semiconductor device comprising:

a plurality of first circuits arranged in a matrix of M rows and N columns;

M second circuits;

N third circuits; and

M first wirings and N second wirings, wherein M and N are each an integer greater than or equal to 2, wherein each of the plurality of first circuits comprises a transistor, wherein an i-th first wiring is electrically connected to a first electrode of a photodiode provided in an i-th second circuit, one of a source and a drain of a transistor provided in the i-th second circuit, and a gate of the transistor included in each of the first circuits in an i-th row, wherein i is an integer greater than or equal to 1 and less than or equal to M, wherein a j-th second wiring is electrically connected to a j-th third circuit and one of a source and a drain of the transistor included in each of the first circuits in a j-th column, wherein j is an integer greater than or equal to 1 and less than or equal to N, wherein the third circuit is configured to output voltage corresponding to a difference between current flowing through the second wiring and reference current, and wherein a channel length varies randomly among the plurality of transistors electrically connected to the j-th second wiring.

14. The semiconductor device according to claim 1, wherein the first wiring extending in a first direction is electrically connected to the gate of the first transistor via a first conductive layer extending in a second direction intersecting the first direction, and wherein a second conductive layer having an island shape is configured to function as the gate of the first transistor.

15. The semiconductor device according to claim 1, wherein the first wiring is electrically connected to the gate of the first transistor via a first conductive layer, and wherein a second conductive layer having an island shape is configured to function as the gate of the first transistor.

16. The semiconductor device according to claim 1, wherein, in a top view of the semiconductor device, the first wiring overlaps with the second wiring and the third wiring.

* * * * *